US011211415B2

(12) United States Patent
Tayanaka et al.

(10) Patent No.: US 11,211,415 B2
(45) Date of Patent: Dec. 28, 2021

(54) SOLID STATE IMAGING DEVICE, MANUFACTURING METHOD OF THE SAME, AND ELECTRONIC EQUIPMENT

(71) Applicant: SONY CORPORATION, Tokyo (JP)

(72) Inventors: Hiroshi Tayanaka, Kanagawa (JP); Yuuji Inoue, Nagasaki (JP); Masashi Nakata, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/867,141

(22) Filed: May 5, 2020

(65) Prior Publication Data

US 2020/0273898 A1 Aug. 27, 2020

Related U.S. Application Data

(63) Continuation of application No. 15/722,960, filed on Oct. 2, 2017, now Pat. No. 10,680,022, which is a
(Continued)

(30) Foreign Application Priority Data

Dec. 12, 2013 (JP) ................................. 2013-257294
May 27, 2014 (JP) ................................. 2014-109412

(51) Int. Cl.
*H01L 27/146* (2006.01)

(52) U.S. Cl.
CPC .. *H01L 27/14621* (2013.01); *H01L 27/14605* (2013.01); *H01L 27/14623* (2013.01);
(Continued)

(58) Field of Classification Search
CPC ............. H01L 27/146; H01L 27/14605; H01L 27/14623; H01L 27/14627;
(Continued)

(56) References Cited

U.S. PATENT DOCUMENTS

| 2010/0231770 A1* | 9/2010 | Honda ............... H04N 9/04555 348/308 |
| 2012/0147208 A1* | 6/2012 | Otsuka .............. H01L 27/14623 348/222.1 |

(Continued)

FOREIGN PATENT DOCUMENTS

| JP | 2000-156823 | 6/2000 |
| JP | 2011-234025 | 11/2011 |

(Continued)

OTHER PUBLICATIONS

Official Action (with English translation) for Korea patent Application No. 10-2015-7020178, dated Jun. 23, 2021, 11 pages.

*Primary Examiner* — Chuong A Luu
(74) *Attorney, Agent, or Firm* — Sheridan Ross P.C.

(57) ABSTRACT

A solid state imaging device that includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

20 Claims, 53 Drawing Sheets

Related U.S. Application Data continuation of application No. 14/764,685, filed as application No. PCT/JP2014/006045 on Dec. 3, 2014, now Pat. No. 9,780,139.

(52) U.S. Cl.
CPC .. *H01L 27/14627* (2013.01); *H01L 27/14634* (2013.01); *H01L 27/14656* (2013.01); *H01L 27/14685* (2013.01)

(58) Field of Classification Search
CPC ......... H01L 27/14634; H01L 27/14685; H01L 27/14656; H01L 27/14621; H01L 27/148; H01L 27/14645; H01L 27/14607; H01L 27/14612; H01L 27/14689; H01L 27/14618; H01L 27/14614; H01L 27/14609; H01L 27/14; H01L 27/14636; H01L 21/00; H01L 27/14643; H01L 27/14663; H01L 27/14647; H01L 27/14649; H01L 27/14652; H01L 27/14658; H01L 27/14665; H01L 27/14676; H01L 27/14625; H01L 27/14629; H01L 27/14893; H01L 27/1464; H01L 27/14687; H01L 27/14601; H01L 27/1463; H01L 31/04; H01L 31/055; H01L 31/02164; H01L 31/02162; H01L 31/18; H01L 31/0232; H04N 5/374; H04N 5/378; H04N 5/353; H04N 5/228; H04N 5/455; H04N 5/40; H04N 5/44
USPC .......................................................... 257/435
See application file for complete search history.

(56) References Cited

U.S. PATENT DOCUMENTS

| | | | |
|---|---|---|---|
| 2012/0249846 A1* | 10/2012 | Nishio | ............. H01L 27/14623 348/294 |
| 2015/0098007 A1* | 4/2015 | Harasawa | ......... H01L 27/14685 348/342 |

FOREIGN PATENT DOCUMENTS

| | | |
|---|---|---|
| JP | 2012-124377 | 6/2012 |
| JP | 2012-178457 | 9/2012 |

* cited by examiner

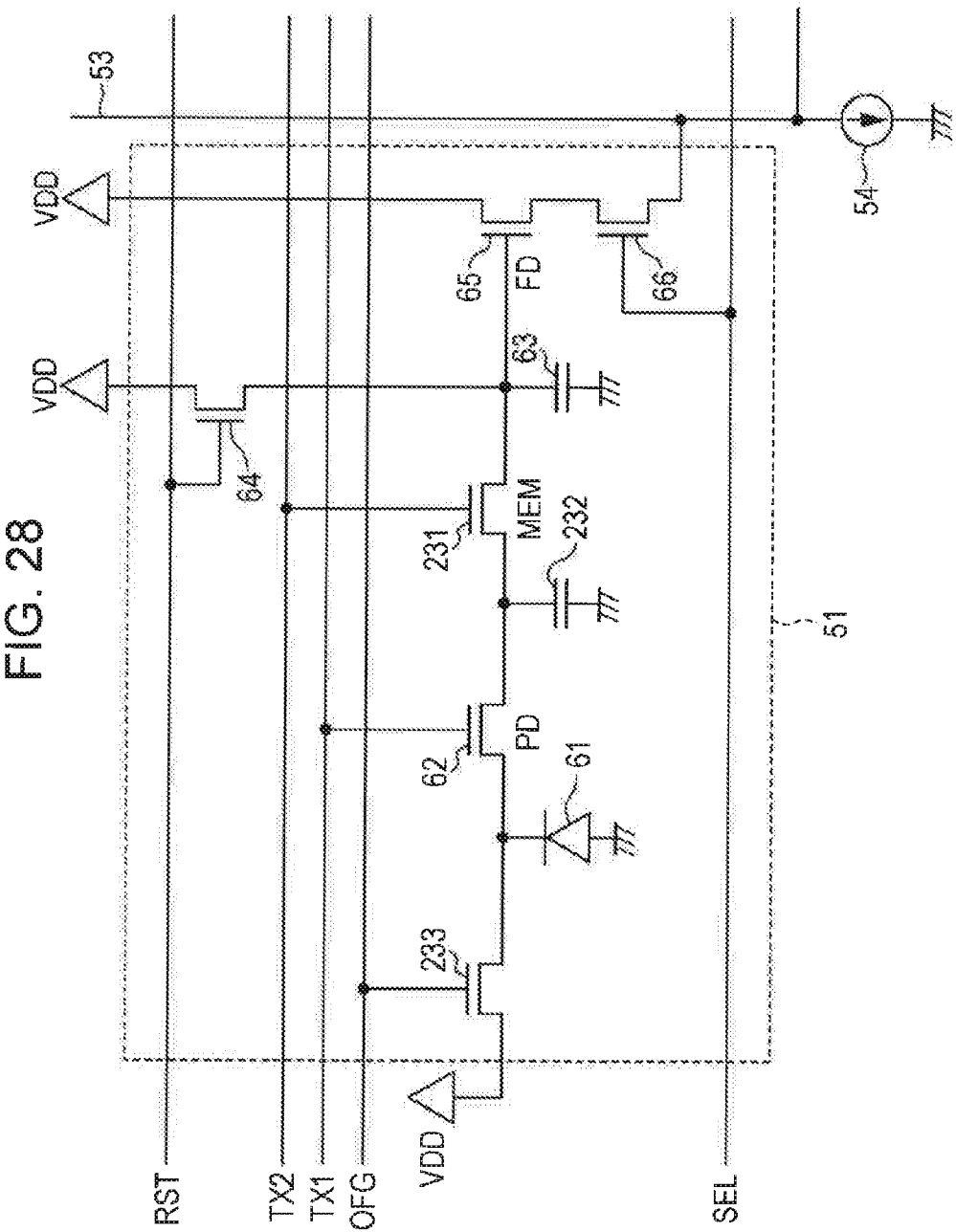

SOLID STATE IMAGING DEVICE, MANUFACTURING METHOD OF THE SAME, AND ELECTRONIC EQUIPMENT

CROSS REFERENCE TO RELATED APPLICATIONS

This application is a continuation of U.S. patent application Ser. No. 15/722,960 filed Oct. 2, 2017 which is a continuation of U.S. patent application Ser. No. 14/764,685, filed Jul. 30, 2015, now U.S. Pat. No. 9,780,139, which is a national stage application under 35 U.S.C. 371 and claims the benefit of PCT Application No. PCT/JP2014/006045 having an international filing date of Dec. 3, 2014, which designated the United States, which PCT application claimed the benefit of Japanese Patent Application No. 2013-257294 filed Dec. 12, 2013, and Japanese Patent Application No. 2014-109412 filed May 27, 2014, the disclosures of which are incorporated herein by reference in their entirety.

TECHNICAL FIELD

The present disclosure relates to a solid state imaging device, a manufacturing method of the same, and electronic equipment. In particular, the present disclosure relates to a solid state imaging device, a manufacturing method of the same, and electronic equipment which enable the suppression of color mixing and the suppression of sensitivity reduction in pixels for phase difference detection.

CROSS REFERENCE TO RELATED APPLICATIONS

This application claims the benefit of Japanese Priority Patent Application JP 2013-257294 filed Dec. 12, 2013, and Japanese Priority Patent Application JP 2014-109412 filed May 27, 2014, the entire contents of each of which are incorporated herein by reference.

BACKGROUND ART

In recent years, there has been wide adoption of imaging apparatuses such as digital still cameras and digital video cameras which image an object such as a person or an animal using a solid state imaging device, which is a Complementary Metal-Oxide Semiconductor (CMOS) sensor or the like, and which record image data which is obtained as a result.

In the imaging apparatus, there is a technology which can realize phase difference detection type autofocus (AF, also referred to herein as "automatic focus") without using a dedicated automatic focus detection sensor by adding a phase difference detection function to a solid state imaging device in the related art (for example, refer to PTL 1 and PTL 2). The solid state imaging device which has the phase difference detection function is configured to include pixels for phase difference detection and pixels for imaging, and a portion of the pixels for phase difference detection form an optical black region.

Meanwhile, with an increase in definition of the solid state imaging devices, there is demand for rendering an arrangement interval between color filters (which are provided corresponding to photoelectric conversion regions of pixels) as narrow as possible in order to prevent a reduction in sensitivity.

However, there is a case in which, when the arrangement interval between the color filters is narrow, color mixing and color shading (color unevenness) occur due to process variation caused by shifts that occur during the matching of the lithography process of the color filters.

Therefore, in relation to the pixels for imaging (for image generation), a method has been conceived in which the color mixing and the color shading due to process variations of the color filters are prevented by providing optically transparent regions between color filters of different colors (for example, refer to PTL 3).

CITATION LIST

Patent Literature

[PTL 1]
Japanese Unexamined Patent Application Publication No. 2000-156823
[PTL 2]
Japanese Unexamined Patent Application Publication No. 2009-244862
[PTL 3]
Japanese Unexamined Patent Application Publication No. 2007-147738

SUMMARY OF INVENTION

Technical Problem

However, consideration had not been given to a method of suppressing the color mixing and the sensitivity reduction in the pixels for phase difference detection in the solid state imaging device which has the phase difference detection function.

The present disclosure was made in consideration of these circumstances, and embodiments herein are capable of suppressing the color mixing and the sensitivity reduction in the pixels for phase difference detection.

Solution to Problem

According to a first illustrative embodiment of the present disclosure, there is provided a solid state imaging device which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel, and an area of a color filter of the first imaging pixel is smaller than an area of a color filter of the second imaging pixel. In various illustrative embodiments, the first color filter is aligned with the first imaging pixel and the second color filter is aligned with the second imaging pixel.

In the first illustrative embodiment of the present disclosure, the solid state imaging device is configured to include a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

According to a second illustrative embodiment of the present disclosure, there is provided a manufacturing method of a solid state imaging device including forming a solid state imaging device which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

In the second illustrative embodiment of the present disclosure, a solid state imaging device is formed, which is configured to include a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

According to a third illustrative embodiment of the present disclosure, there is provided electronic equipment which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

In the third illustrative embodiment of the present disclosure, the electronic equipment is configured to include a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

According to a fourth illustrative embodiment of the present disclosure, there is provided a solid state imaging device which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

In the fourth illustrative embodiment of the present disclosure, the solid state imaging device is configured to include a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

According to a fifth illustrative embodiment of the present disclosure, there is provided a manufacturing method of a solid state imaging device including forming a solid state imaging device which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

In the fifth illustrative embodiment of the present disclosure, there is provided a solid state imaging device which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

According to a sixth illustrative embodiment of the present disclosure, there is provided electronic equipment which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

In the sixth illustrative embodiment of the present disclosure, the electronic equipment is configured to include a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

Advantageous Effects of Invention

According to the present disclosure, it is possible to detect a phase difference. According to the present disclosure, it is possible to suppress the color mixing and the sensitivity reduction in the pixels for phase difference detection. Further, according to the present disclosure, it is possible to suppress the color mixing in pixels which are adjacent to the pixels for phase difference detection.

Note that, the present disclosure is not necessarily limited to the effects described here, and any of the effects described in the present disclosure may be acceptable.

BRIEF DESCRIPTION OF DRAWINGS

FIG. 28 shows an equivalent circuit of an illustrative second configuration of the pixels.

DESCRIPTION OF EMBODIMENTS

First Illustrative Embodiment (Configuration Example of an Illustrative Embodiment of Solid State Imaging Device)

Figure 1:
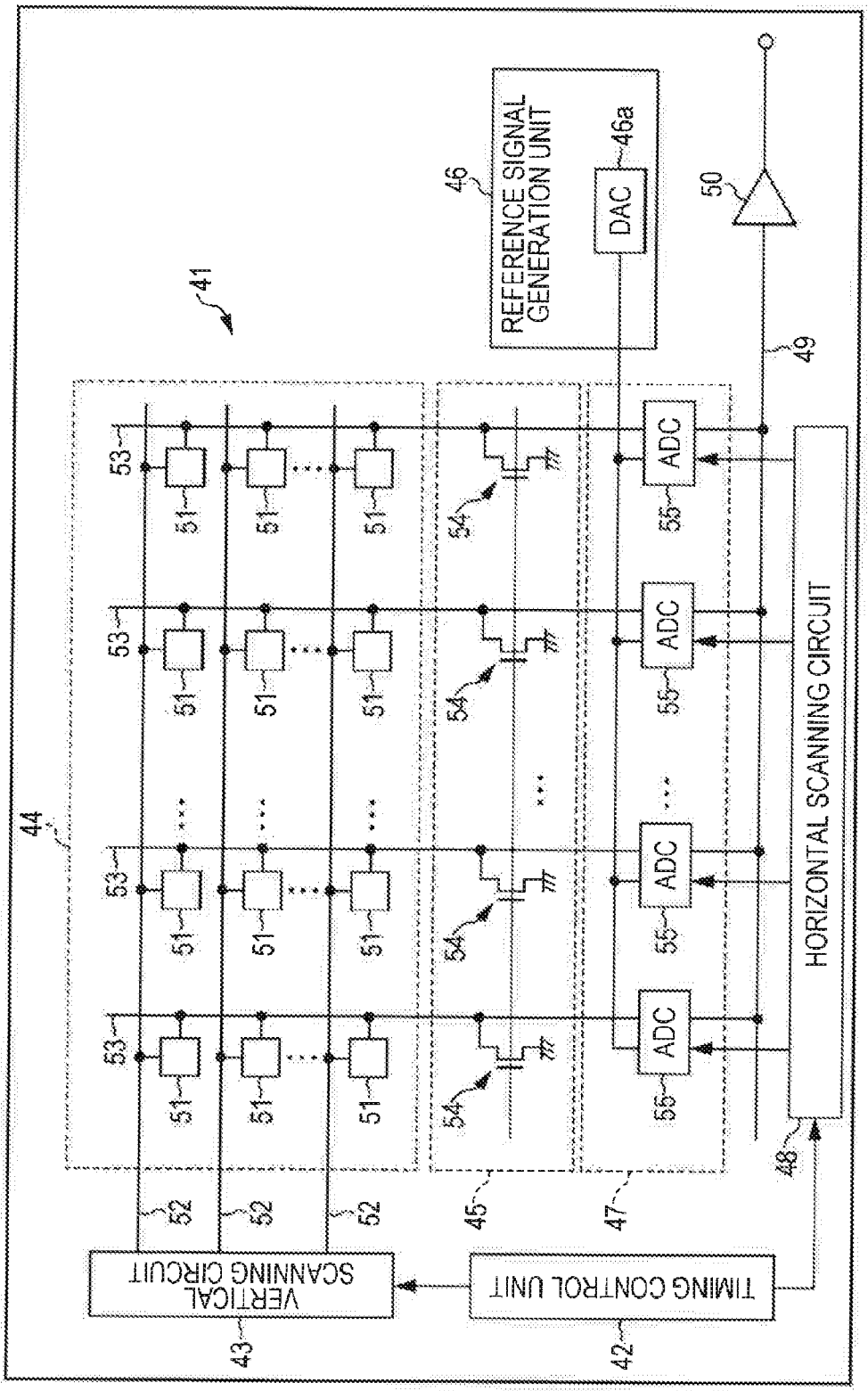
FIG. 1 is a block diagram showing an illustrative configuration example of an embodiment of a solid state imaging device to which the present technology is applied.

FIG. 1 is a block diagram showing an illustrative configuration example of an embodiment of a solid state imaging device to which the present technology is applied.

A solid state imaging device 41 of FIG. 1 is configured to include, on a semiconductor substrate which is not shown, a timing control unit 42, a vertical scanning circuit 43, a pixel array unit 44, a constant current source circuit unit 45, a reference signal generation unit 46, a column AD conversion unit 47, a horizontal scanning circuit 48, a horizontal output line 49, and an output circuit 50.

The timing control unit 42 supplies a clock signal or a timing signal, which is necessary for predetermined operations, to the vertical scanning circuit 43 and the horizontal scanning circuit 48 on the basis of a master clock of a predetermined frequency. For example, the timing control unit 42 supplies a timing signal of a shutter operation or a read operation of pixels 51 to the vertical scanning circuit 43 and the horizontal scanning circuit 48. While omitted from the drawings, the timing control unit 42 also supplies the clock signal or the timing signal, which is necessary for predetermined operations, to the reference signal generation unit 46 and the column AD conversion unit 47.

The vertical scanning circuit 43 supplies a signal which controls the output of the pixel signal to each of the pixels 51 which are lined up in a vertical direction of the pixel array unit 44, in order at a predetermined timing.

The plurality of pixels 51 is arranged in a two-dimensional array pattern (a matrix pattern) in the pixel array unit 44.

The plurality of pixels 51 which are arranged in a two-dimensional array pattern are connected to the vertical scanning circuit 43 by horizontal signal lines 52 in row units. In other words, the plurality of pixels 51 which are arranged in the same row within the pixel array unit 44 are connected to the vertical scanning circuit 43 by the same single horizontal signal line 52. Note that, in FIG. 1, the horizontal signal lines 52 are shown as single wiring; however, they are not limited to single wiring.

The plurality of pixels 51 which are arranged in a two-dimensional array pattern are connected to the horizontal scanning circuit 48 by vertical signal lines 53 in column units. In other words, the plurality of pixels 51 which are arranged in the same column within the pixel array unit 44 are connected to the horizontal scanning circuit 48 by the same single vertical signal line 53.

Each of the pixels 51 within the pixel array unit 44 outputs a pixel signal corresponding to a charge accumulated in the inner portion thereof to the vertical signal line 53 according to the signal which is supplied from the vertical scanning circuit 43 via the horizontal signal line 52. The pixels 51 function as the pixels for imaging or the pixels for phase difference detection. The detailed configuration of the pixels 51 will be described later with reference to FIG. 2 and the like.

The constant current source circuit unit 45 includes a plurality of load MOSs 54, and one of the load MOSs 54 is connected to each of the vertical signal lines 53. In the load MOS 54, a bias voltage is applied to the gate and a source is grounded. The load MOS 54 forms a source follower circuit with the transistors within the pixels 51 which are connected via the vertical signal line 53.

The reference signal generation unit 46 is configured to include a Digital to Analog Converter (DAC) 46a, generates a ramp waveform reference signal and supplies the reference signal to the column AD conversion unit 47 according to the clock signal from the timing control unit 42.

The column AD conversion unit 47 includes a plurality of Analog to Digital Converters (ADCs) 55, one of which is provided for every column of the pixel array unit 44. Therefore, a plurality of the pixels 51, one of the load MOSs 54, and one of the ADCs 55 are connected to one of the vertical signal lines 53.

The ADC 55 subjects the pixel signals which are supplied from the pixels 51 of the same column via the vertical signal line 53 to a Correlated Double Sampling (CDS) process, and further performs an AD conversion process thereon.

Each of the ADCs 55 temporarily stores the post-AD conversion pixel data and outputs the data to the horizontal output line 49 according to the control of the horizontal scanning circuit 48.

The horizontal scanning circuit 48 outputs the pixel data which is stored in the plurality of ADCs 55 to the horizontal output line 49, in order at a predetermined timing.

The horizontal output line 49 is connected to the output circuit (the amplifier circuit) 50, and the post-AD conversion pixel data which is output from the ADCs 55 is output to the outside of a solid state imaging device 41 from the output circuit 50 via the horizontal output line 49. There is a case in which the output circuit 50 (the signal processing unit) only performs buffering, for example, and there is a case in which the output circuit 50 performs various digital signal processing such as black level adjustment and column variation correction.

The solid state imaging device 41 which is configured as described above is a CMOS image sensor referred to as a column AD type, in which the ADC 55 which performs the CDS processing and the AD conversion processing is arranged for each vertical column.

(First Illustrative Configuration Example of Pixels)

Figure 2:
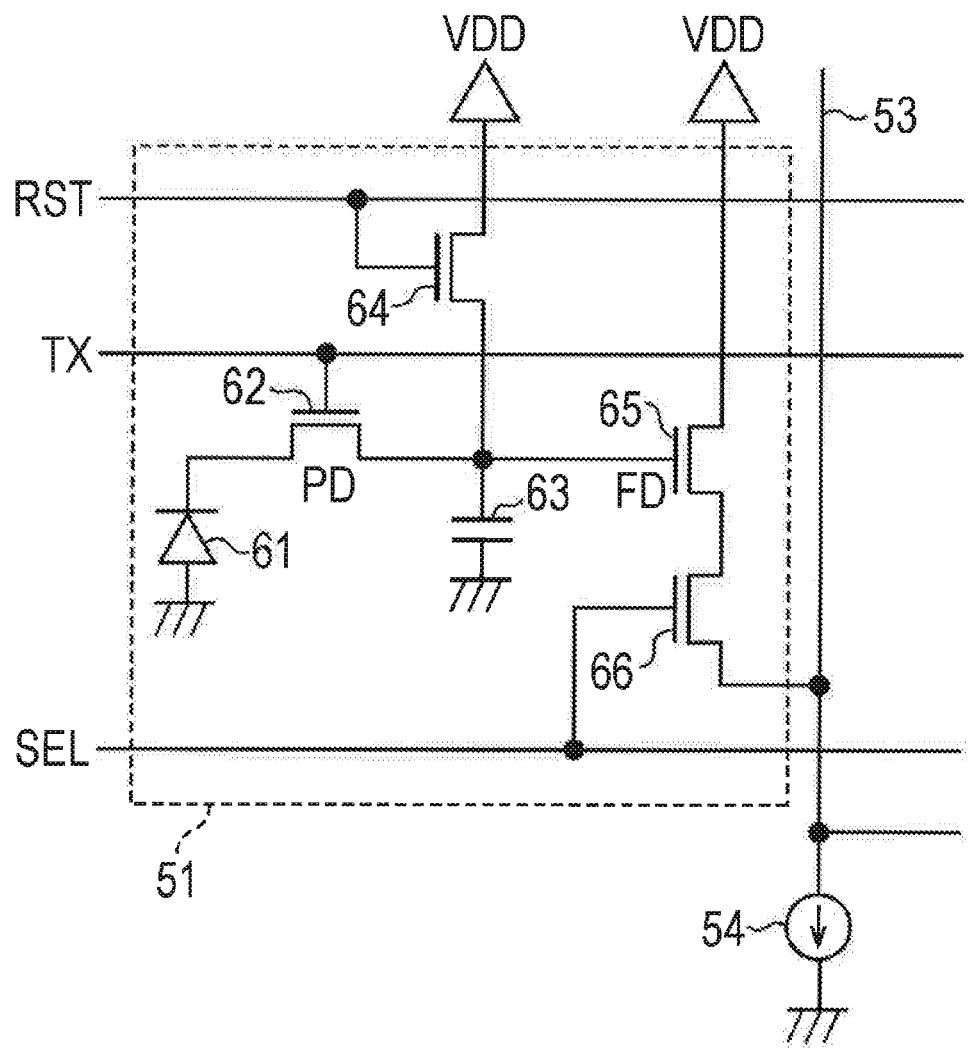
FIG. 2 is a diagram showing an equivalent circuit of an illustrative first configuration example of a pixel.

FIG. 2 shows an illustrative equivalent circuit of the first configuration example of the pixel 51.

The pixel 51 includes a photodiode 61 as a photoelectric conversion element, a transfer transistor 62, a floating diffusion region (FD) 63, a reset transistor 64, an amplification transistor 65, and a selection transistor 66.

The photodiode 61 is a photoelectric conversion unit which generates and accumulates a charge (a signal charge) corresponding to an amount of received light. In the photodiode 61, the anode terminal is grounded and the cathode terminal is connected to the FD 63 via the transfer transistor 62.

When the transfer transistor 62 is turned on by a transfer signal TX, the transfer transistor 62 reads the charge that is generated by the photodiode 61 and transfers the charge to the FD 63.

The FD 63 holds the charge which is read from the photodiode 61. When the reset transistor 64 is turned on by a reset signal RST, the reset transistor 64 resets the potential of the FD 63 by allowing the charge which is accumulated in the FD 63 to be discharged to the constant voltage source VDD.

The amplification transistor 65 outputs a pixel signal corresponding to the potential of the FD 63. In other words, the amplification transistor 65 forms a source follower circuit with the load MOS 54 which is the constant current source, and a pixel signal that indicates a level corresponding to the current which is accumulated in the FD 63 is output from the amplification transistor 65 to the ADC 55 via the selection transistor 66.

The selection transistor 66 is turned on when the pixel 51 is selected by a selection signal SEL, and the selection transistor 66 outputs the pixel signal of the pixel 51 to the ADC 55 via the vertical signal line 53. The transfer signal TX, the reset signal RST, and the selection signal SEL are supplied from the vertical scanning circuit 43 via the horizontal signal line 52 (FIG. 1).

(First Illustrative Structure Example of Pixel Array Unit)

Figure 3A:
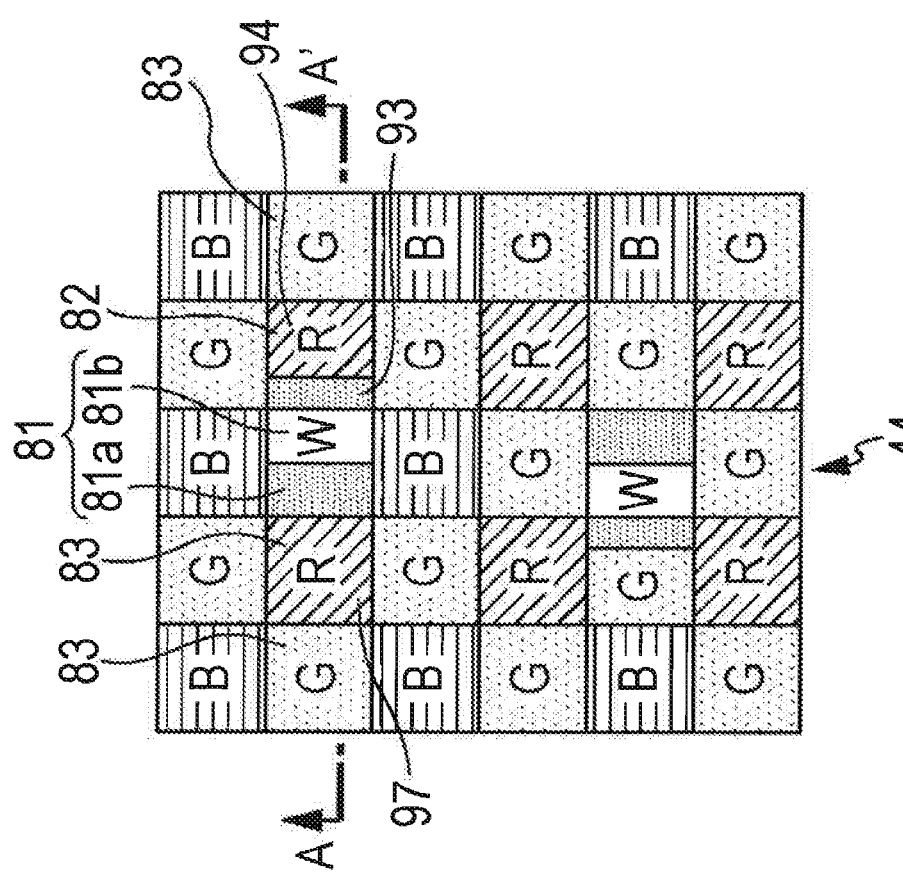
FIG. 3A is a diagram showing an illustrative first structure example of a pixel array unit.
Figure 3B:
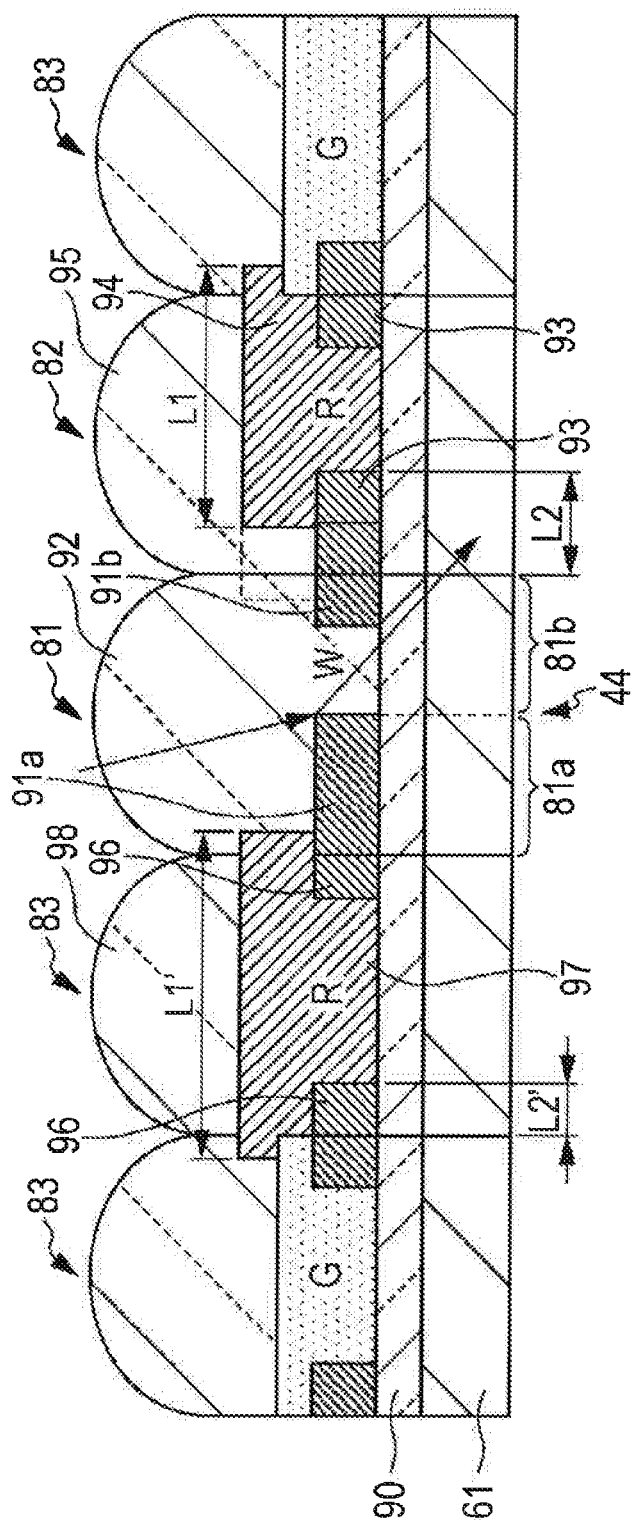
FIG. 3B is an illustrative diagram showing the first structure example of the pixel array unit.

FIGS. 3A and 3B are illustrative diagrams showing the first structure example of the pixel array unit 44.

FIG. 3A is a schematic top surface diagram showing the first structure example of the pixel array unit 44, and FIG. 3B is a cross sectional view taken along the line A-A' of FIG. 3A. Note that, in FIGS. 3A and 3B, only a region of the photodiode 61 of 5×6 of the pixels 51 of the pixel array unit 44 is depicted. The same applies to FIGS. 4A, 4B, 7A to 8B, 10A to 18B, and 20A to 26B, which are described later. In FIG. 3A, the on-chip lenses are not depicted. The same applies to FIGS. 4A, 4B, 7A to 18B, and 20A to 27, which are described later.

As shown in FIG. 3A, each of the pixels 51 of the pixel array unit 44 is generally a pixel for imaging of a Bayer array, and a portion of the pixels for imaging have been replaced by pixels for phase difference detection. Note that, hereinafter, when particularly distinguishing the pixels for phase difference detection of the pixels 51, the term phase difference detection pixels 81 will be used.

The photodiode 61 of the phase difference detection pixel 81 is configured to include an optical black region 81a and an opening region 81b which images white (W) light. The image data corresponding to the pixel signal which is obtained as a result of the imaging using the opening region 81b is used in the detection of a phase difference in an external apparatus (not shown). The detected phase difference is used in focus determination or the like.

Hereinafter, when particularly distinguishing the pixel for imaging, of the pixels 51, which is adjacent to the side which opposes the side at which the optical black region 81a of the phase difference detection pixel 81 is arranged, that is, adjacent to the side at which the opening region 81b is arranged (the right side of the center in FIG. 3B), the term first imaging pixel 82 will be used. When particularly distinguishing the pixels for imaging other than the first imaging pixel 82, of the pixels 51, the term second imaging pixel 83 will be used.

As shown in FIG. 3B, a transparent film 90 is formed on the photodiodes 61 of the pixels 51. The material formed on the transparent film 90 differs according to the type of the pixel 51.

Specifically, a light shielding film 91a, and a light shielding film 91b, are respectively formed in regions corresponding to the entire surface of the optical black region 81a on the transparent film 90 of the phase difference detection pixel 81, and a portion within the opening region 81b that forms a boundary with another pixel 51. An on-chip lens 92 is formed to cover the transparent film 90 of the phase difference detection pixel 81 on which the light shielding film 91a and the light shielding film 91b are formed.

The on-chip lens 92 functions as a white color filter in addition to having a function of condensing the light from outside onto the photodiode 61 of the phase difference detection pixel 81. Here, the on-chip lens 92 also functions as a white color filter; however, white color filters other than the on-chip lens 92 may be provided.

A light shielding film 93 is formed on a portion on the transparent film 90 of the first imaging pixel 82 that forms a boundary with another pixel 51. A color filter 94 which is red, green, or blue (red in FIG. 3B) is further formed on the transparent film 90 of the first imaging pixel 82 on which the light shielding film 93 is formed. An on-chip lens 95 is formed to cover the transparent film 90 of the first imaging pixel 82 on which the light shielding film 93 and the color filter 94 are formed. The on-chip lens 95 condenses the light from outside onto the photodiode 61 of the first imaging pixel 82.

A light shielding film 96 is formed on a portion on the transparent film 90 of the second imaging pixel 83 that forms a boundary with another pixel 51. A color filter 97 which is red, green, or blue (red or green in FIG. 3B) is further formed on the transparent film 90 of the second imaging pixel 83 on which the light shielding film 96 is formed. An on-chip lens 98 is formed to cover the transparent film 90 of the second imaging pixel 83 on which the light shielding film 96 and the color filter 97 are formed. The on-chip lens 98 condenses the light from outside onto the photodiode 61 of the second imaging pixel 83.

In the solid state imaging device 41, the area of the color filter 94 is smaller than the area of the color filter 97. Specifically, a width L1 in the horizontal direction of the color filter 94 of the first imaging pixel 82, which is the direction in which the phase difference detection pixel 81 is adjacent to the first imaging pixel 82, is short in comparison to a width L1' of the color filter 97 of the second imaging pixel 83. It is possible to set the difference between the width L1 and the width L1' to a value obtained by adding three times standard deviation (sigma) to the mean value of the process variation of the color filters 94 or greater, for example (hereinafter referred to as the variation value).

The process variation of the color filters 94 arises from the lithography process (the photo-lithography) of the color filters 94 (97) and depends on the apparatus that performs the lithography process, the wavelength of the light source used in the lithography process and the like. For example, when an i-beam is used as the light source of the lithography process, the variation value is from several dozen nm to several hundred nm, approximately. In addition to the i-beam, KrF, ArF and the like may also be used as the light source of the lithography process.

As shown in FIG. 3A, the position of the side (the right side in FIG. 3B) of the color filter 94 of the first imaging pixel 82 which opposes the side which is adjacent to the phase difference detection pixel 81 is the same as that of the color filter 97 of the second imaging pixel 83 which is lined up in the vertical direction (for example, the green second imaging pixel 83 below the red first imaging pixel 82 of FIG. 3A).

As shown in FIG. 3B, the area of the light shielding film 93 is greater than the area of the light shielding film 96. Specifically, a width L2 in the horizontal direction of the side within the light shielding film 93 of the first imaging pixel 82 which is adjacent to the phase difference detection pixel 81, is long in comparison to a width L2' of the light shielding film 96 of the second imaging pixel 83. The difference between the width L2 and the width L2' can be set to the variation value or greater, for example.

In this manner, since the area of the light shielding film 93 is greater than the area of the light shielding film 96, the area of the color filter 94 is smaller than the area of the color filter 97; therefore, it is possible to prevent the light that does not pass through the color filter 94 from being incident to the photodiode 61 of the first imaging pixel 82.

As described above, the area of the color filter 94 is small in comparison to that of the color filter 97. Therefore, as shown in FIGS. 4A and 4B, even when the red color filters 94 and 97 are shifted diagonally to the lower left in FIG. 4A due to process variation, it is possible to prevent the light that passes through the color filter 94 from being incident to the opening region 81b.

Figure 4A:
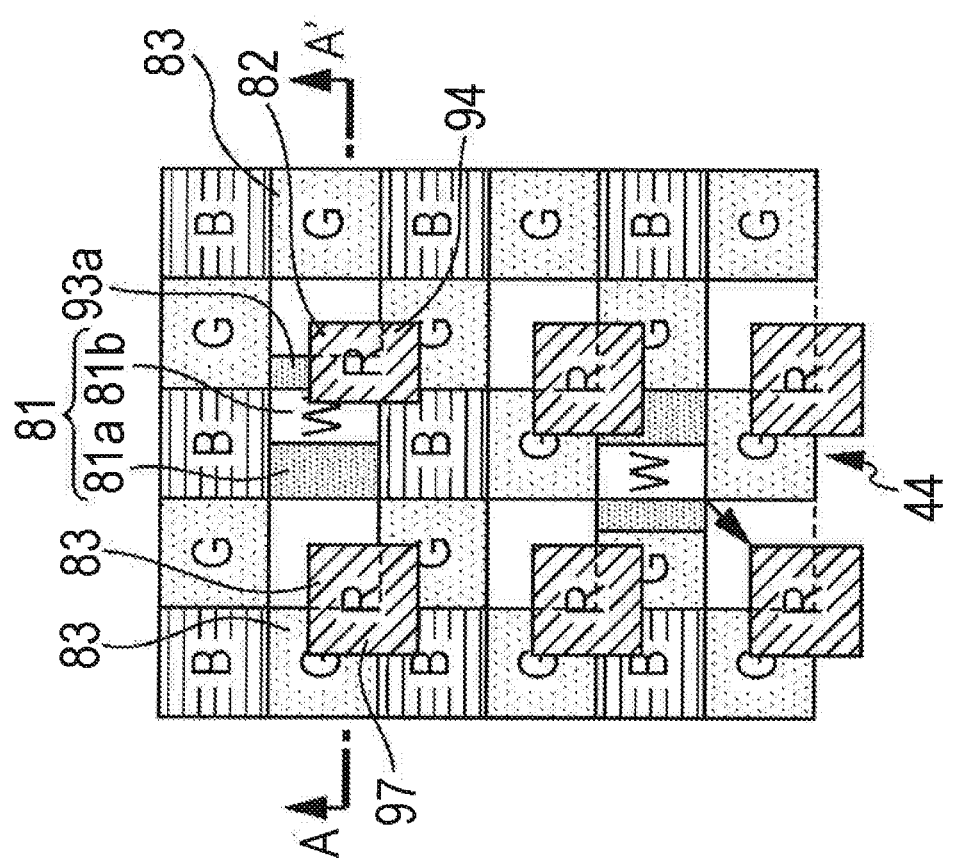
FIG. 4A is an illustrative diagram showing the first structure example of the pixel array unit when process variation occurs.
Figure 4B:
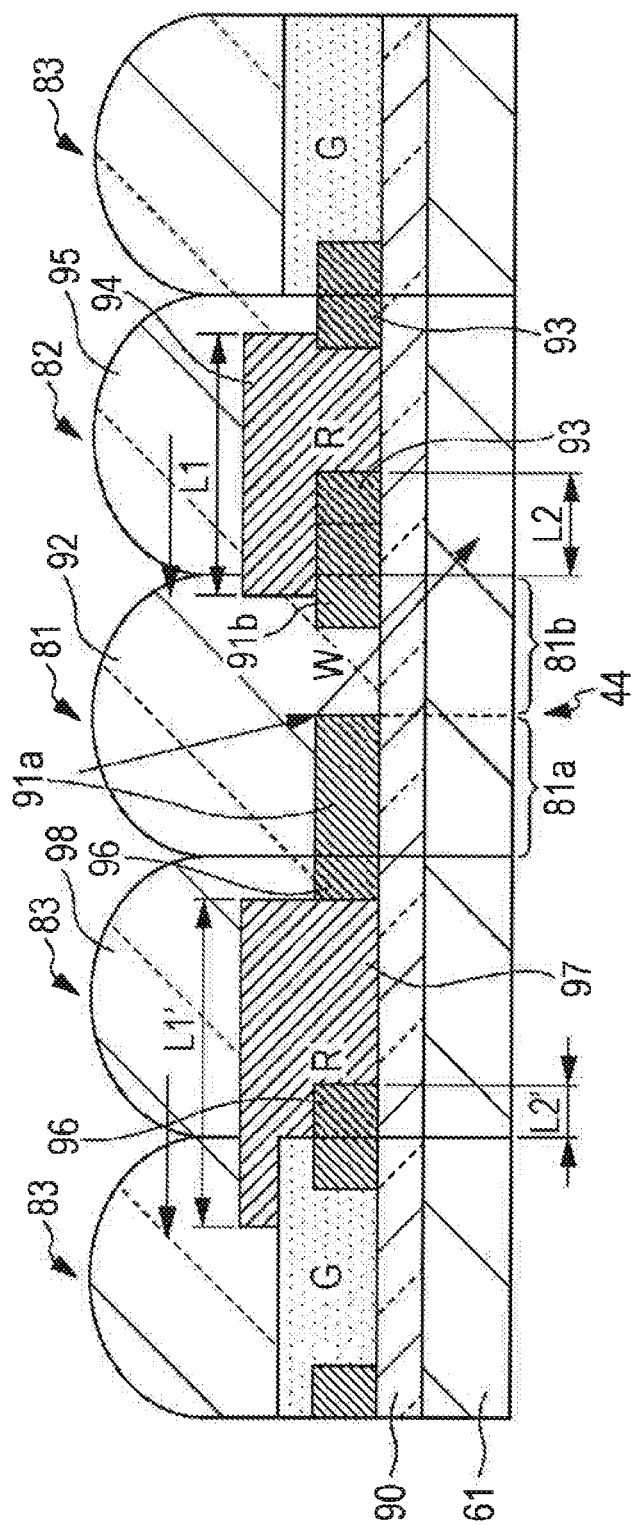
FIG. 4B is an illustrative diagram showing the first structure example of the pixel array unit when process variation occurs.

In other words, FIG. 4A is an illustrative schematic top surface diagram of the pixel array unit 44 of FIGS. 3A and 3B when the red color filters 94 and 97 are shifted diagonally to the lower left due to the process variation, and FIG. 4B is a cross sectional view taken along the line A-A' in FIG. 4A.

When the red color filter 97 is shifted diagonally to the lower left in FIG. 4A due to the process variation, as illustratively shown in FIG. 4B, the red color filter 97 is also formed on a region in which the light shielding film 96 of the adjacent green color filter 97 is not formed. Therefore, in addition to the light that passes through the green color filter 97, the light that passes through both the red color filter 97 and the green color filter 97 is incident to the photodiode 61 of the green second imaging pixel 83.

However, since the area of the region of the second imaging pixel 83 on which the light shielding film 96 is not formed is large, there is little influence of a decrease in sensitivity of the second imaging pixel 83 caused by light passing through both the red color filter 97 and the green color filter 97. Since the amount of light which is incident via both the red color filter 97 and the green color filter 97 is small, the influence of color mixing is also small.

Meanwhile, since the width L1 of the color filter 94 is small in comparison to the width L1' of the color filter 97, even if the red color filter 94 moves diagonally to the lower left in FIG. 4A, the red color filter 94 is not formed on a region in which the light shielding film 91b is not formed. Therefore, since the light that passes through the on-chip lens 92 enters the opening region 81b as it is without being blocked by the red color filter 94, a reduction in sensitivity is suppressed. The light that passes through the red color filter 94 is not incident on the opening region 81b, and color mixing is suppressed.

Here, the area of the opening region 81b is small in comparison to a region of the second imaging pixel 83 in which the light shielding film 96 is not formed. Therefore, when the area of the color filter of each of the pixels 51 is simply reduced in size, the sensitivity of the phase difference detection pixel 81 is reduced and the phase difference detection precision deteriorates. Therefore, in the solid state imaging device 41, only the area of the color filter 94 of the first imaging pixel 82 is reduced in size. Accordingly, it is possible to suppress the color mixing in the phase difference detection pixel 81 without reducing the sensitivity of the phase difference detection pixel 81.

The color filter of the phase difference detection pixel 81 is white. Therefore, when the light that passes through both the on-chip lens 92 and the red color filter 94 reaches the photodiode 61, the amount of the light that reaches the photodiode 61 is great and the influence of the color mixing is great in comparison to a case in which the light passes through both the red color filter 97 and the green color filter 97 and reaches the photodiode 61.

Therefore, the effect of suppressing the color mixing in the phase difference detection pixels 81 is great.

As described above, since the area of the light shielding film 93 is large in comparison to that of the light shielding film 96, the sensitivity of the first imaging pixel 82 is reduced in comparison to that of the second imaging pixel 83. Therefore, the output circuit 50 multiplies the pixel data which is obtained by the first imaging pixel 82 with a gain (performs gain correction) such that, when the light which is concentrated by the on-chip lens 95 and the on-chip lens 98 is the same, the pixel data of the first imaging pixel 82 and the second imaging pixel 83 is the same.

In a region on the transparent film 90 of the phase difference detection pixel 81 in which the light shielding film is not formed, the light is reflected irregularly and a portion of the light is incident on the first imaging pixel 82. As a result, the color mixing occurs in the first imaging pixel 82. Therefore, the output circuit 50 subjects the pixel data of the first imaging pixel 82 to color mixing correction.

In FIGS. 4A and 4B, description was given of a case in which the red color filters 94 and 97 were shifted due to the process variation; however, in a case in which the green or the blue color filters 94 and 97 are shifted, it is also possible to suppress the reduction in sensitivity and the color mixing in the phase difference detection pixels 81.

(Example of Shape of Light Shielding Film)

Figure 5A:
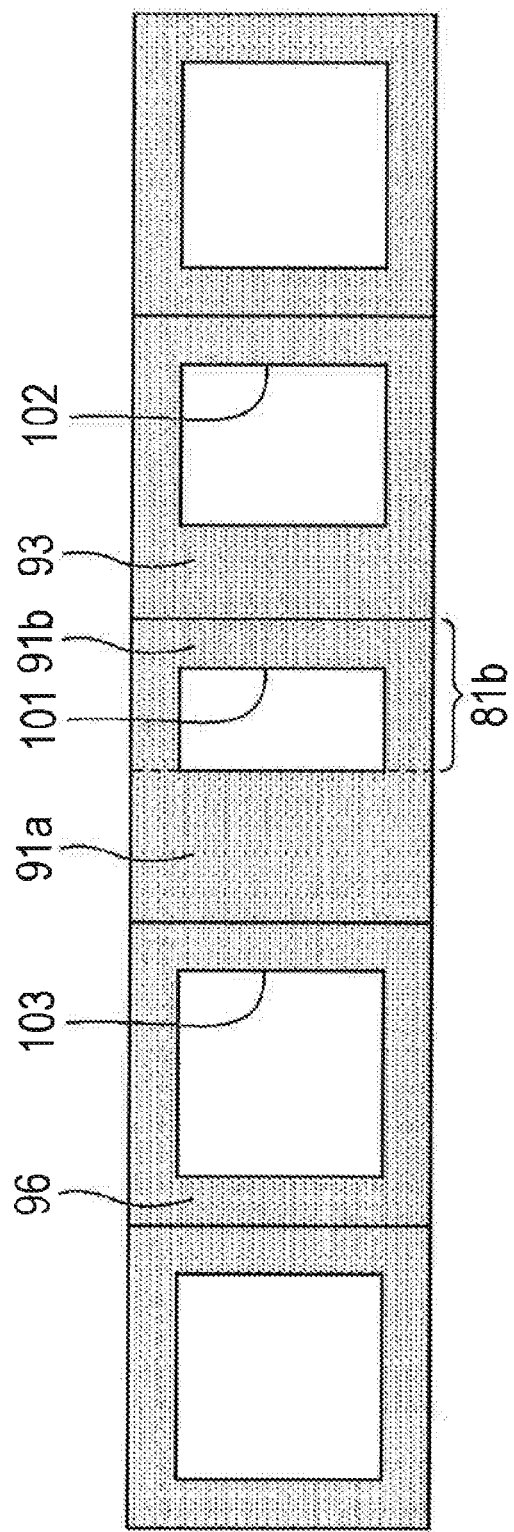
FIG. 5A is an illustrative schematic top surface diagram showing an example of the shape of a light shielding film in the pixel array unit of FIGS. 3A and 3B.
Figure 5B:
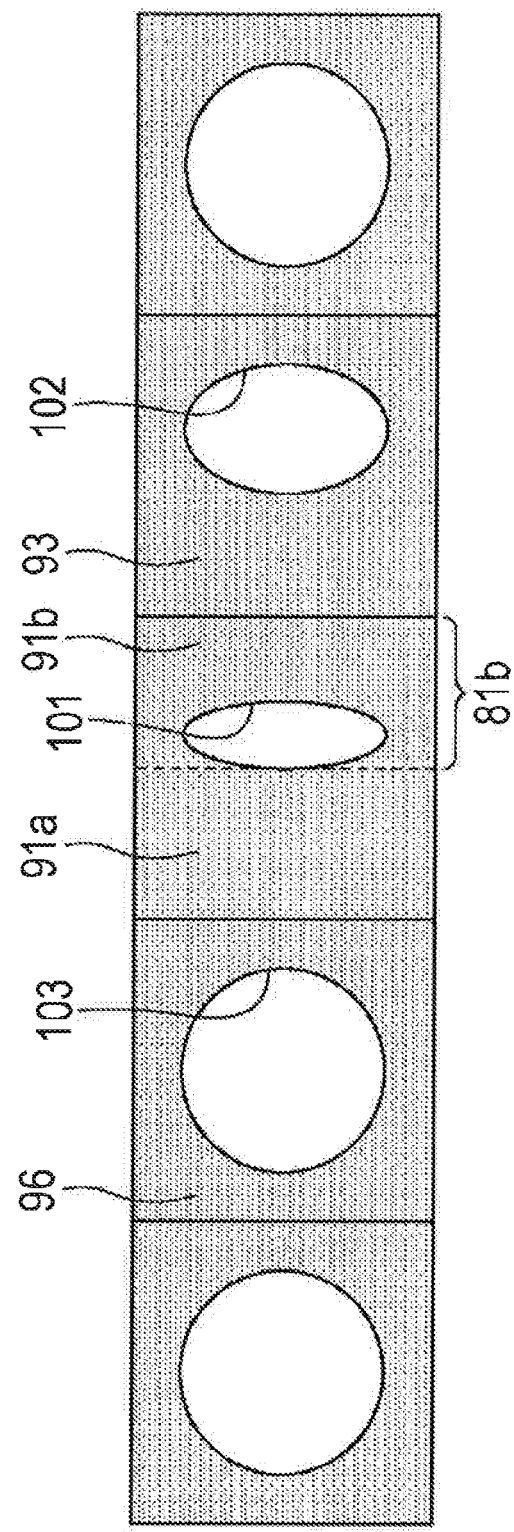
FIG. 5B is an illustrative schematic top surface diagram showing an example of the shape of the light shielding film in the pixel array unit of FIGS. 3A and 3B.

FIGS. 5A and 5B are schematic top surface diagrams showing examples of the shapes of the light shielding films 91a, 91b, 93, and 96 in the pixel array unit 44 of FIGS. 3A and 3B. FIGS. 5A and 5B represent the light shielding film of the 5×1 pixels of the position of the A-A' line of FIG. 3A.

As illustratively shown in FIG. 5A, the light shielding films 91a and 91b of the phase difference detection pixel 81 of the pixel array unit 44 of FIGS. 3A and 3B are formed such that an opening portion 101 in which the light shielding film is not formed is rectangular. The light shielding film 93 is formed such that an opening portion 102 in which the light shielding film is not formed is rectangular, and the light shielding film 96 is formed such that an opening portion 103 in which the light shielding film is not formed is rectangular.

As illustratively shown in FIG. 5B, the light shielding films 91a, 91b, 93, and 96 may be formed such that the opening portion 101 and the opening portion 102 have elliptical shapes, and the opening portion 103 has a circular shape. Naturally, the shapes of the opening portions 101 to 103 are not limited to the shapes of FIGS. 5A and 5B, and may be trapezoidal, triangular or the like.

(Illustrative Manufacturing Method of Pixel Array Unit)

FIGS. 6A to 6F are illustrative diagrams for showing the manufacturing method of the photodiodes 61 within the pixel array unit 44 of FIGS. 3A and 3B.

Figure 6A:
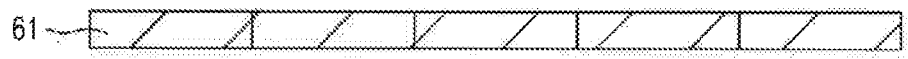
FIG. 6A is an illustrative diagram for illustrating the manufacturing method of the pixel array unit of FIGS. 3A and 3B.
Figure 6B:
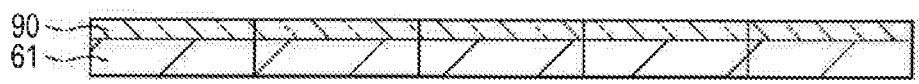
FIG. 6B is an illustrative diagram for illustrating the manufacturing method of the pixel array unit of FIGS. 3A and 3B.

As shown in FIG. 6A, first, the photodiode 61 with a waveguide (not shown) is formed on a semiconductor substrate. Next, as shown in FIG. 6B, an inorganic film with a high transmittance such as a $SiO_2$ film, a SiN film, or a TIOx film is formed on the photodiodes 61 as the transparent film 90. Note that, the transparent film 90 may be an organic film. For example, the organic material of the color filters 94 (97) and the on-chip lenses 92 (95, 98) may be siloxane or the like.

Figure 6C:
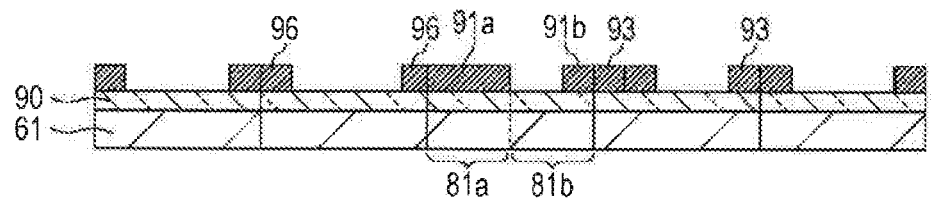
FIG. 6C is an illustrative diagram for illustrating the manufacturing method of the pixel array unit of FIGS. 3A and 3B.

Next, as shown in FIG. 6C, the light shielding films 91a, 91b, 93, and 96 are formed on the transparent film 90 using photo-lithography and dry etching.

Figure 6D:
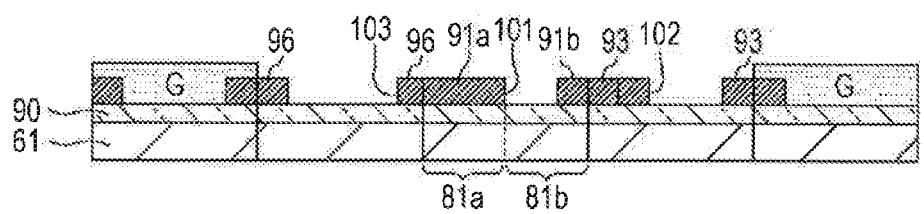
FIG. 6D is an illustrative diagram for illustrating the manufacturing method of the pixel array unit of FIGS. 3A and 3B.
Figure 6E:
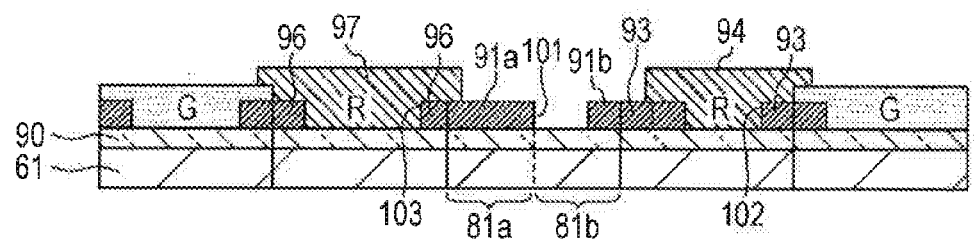
FIG. 6E is an illustrative diagram for illustrating the manufacturing method of the pixel array unit of FIGS. 3A and 3B.
Figure 6F:
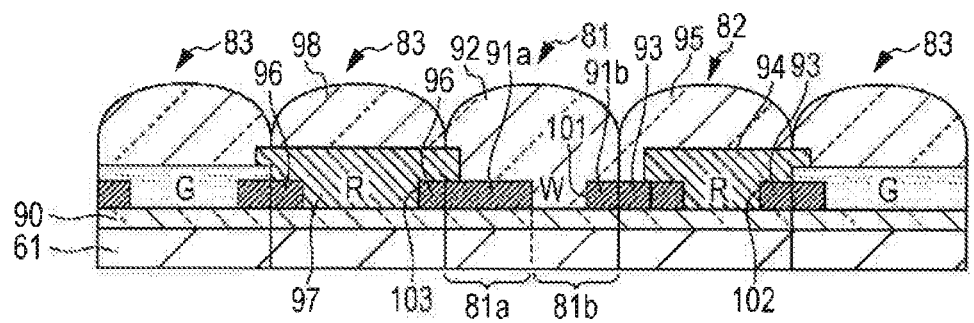
FIG. 6F is an illustrative diagram for illustrating the manufacturing method of the pixel array unit of FIGS. 3A and 3B.

As shown in FIG. 6D, the green color filters 94 and 97 are formed on the transparent film 90 using photo-lithography and dry etching. Next, as shown in FIG. 6E, the red color filters 94 and 97 are formed on the transparent film 90; and, subsequently, the blue color filters 94 and 97 are formed on the transparent film 90 using photo-lithography and dry etching. Finally, as shown in FIG. 6F, the on-chip lenses 92, 95, and 98 are formed to cover the transparent film 90 of the pixels 51.

As described above, in the solid state imaging device 41, the area of the color filter 94 of the first imaging pixel 82 is smaller than the area of the color filter 97 of the second imaging pixel 83. Therefore, it is possible to suppress the color mixing and the sensitivity reduction in the pixels for phase difference detection when the color filters 94 are shifted due to the process variation of the color filters 94.

Conversely, it is possible to suppress the color mixing by increasing the width in the direction in which the light shielding film 91b is adjacent to another pixel 51. However, in this case, since the opening portion 101 is narrowed, the sensitivity is reduced. Since the opening portion 101 of the phase difference detection pixel 81 is small in comparison to the first imaging pixel 82 or the second imaging pixel 83, the influence of the reduction in sensitivity is great, and there is a case in which it is difficult to detect the phase difference during photography in a dark place, for example.

In the description given above, the pixel 51 which is adjacent to the side of the phase difference detection pixel 81 at which the opening region 81b is arranged was set to the first imaging pixel 82; however, it is possible to set the pixel 51 which is adjacent to the phase difference detection pixel 81 in the vertical direction to the first imaging pixel 82.

In this case, the color filter 94 is arranged such that the position of the side of the color filter 94 of the first imaging pixel 82 which is not adjacent to the phase difference detection pixel 81 is the same as that of the second imaging pixel 83 which is lined up in the horizontal direction. The width of the color filter 94 of the first imaging pixel 82 in a direction in which the first imaging pixel 82 is adjacent to the phase difference detection pixel 81 is small in comparison to that of the color filter 97. Accordingly, it is possible to suppress the reduction in sensitivity and the color mixing of the phase difference detection pixel 81 due to the process variation of the color filter 94 of the first imaging pixel 82 which is adjacent to the phase difference detection pixel 81 in the vertical direction.

Both the pixel 51 which is adjacent to the side of the phase difference detection pixel 81 at which the opening region 81b is arranged, and the pixel 51 which is adjacent to the phase difference detection pixel 81 in the vertical direction can be set to the first imaging pixel 82.

(Second Illustrative Structure Example of Pixel Array Unit)

Figure 7A:
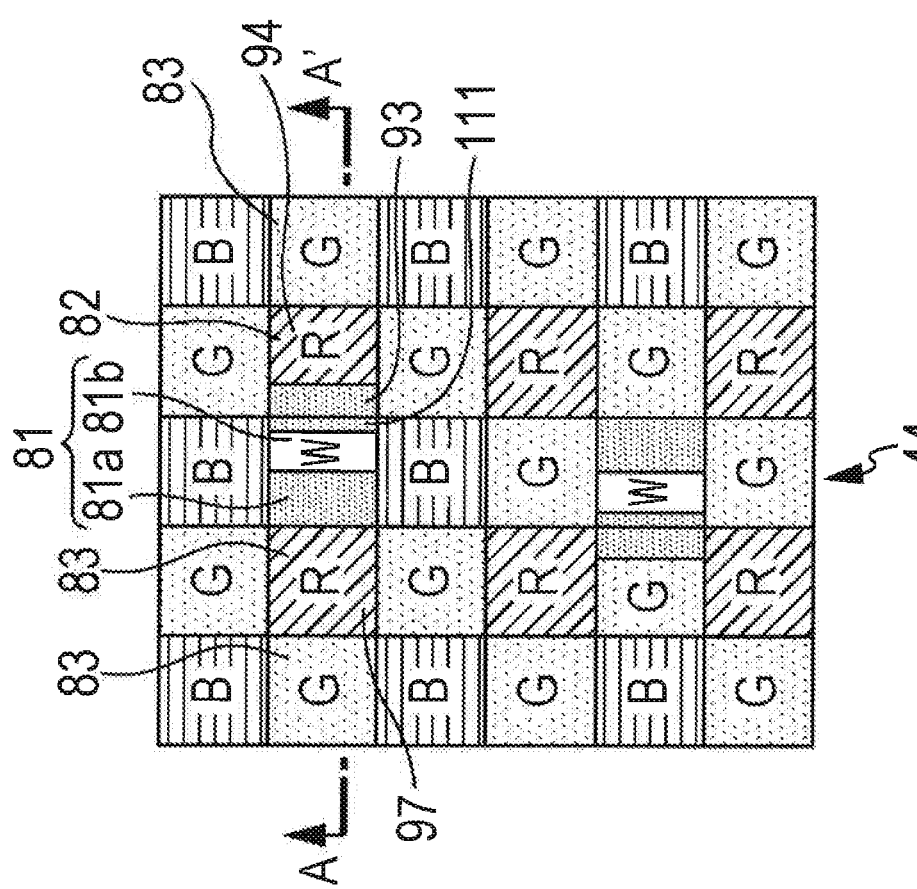
FIG. 7A is a diagram showing an illustrative second structure example of a pixel array unit.
Figure 7B:
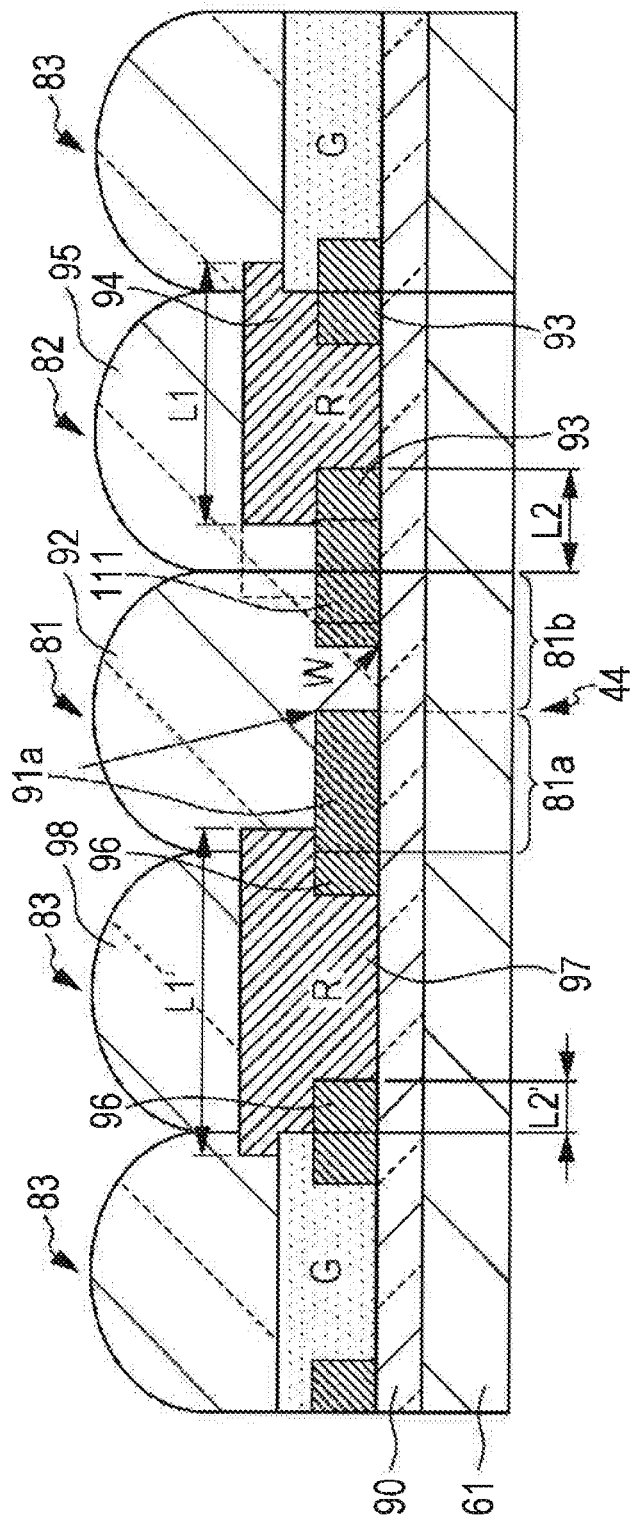
FIG. 7B is an illustrative diagram showing the second structure example of the pixel array unit.

FIGS. 7A and 7B are illustrative diagrams showing the second structure example of the pixel array unit 44.

Of the components shown in FIGS. 7A and 7B, components which are the same as those in FIGS. 3A and 3B are given the same reference numerals. Redundant description will be omitted as appropriate.

The configuration of the pixel array unit 44 of FIGS. 7A and 7B differs from the configuration of FIGS. 3A and 3B in that a light shielding film 111 is provided instead of the light shielding film 91b. In the pixel array unit 44 of FIGS. 7A and 7B, the color mixing in the first imaging pixel 82 is suppressed by providing the light shielding film 111, which has a greater area than the light shielding film 91b.

Specifically, the light shielding film 111 is formed in a region corresponding to a portion within the opening region 81b on the transparent film 90 of the phase difference detection pixel 81 that forms a boundary with another pixel 51. The area of the light shielding film 111 is greater than that of the light shielding film 91b. The width in the horizontal direction of the light shielding film 111 is large in comparison to the width in the horizontal direction of the side of the light shielding film 96 which is adjacent to the phase difference detection pixel 81.

The light shielding film 111 blocks the light which is reflected irregularly in a region on the transparent film 90 of the phase difference detection pixel 81 in which the light shielding film is not formed, and prevents the light from being incident on the photodiode 61 of the first imaging pixel 82. As a result, it is possible to suppress the color mixing in the first imaging pixel 82.

(Third Illustrative Structure Example of Pixel Array Unit)

Figure 8:
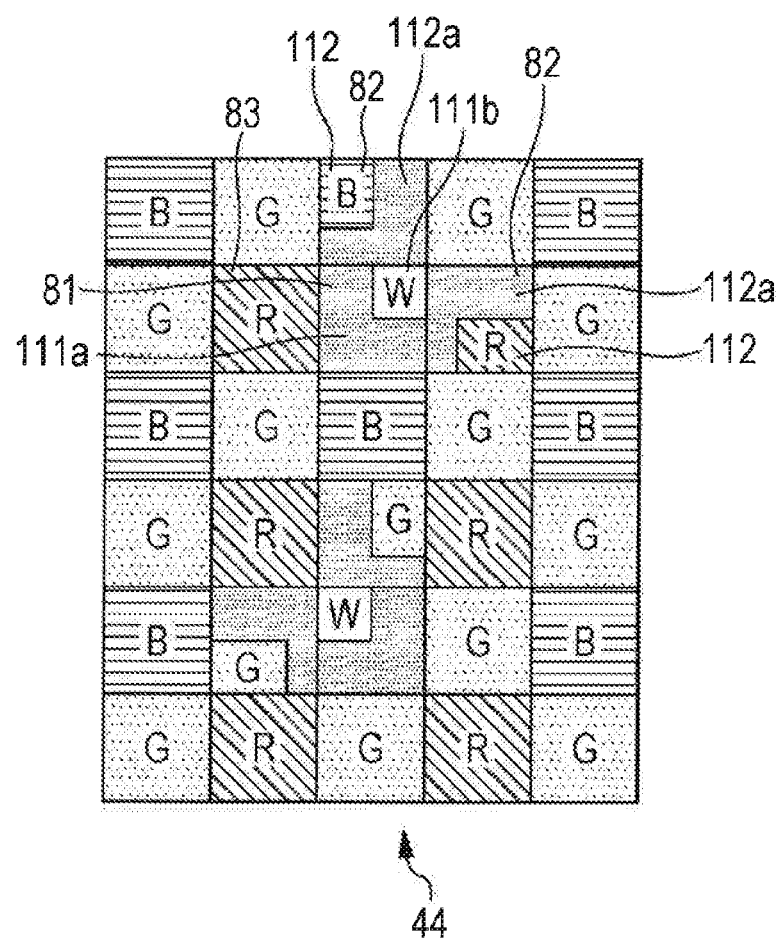
FIG. 8 is a schematic top surface diagram showing an illustrative third structure example of a pixel array unit.

FIG. 8 is an illustrative schematic top surface diagram showing the third structure example of the pixel array unit 44.

Of the components shown in FIG. 8, components which are the same as those in FIGS. 3A and 3B are given the same reference numerals. Redundant description will be omitted as appropriate.

The configuration of the pixel array unit 44 of FIG. 8 differs from the configuration of FIGS. 3A and 3B in that an optical black region 111a, an opening region 111b, a color filter 112, and a light shielding film 112a are provided instead of the optical black region 81a, the opening region 81b, the color filter 94, and the light shielding film 93, respectively. In the pixel array unit 44 of FIG. 8, the opening region 111b has a square shape when viewed from above, and the pixels 51 which are adjacent to the phase difference detection pixel 81 in the horizontal direction and the vertical direction become the first imaging pixels 82.

Specifically, the opening region 111b is one region that is obtained by dividing the region of the photodiode 61 of the phase difference detection pixel 81 into four, and the optical black region 111a is the remaining three regions.

The position in the vertical direction of the color filter 112 of the first imaging pixel 82, which is adjacent to the phase difference detection pixel 81 in the horizontal direction, differs from that of the opening region 111b of the phase difference detection pixel 81. In other words, when the opening region 111b is a region of the top left or the top right of the photodiode 61, the color filter 112 is arranged on the bottom side of the photodiode 61 of the first imaging pixel 82. When the opening region 111b is a region of the bottom left or the bottom right of the photodiode 61, the color filter 112 is arranged on the top side of the photodiode 61 of the first imaging pixel 82.

The position in the horizontal direction of the color filter 112 of the first imaging pixel 82, which is adjacent to the phase difference detection pixel 81 in the vertical direction, differs from that of the opening region 111b of the phase difference detection pixel 81. In other words, when the opening region 111b is a region of the top right or the bottom right of the photodiode 61, the color filter 112 is arranged on the left side of the photodiode 61 of the first imaging pixel 82. When the opening region 111b is a region of the top left or the bottom left of the photodiode 61, the color filter 112 is arranged on the right side of the photodiode 61 of the first imaging pixel 82.

The width of the color filter 112 in a direction in which the color filter 112 is adjacent to the phase difference detection pixel 81 is short in comparison to that of the color filter 94 of the second imaging pixel 83. The position of the side of the color filter 112 which opposes the side which is adjacent to the phase difference detection pixel 81 is the same as that of the color filter 94 of the second imaging pixel 83 which is lined up in a direction perpendicular to the direction adjacent to the phase difference detection pixel 81.

Figure 9:
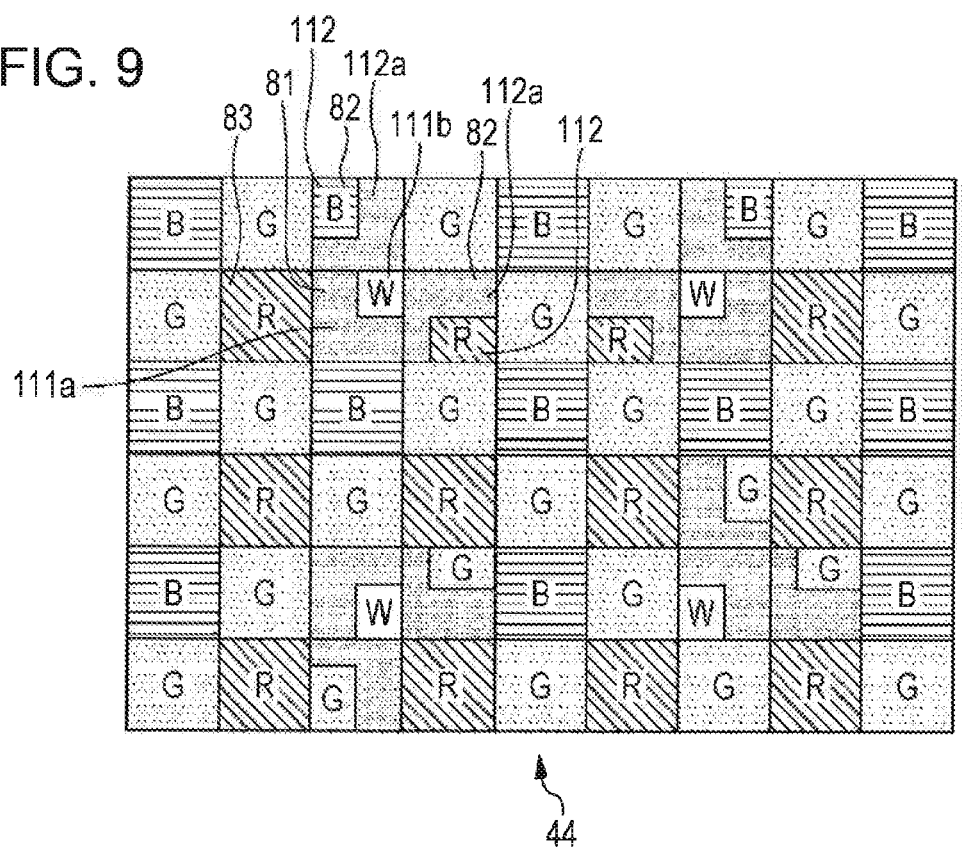
FIG. 9 is a diagram showing another illustrative example of the arrangement of an opening region.

Note that, in the example of FIG. 8, the positions in the vertical direction of the opening regions 111*b* that are lined up in the vertical direction are the same, and the positions in the horizontal direction are different; however, as illustratively shown in FIG. 9, the positions in the horizontal direction of the opening regions 111*b* that are lined up in the vertical direction may be the same, and the positions in the vertical direction may differ. In this case, for example, as shown in FIG. 9, the positions in the vertical direction of the opening regions 111*b* that line up in the horizontal direction are the same, and the positions in the horizontal direction are set to be different. By adopting this configuration, it is possible to detect the phase difference in the horizontal direction and the vertical direction using the pixel signals of the phase difference detection pixels 81.

(Fourth Illustrative Structure Example of Pixel Array Unit)

Figure 10A:
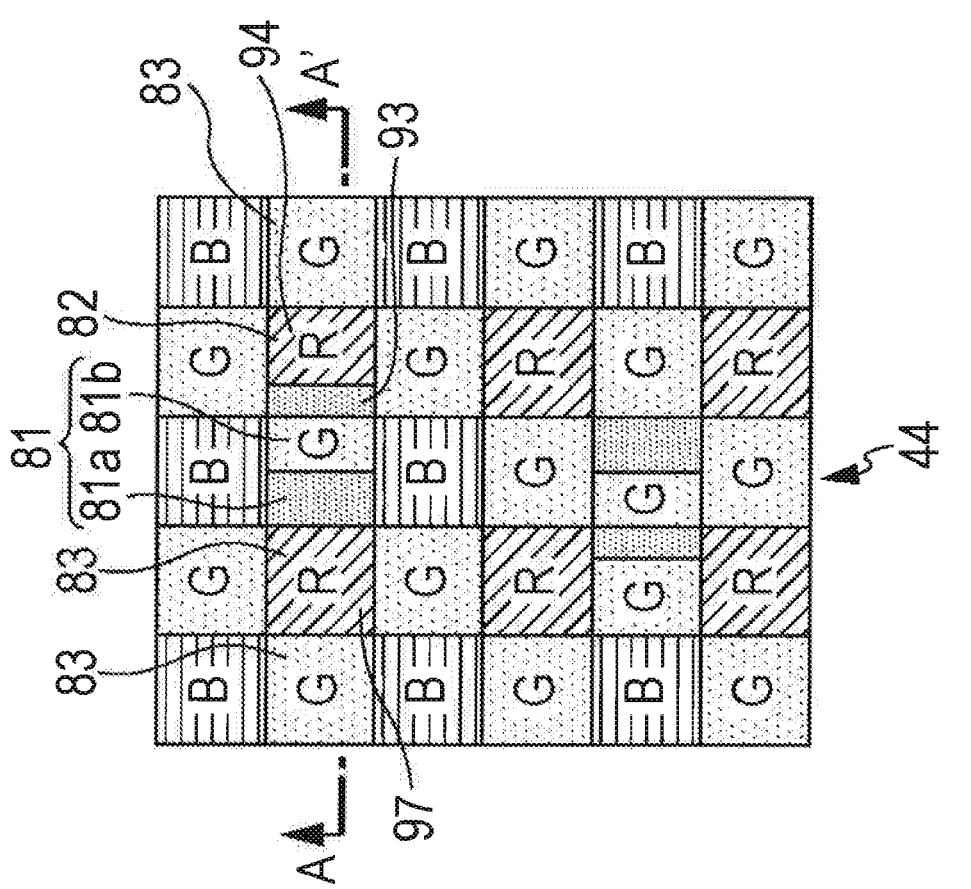
FIG. 10A is a schematic top surface diagram showing an illustrative fourth structure example of a pixel array unit.
Figure 10B:
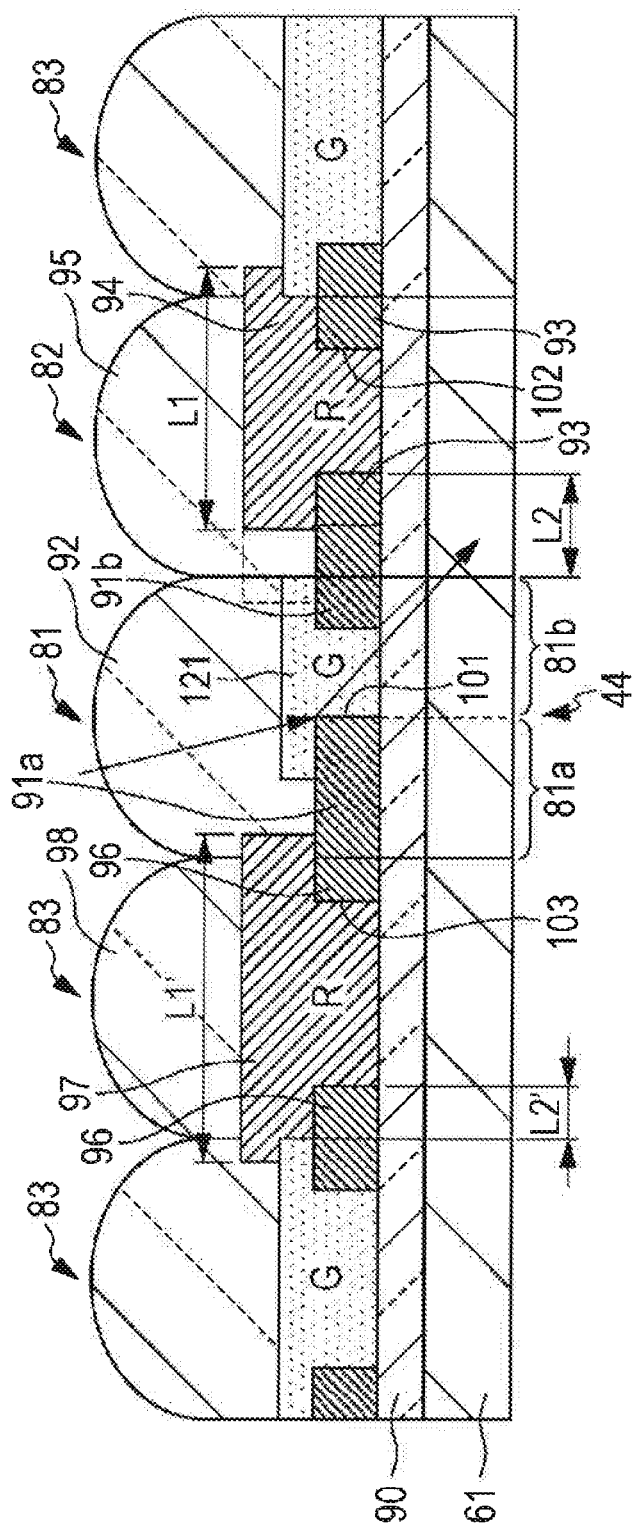
FIG. 10B is an illustrative schematic diagram showing the fourth structure example of the pixel array unit.

FIGS. 10A and 10B are illustrative diagrams showing the fourth structure example of the pixel array unit 44.

Of the components shown in FIGS. 10A and 10B, components which are the same as those in FIGS. 3A and 3B are given the same reference numerals. Redundant description will be omitted as appropriate.

The configuration of the pixel array unit 44 of FIGS. 10A and 10B differs from the configuration of FIGS. 3A and 3B in that the phase difference detection pixel 81 is provided with a color filter 121. In the pixel array unit 44 of FIGS. 10A and 10B, the phase difference detection pixel 81 is used as a pixel for imaging in addition to being used as a pixel for phase difference detection.

Specifically, the color filter 121 is formed on the transparent film 90 corresponding to the opening region 81*b* in which the light shielding film 91*a* and the light shielding film 91*b* are formed. In the example of FIGS. 10A and 10B, the color filter 121 is green (G). Accordingly, the pixel data of the phase difference detection pixel 81 can be used as the pixel data of the green pixel for imaging in addition to being used for the phase difference detection.

Note that, since the opening portion 101 is small in comparison to the opening portion 102 or the opening portion 103, the sensitivity of the phase difference detection pixel 81 is low in comparison to the first imaging pixel 82 or the second imaging pixel 83. Therefore, when the pixel data which is obtained by the phase difference detection pixel 81 is used as it is as the pixel data of the green pixel for imaging, there is a case in which the pixel data may not be obtained precisely during photography in a dark place. Accordingly, the output circuit 50 may multiply the pixel data which is obtained by the phase difference detection pixel 81 with a gain (perform gain correction) such that, when the light which is concentrated by the on-chip lens 92 and the on-chip lens 98 is the same, the pixel data of the phase difference detection pixel 81 and the second imaging pixel 83 is the same.

In FIGS. 10A and 10B, the color filter 121 is green; however, the color filter 121 may be red or blue.

(Fifth Illustrative Structure Example of Pixel Array Unit)

Figure 11A:
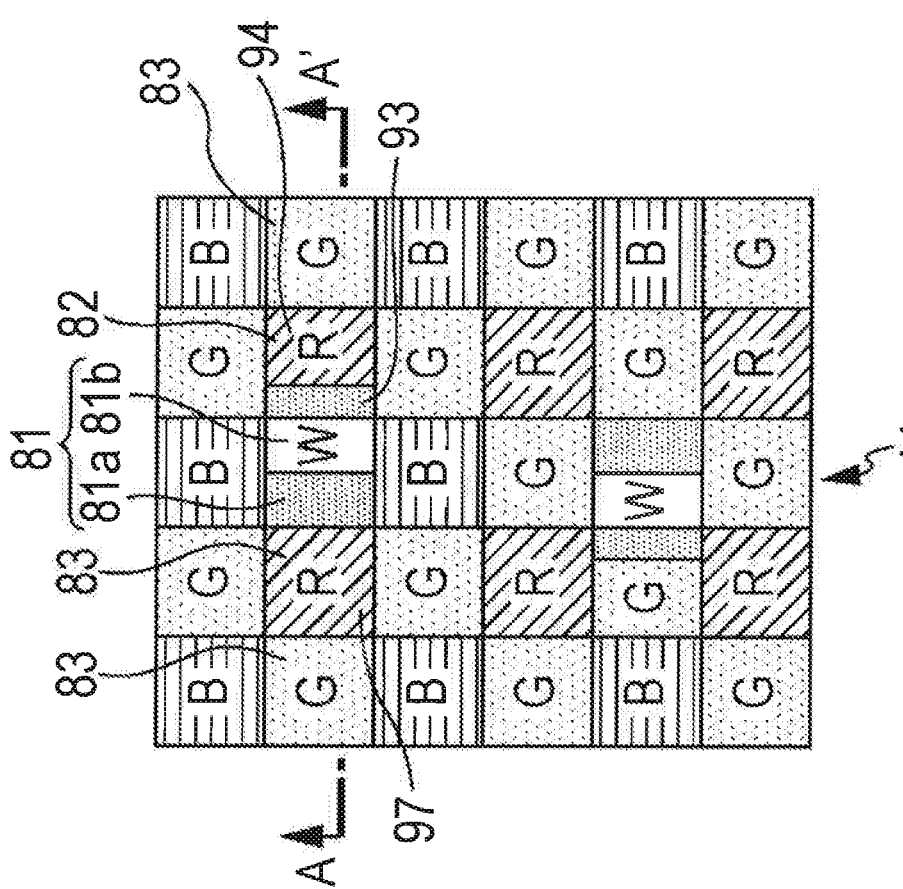
FIG. 11A is a diagram showing an illustrative fifth structure example of a pixel array unit.
Figure 11B:
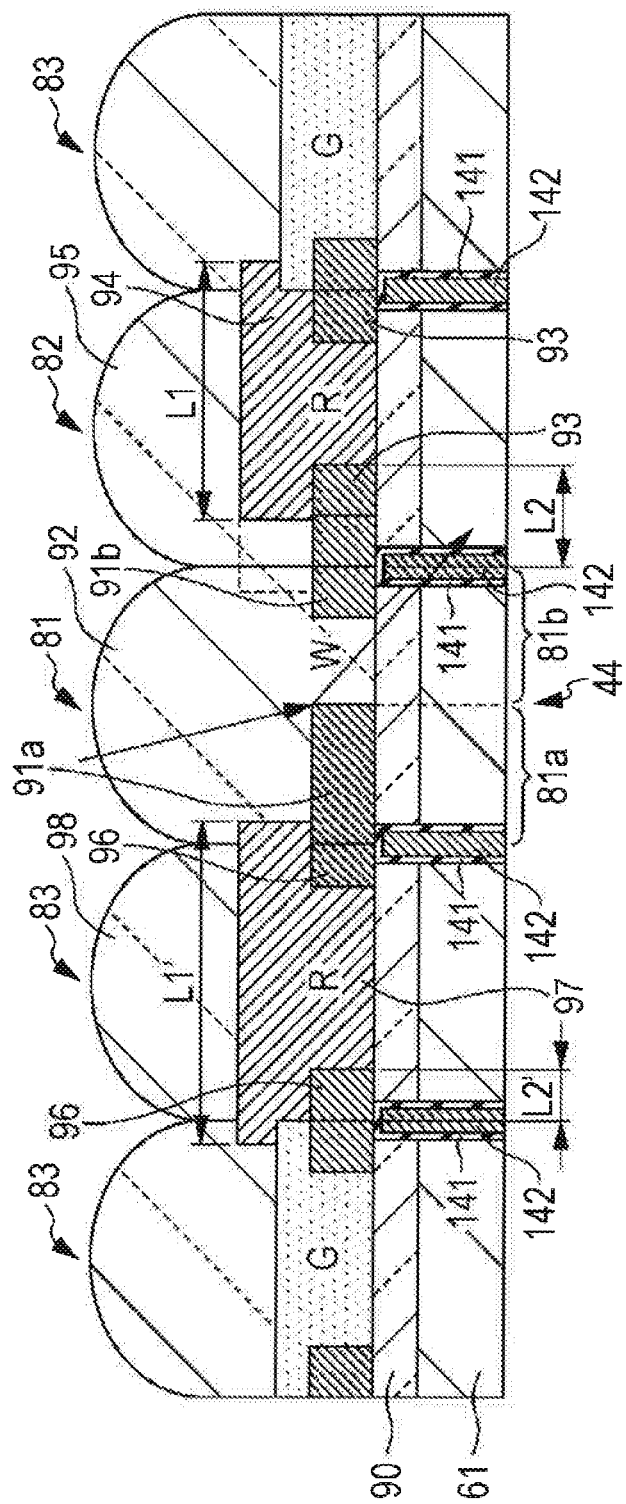
FIG. 11B is an illustrative diagram showing the fifth structure example of the pixel array unit.

FIGS. 11A and 11B are illustrative diagrams showing the fifth structure example of the pixel array unit 44.

Of the components shown in FIGS. 11A and 11B, components which are the same as those in FIGS. 3A and 3B are given the same reference numerals. Redundant description will be omitted as appropriate.

The configuration of the pixel array unit 44 of FIGS. 11A and 11B differs from the configuration of FIGS. 3A and 3B in that an insulating film 141 and a light shielding film 142 are provided below the light shielding film 96 (91*a*, 91*b*, and 93).

The insulating film 141 is provided to cover the light shielding film 142. The light shielding film 142 is provided below the light shielding film 96 (91*a*, 91*b*, and 93) of the boundary of the pixels 51 to penetrate the transparent film 90 and the photodiode 61. Therefore, the light shielding film 142 and the light shielding film 96 (91*a*, 91*b*, and 93) are connected to one another via the insulating film 141.

Figure 12A:
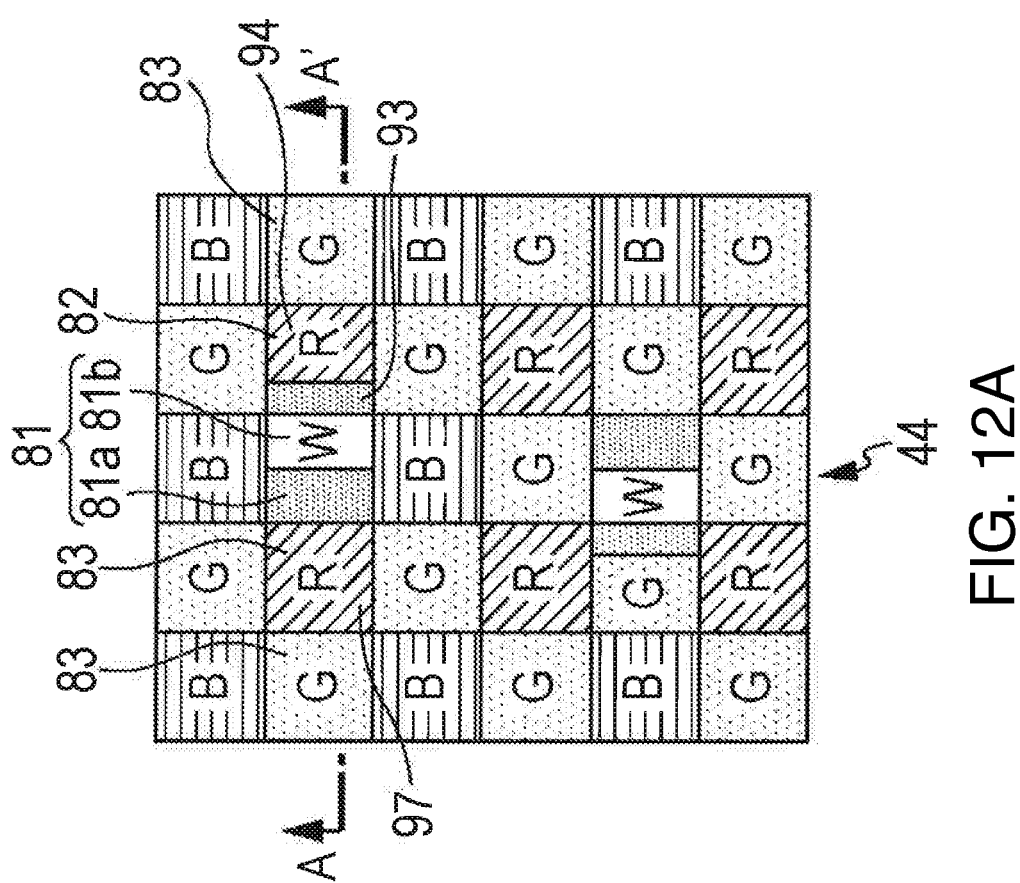
FIG. 12A is an illustrative diagram showing another example of the fifth structure example of a pixel array unit.
Figure 12B:
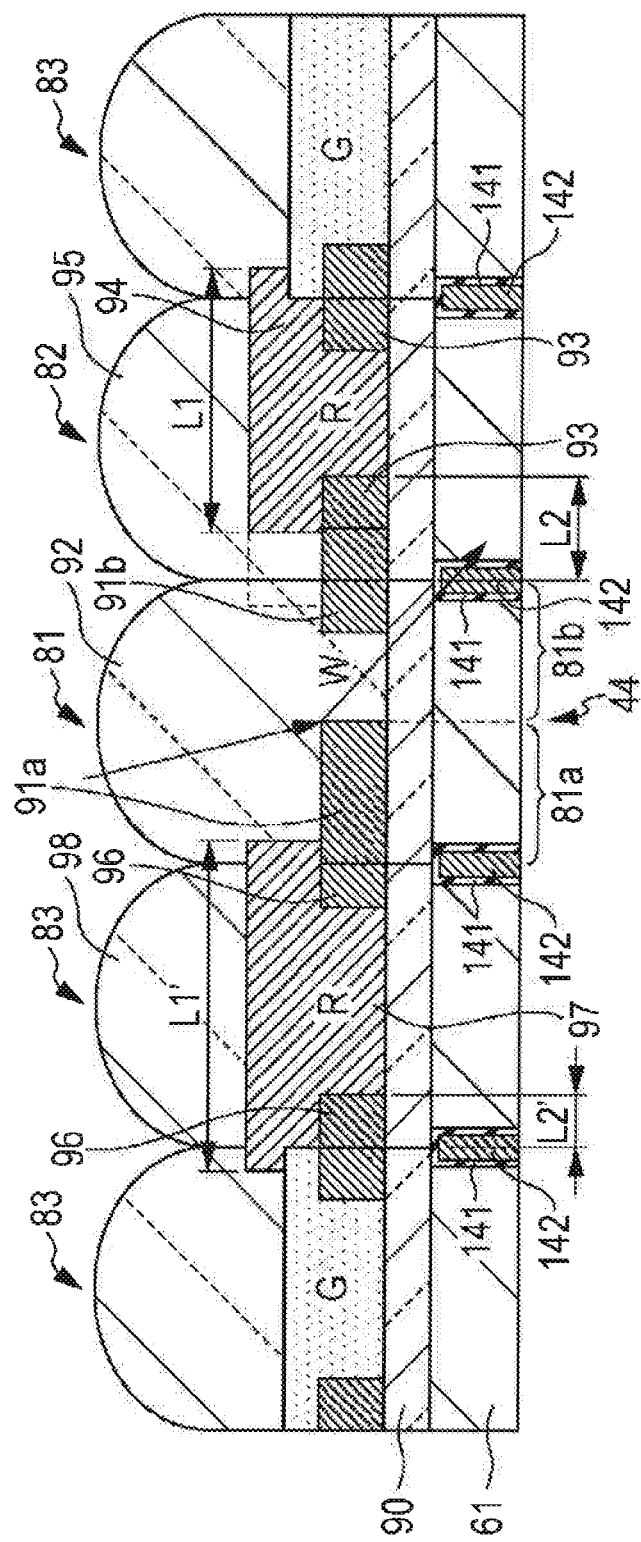
FIG. 12B is an illustrative diagram showing another example of the fifth structure example of the pixel array unit.

As illustratively shown in FIGS. 12A and 12B, the light shielding film 142 may be provided to penetrate only the photodiode 61, and the light shielding film 142 and the light shielding film 96 (91*a*, 91*b*, and 93) may be divided. The light shielding film 142 may not be provided.

(Sixth Illustrative Structure Example of Pixel Array Unit)

Figure 13A:
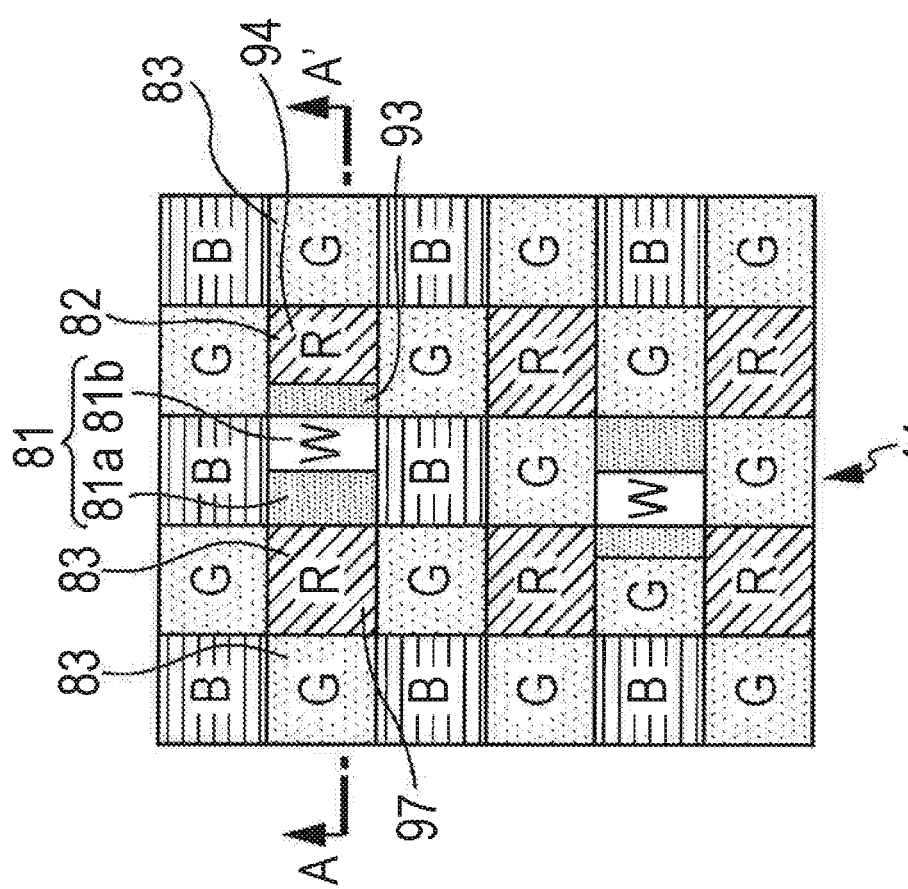
FIG. 13A is a diagram showing an illustrative sixth structure example of a pixel array unit.
Figure 13B:
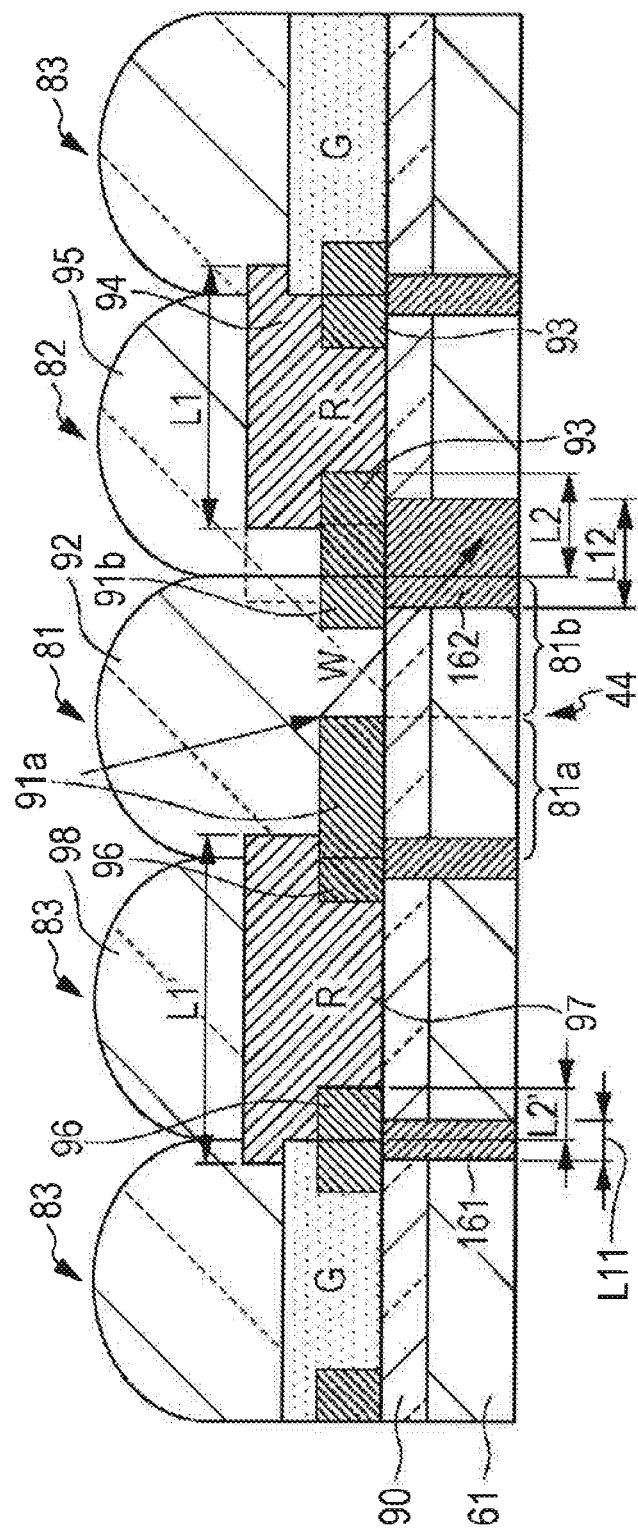
FIG. 13B is an illustrative diagram showing the sixth structure example of the pixel array unit.

FIGS. 13A and 13B are illustrative diagrams showing the sixth structure example of the pixel array unit 44.

Of the components shown in FIGS. 13A and 13B, components which are the same as those in FIGS. 3A and 3B are given the same reference numerals. Redundant description will be omitted as appropriate.

The configuration of the pixel array unit 44 of FIGS. 13A and 13B differs from the configuration of FIGS. 3A and 3B in that a light shielding film 161 or 162 is provided below the light shielding film 96 (91*a*, 91*b*, and 93).

The light shielding film 161 is provided on the boundary between the second imaging pixels 83, and on the boundary between the second imaging pixel 83 and the phase difference detection pixel 81 to penetrate the transparent film 90 and the photodiode 61. Meanwhile, the light shielding film 162 is provided on the boundary between the phase difference detection pixel 81 and the first imaging pixel 82 to penetrate the transparent film 90 and the photodiode 61.

A width L12 in the horizontal direction of the light shielding film 162 is large in comparison to a width L11 in the horizontal direction of the light shielding film 161. Specifically, in the example of FIGS. 13A and 13B, the width in the horizontal direction of the light shielding film 162 below the light shielding film 91*b* is the same as the width in the horizontal direction of the light shielding film 161 below the light shielding film 96 (91*a* and 93); however, the width in the horizontal direction of the light shielding film 162 below the light shielding film 93 is greater than the width in the horizontal direction of the light shielding film 161 below the light shielding film 96 (91*a* and 93).

Figure 14A:
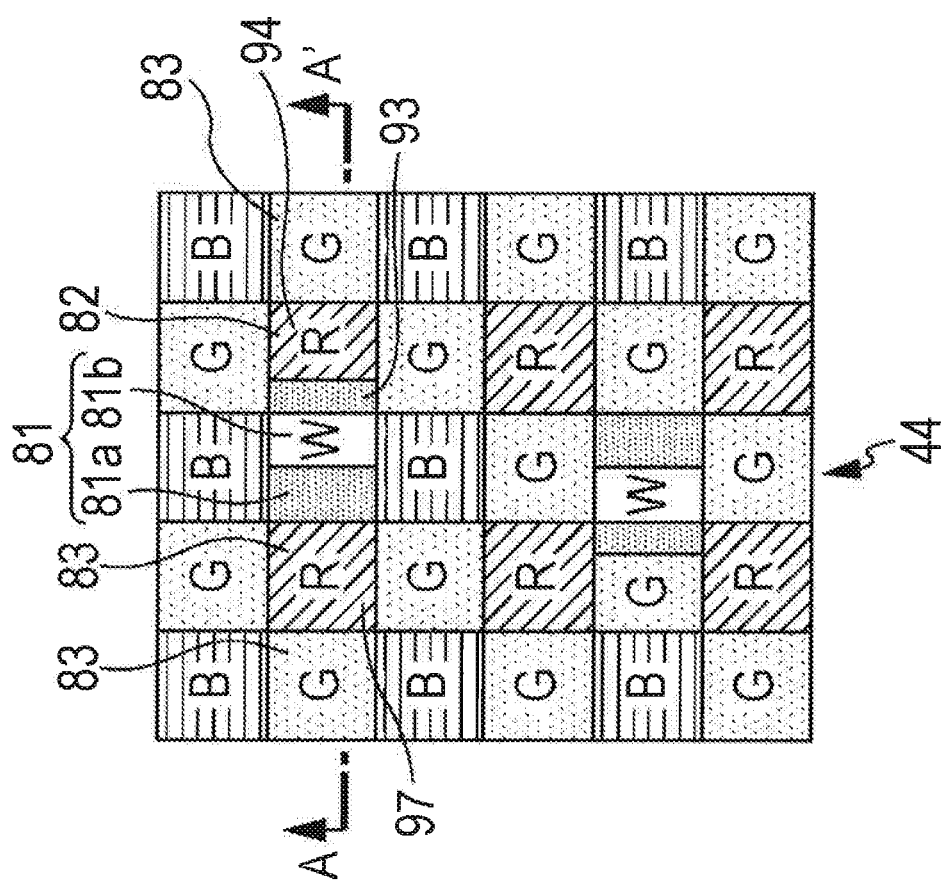
FIG. 14A is an illustrative diagram showing another example of the sixth structure example of a pixel array unit.
Figure 14B:
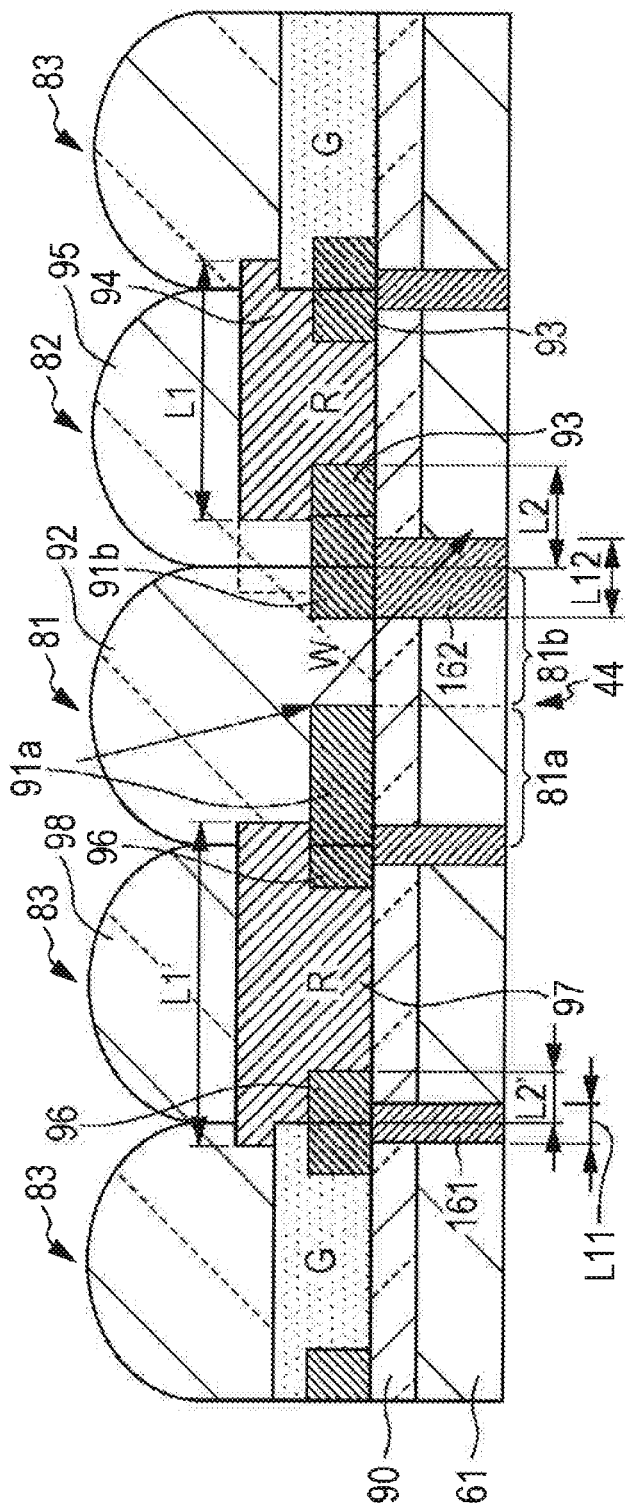
FIG. 14B is an illustrative diagram showing another example of the sixth structure example of a pixel array unit.

As shown illustratively in FIGS. 14A and 14B, the width in the horizontal direction of the light shielding film 162 below the light shielding film 93 is the same as the width in the horizontal direction of the light shielding film 161 below the light shielding film 96 (91*a* and 93); however, the width in the horizontal direction of the light shielding film 162 below the light shielding film 91*b* is greater than the width in the horizontal direction of the light shielding film 161 below the light shielding film 96 (91*a* and 93); thus, the width L12 in the horizontal direction of the light shielding film 162 may be greater than the width L11 in the horizontal direction of the light shielding film 161. The light shielding film 161 (162) may be covered by an insulating film.

In the description given above, a case in which the array of the pixels 51 of the pixel array unit 44 is a Bayer array; however, the array of the pixels 51 of the pixel array unit 44 is not limited to the Bayer array. For example, the array of the pixels 51 of the pixel array unit 44 may be an array in which the same color is allocated to every 2×2 pixels 51 (hereinafter referred to as a 2×2 pixel array).

(Seventh Illustrative Structure Example of Pixel Array Unit)

Figure 15A:
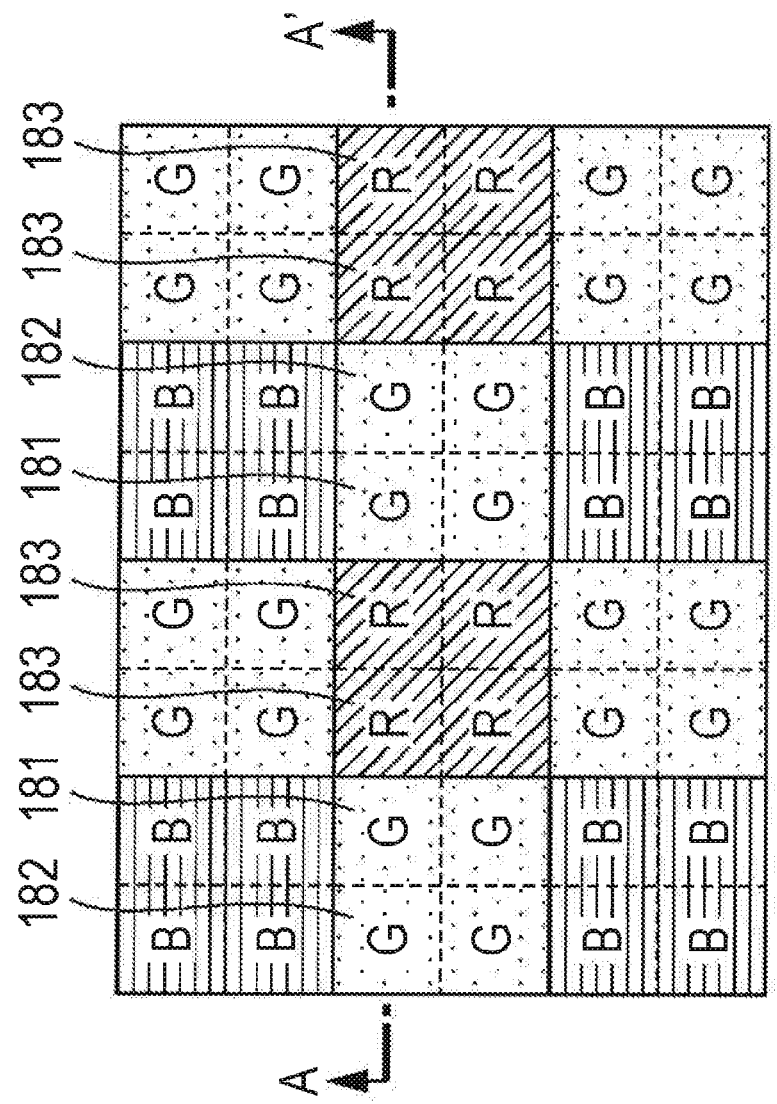
FIG. 15A is an illustrative diagram showing the first structure example of the pixel array unit when a 2×2 pixel array is used.
Figure 15B:
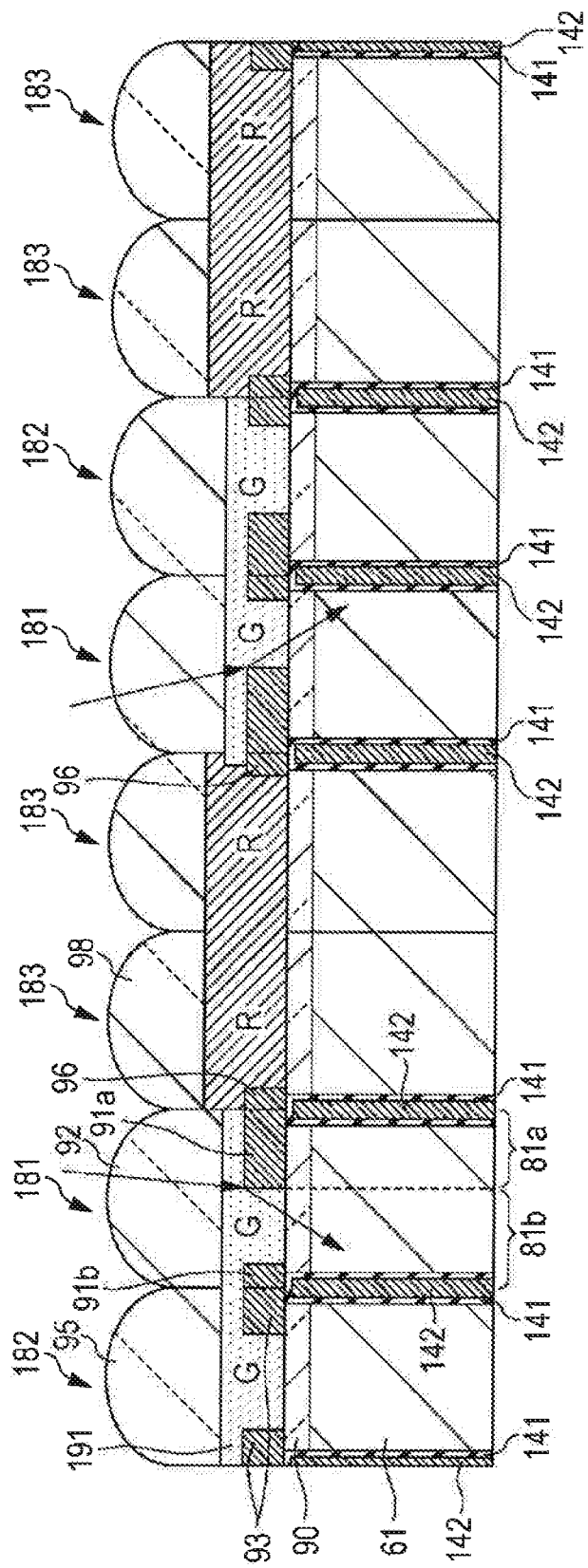
FIG. 15B is an illustrative diagram showing the first structure example of the pixel array unit when the 2×2 pixel array is used.

FIGS. 15A and 15B are illustrative diagrams showing the first structure example of the pixel array unit 44 when the array of the pixels 51 is a 2×2 pixel array.

Of the components shown in FIGS. 15A and 15B, components which are the same as those in FIGS. 3A, 3B, 11A and 11B are given the same reference numerals. Redundant description will be omitted as appropriate.

As shown in FIG. 15A, when the array of the pixels 51 is a 2×2 pixel array, for example, one of the pixels 51 of the 2×2 green pixels 51 is replaced with a phase difference detection pixel 181 which is used for both phase difference detection and imaging. The green pixel which is adjacent to the phase difference detection pixel 181 is set to the first imaging pixel 182. In the example of FIGS. 15A and 15B, of the green pixels 51, the pixels 51 other than the phase difference detection pixel 181 and the first imaging pixel 182, and the red and the blue pixels 51 are set to second imaging pixels 183.

The configurations of the phase difference detection pixel 181, the first imaging pixel 182, and the second imaging pixel 183 are the same as the respective configurations of the phase difference detection pixel 81, the first imaging pixel 82, and the second imaging pixel 83 of FIGS. 11A and 11B except in that a color filter 191 is shared between the adjacent pixels 51 of the same color, and except in that the insulating film 141, the light shielding film 142, and the light shielding film 96 are not provided at the boundaries of the second imaging pixels 183.

Therefore, the area of the light shielding film 93 of the first imaging pixel 182 is greater than the area of the light shielding film 96 of the second imaging pixel 183. Accordingly, it is possible to suppress the color mixing between the phase difference detection pixel 181 and the first imaging pixel 182, and to improve the signal-to-noise ratio. As a result, it is possible to suppress a reduction in the sensitivity of the solid state imaging device.

Since the light shielding film 142 is provided at the boundary between the phase difference detection pixel 181 and the first imaging pixel 182, the light which corresponds to the first imaging pixel 182 is received in the phase difference detection pixel 181, and it is possible to suppress the occurrence of the color mixing.

Figure 16A:
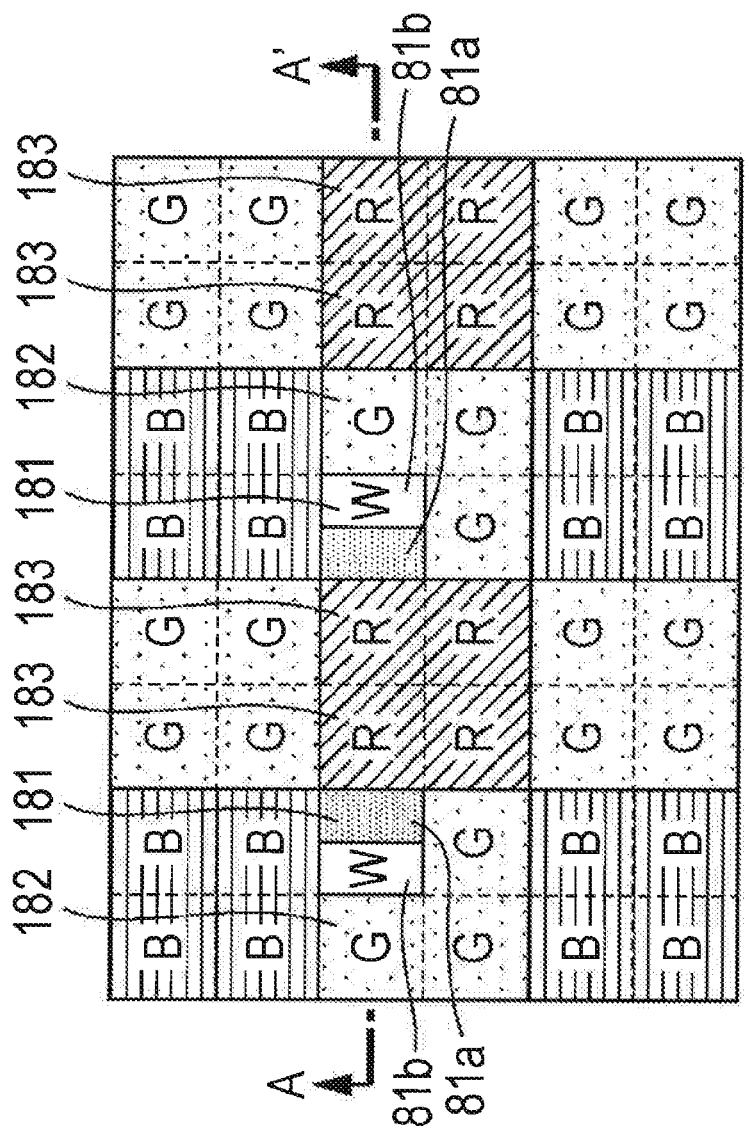
FIG. 16A is an illustrative diagram showing the second structure example of the pixel array unit when a 2×2 pixel array is used.
Figure 16B:
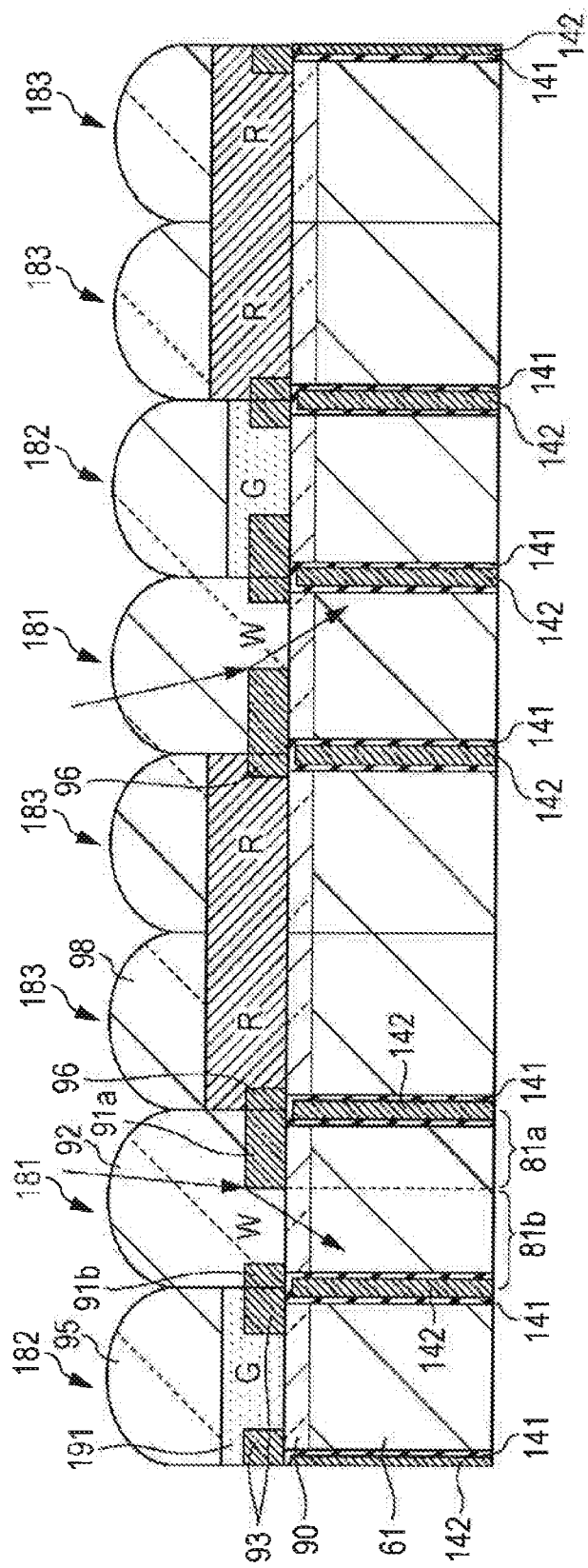
FIG. 16B is an illustrative diagram showing the second structure example of the pixel array unit when a 2×2 pixel array is used.

In the example of FIGS. 15A and 15B, the phase difference detection pixel 181 was used for both the phase difference detection and the imaging; however, as shown illustratively in FIGS. 16A and 16B, the phase difference detection pixel 181 may be used in only the phase difference detection. In this case, the phase difference detection pixel 181 is not provided with the color filter 191. In other words, the phase difference detection pixel 181 images white light.

Figure 17A:
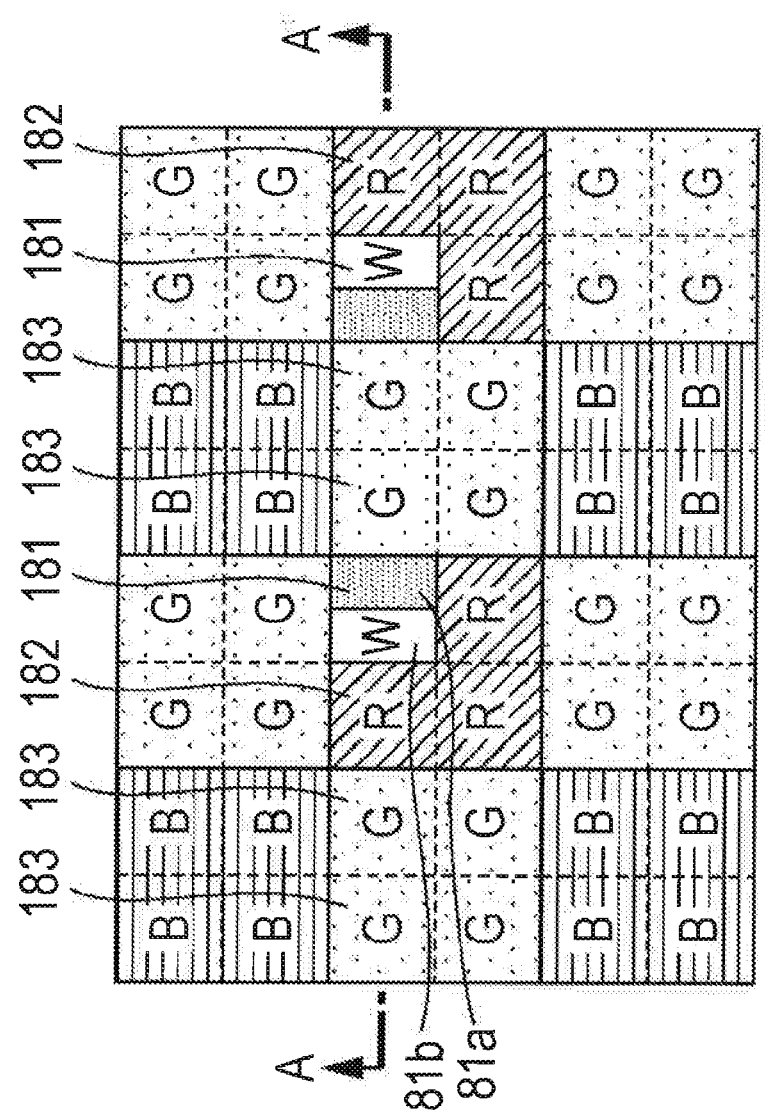
FIG. 17A is an illustrative diagram showing the third structure example of the pixel array unit when a 2×2 pixel array is used.
Figure 17B:
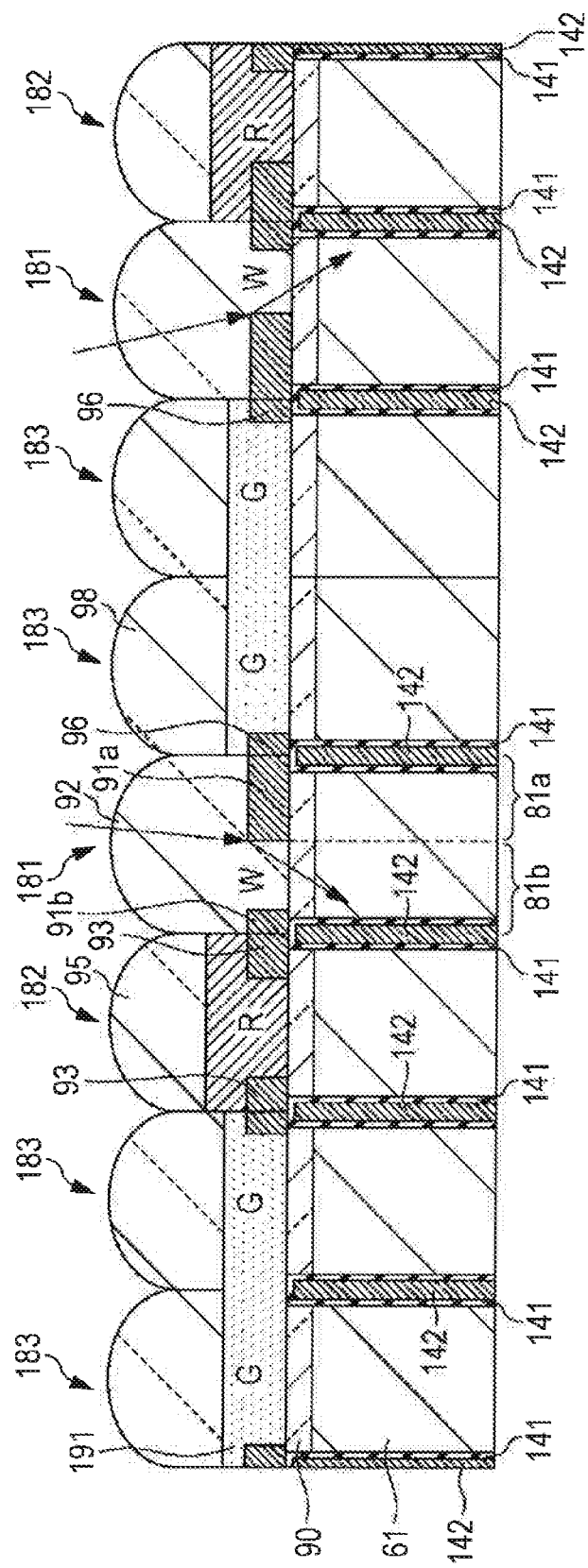
FIG. 17B is an illustrative diagram showing the third structure example of the pixel array unit when the 2×2 pixel array is used.

In the example of FIGS. 16A and 16B, the green pixels 51 were set to the phase difference detection pixels 181; however, as shown illustratively in FIGS. 17A and 17B, the red pixels 51 may be set to the phase difference detection pixels 181. In this case, the red pixel 51 which is adjacent to the phase difference detection pixel 181 is set to the first imaging pixel 182. Similarly, in the example of FIGS. 15A and 15B, the red pixels 51 may be set to the phase difference detection pixels 181.

Figure 18A:
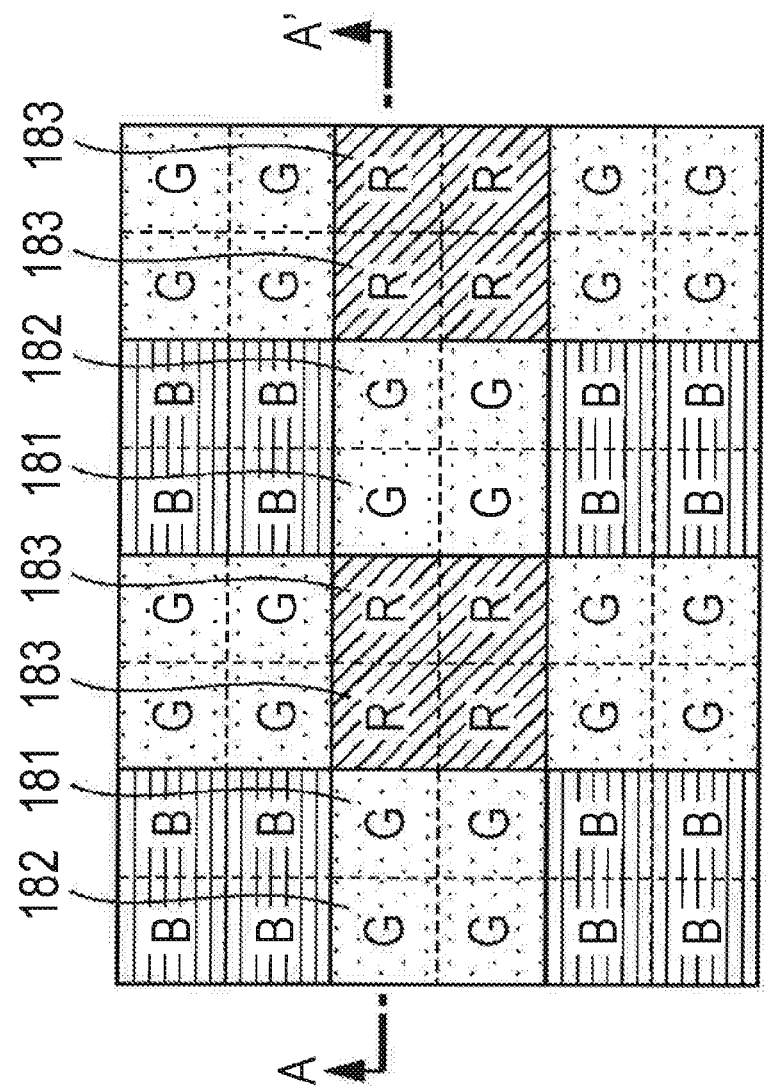
FIG. 18A is an illustrative diagram showing the fourth structure example of the pixel array unit when a 2×2 pixel array is used.
Figure 18B:
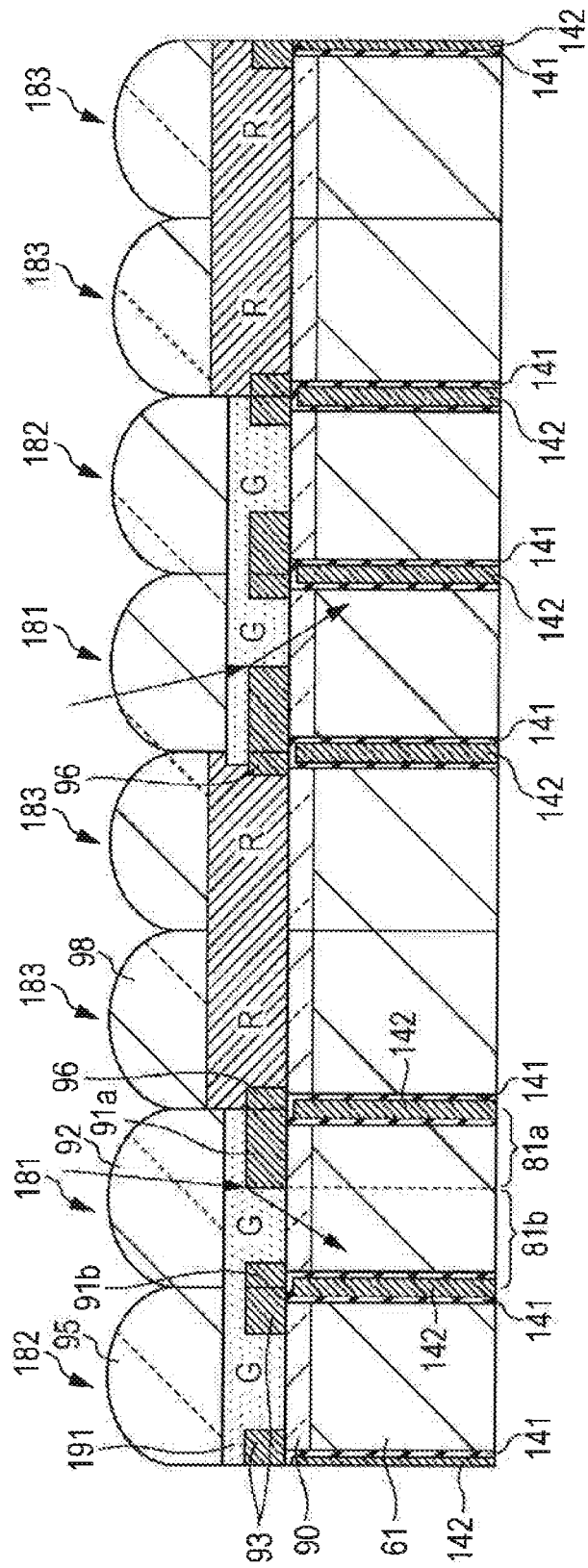
FIG. 18B is an illustrative diagram showing the fourth structure example of the pixel array unit when the 2×2 pixel array is used.

As shown illustratively in FIGS. 18A and 18B, two of the pixels 51 which are lined up in the vertical direction of the 2×2 green pixels 51 may be replaced with the phase difference detection pixel 181 which is used for both phase difference detection and imaging. In this case, the remaining two green pixels 51 are set to the first imaging pixels 182.
(Example of Illustrative Electrical Wiring Between Pixels)

FIGS. 19A to 19E are illustrative diagrams showing an example of the electrical wiring between the pixels 51 when the array of the pixels 51 is a 2×2 pixel array.

In FIGS. 19A to 19E, description is given of the green pixels 51; however, the same applies to the red and the blue pixels 51.

Figure 19A:
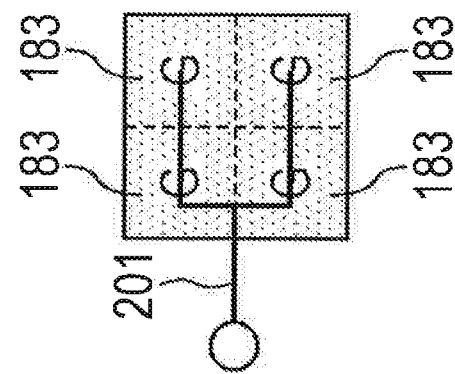
FIG. 19A is an illustrative diagram showing an example of electrical wiring between the pixels when a 2×2 pixel array is used.

As shown in FIG. 19A, when the 2×2 green pixels 51 are the second imaging pixels 183, the second imaging pixels 183 are connected to one another electrical wiring 201.

Figure 19B:
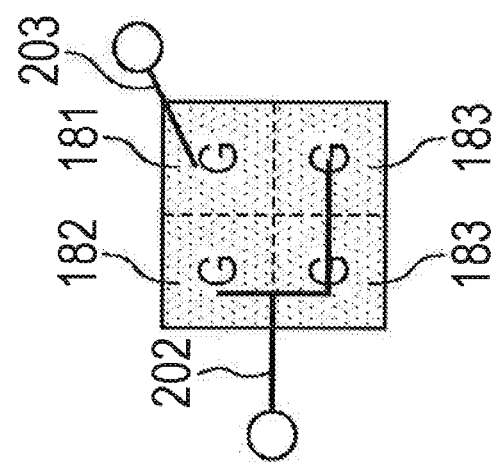
FIG. 19B is an illustrative diagram showing an example of electrical wiring between the pixels when the 2×2 pixel array is used.
Figure 19C:
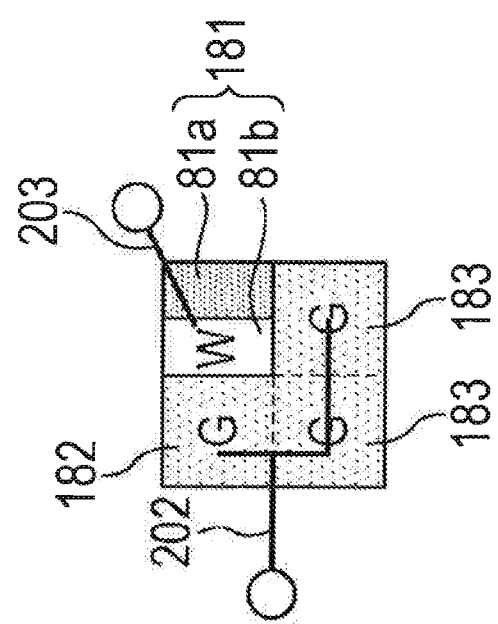
FIG. 19C is an illustrative diagram showing an example of electrical wiring between the pixels when the 2×2 pixel array is used.

Meanwhile, when the structure of the pixel array unit 44 is the structure of FIGS. 15A to 16B, as shown in FIGS. 19B and 19C, the first imaging pixel 182 and the second imaging pixels 183 are connected to one another by electrical wiring 202; however, the phase difference detection pixel 181 is independently provided with electrical wiring 203.

Figures 19D, 19E:
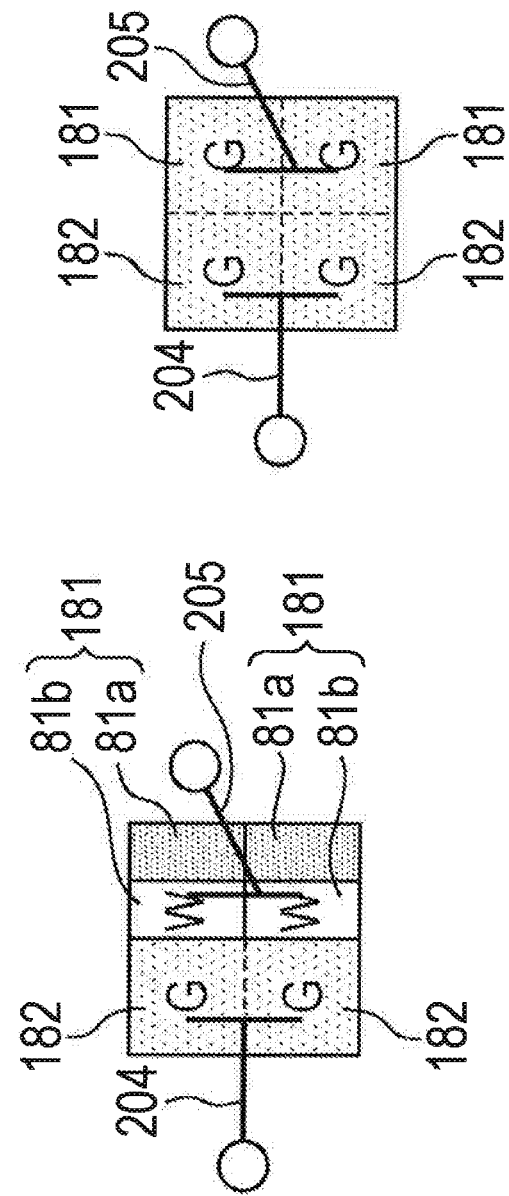
FIG. 19D is an illustrative diagram showing an example of electrical wiring between the pixels when the 2×2 pixel array is used.
FIG. 19E is an illustrative diagram showing an example of electrical wiring between the pixels when the 2×2 pixel array is used.

In a case in which the structure of the pixel array unit 44 is the structure of FIGS. 18A and 18B, or a case in which the phase difference detection pixel 181 is used only for phase difference detection in FIGS. 18A and 18B, as shown in FIGS. 19D and 19E, the first imaging pixels 182 and the phase difference detection pixels 181 are connected to one another by the electrical wirings 204 and 205, respectively.

As described above, the electrical wiring is divided between the phase difference detection pixel 181 and components other than the phase difference detection pixel 181.

In the examples of FIGS. 15A to 18B, an on-chip lens was provided for each of the pixels 51; however, the on-chip lenses may be shared between the adjacent pixels 51 of the same color.

Figure 20A:
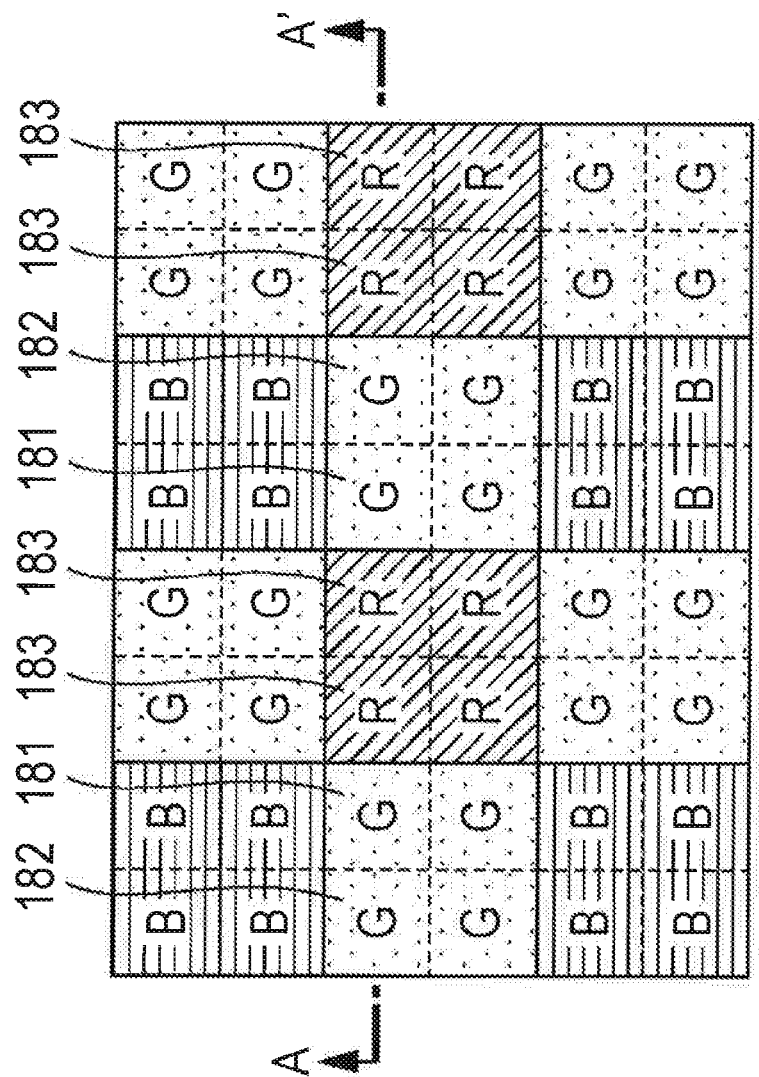
FIG. 20A is an illustrative diagram showing another example of the first structure of the pixel array unit when a 2×2 pixel array is used.
Figure 20B:
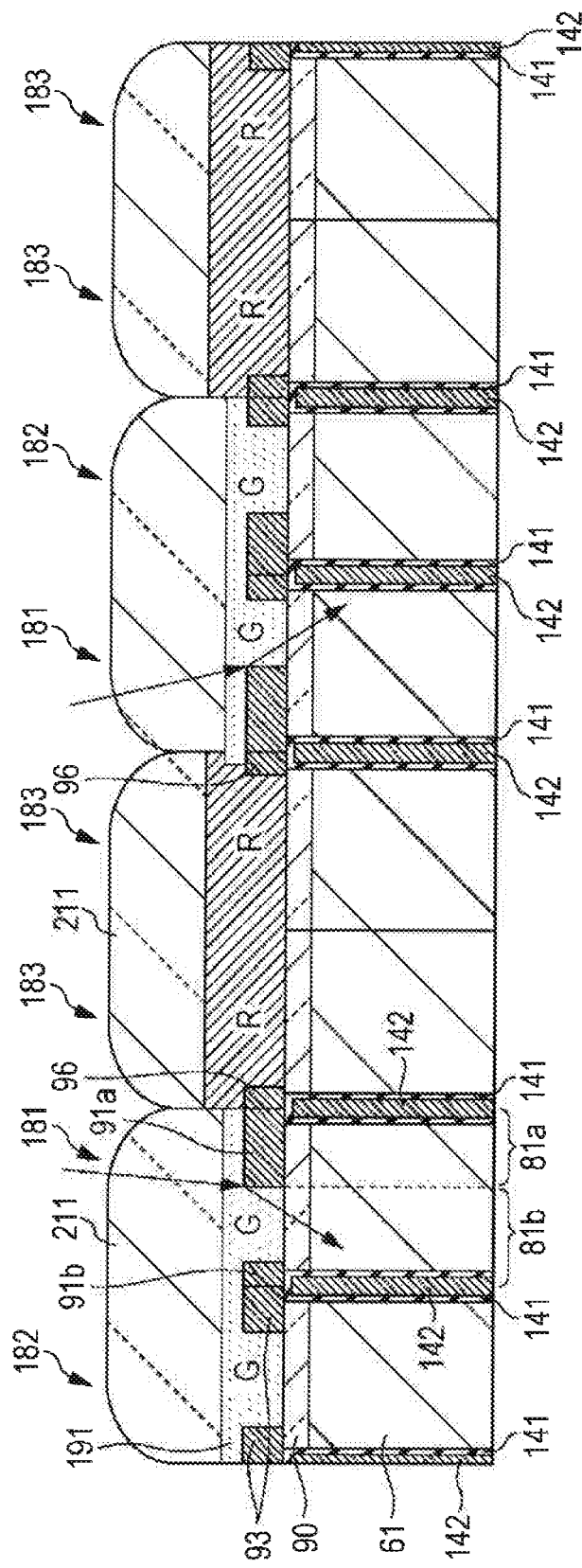
FIG. 20B is an illustrative diagram showing another example of the first structure of the pixel array unit when a 2×2 pixel array is used.

In this case, in the same manner as the case of FIGS. 15A and 15B, when one of the pixels 51 of the 2×2 green pixels 51 is replaced with the phase difference detection pixel 181 which is used for both phase difference detection and imaging, as illustratively shown in FIGS. 20A and 20B, an on-chip lens 211 is shared by the 2×2 pixels 51 of the same color.

Figure 21A:
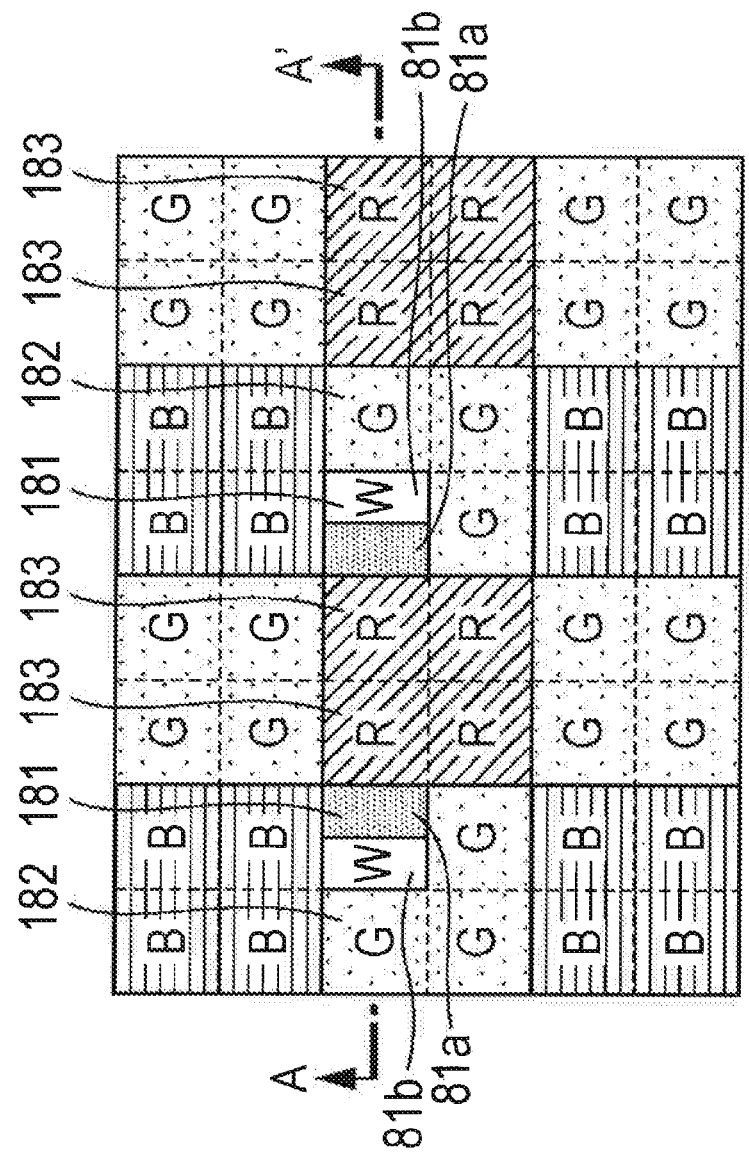
FIG. 21A is an illustrative diagram showing another example of the second structure of the pixel array unit when a 2×2 pixel array is used.
Figure 21B:
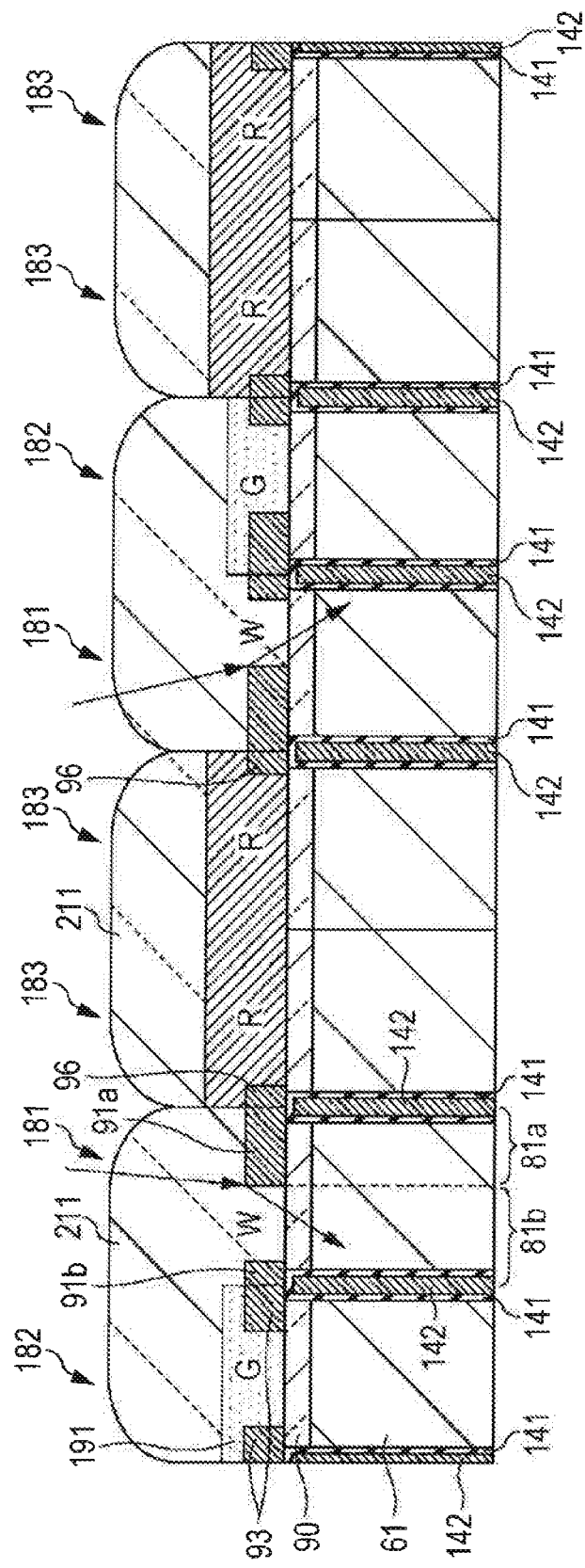
FIG. 21B is an illustrative diagram showing another example of the second structure of the pixel array unit when a 2×2 pixel array is used.

In the same manner as the case of FIGS. 16A and 16B, when the phase difference detection pixel 181 is used only for phase difference detection, for example, as shown illustratively in FIGS. 21A and 21B, the on-chip lens 211 is shared by the 2×2 pixels 51 of the same color or white.

Figure 22A:
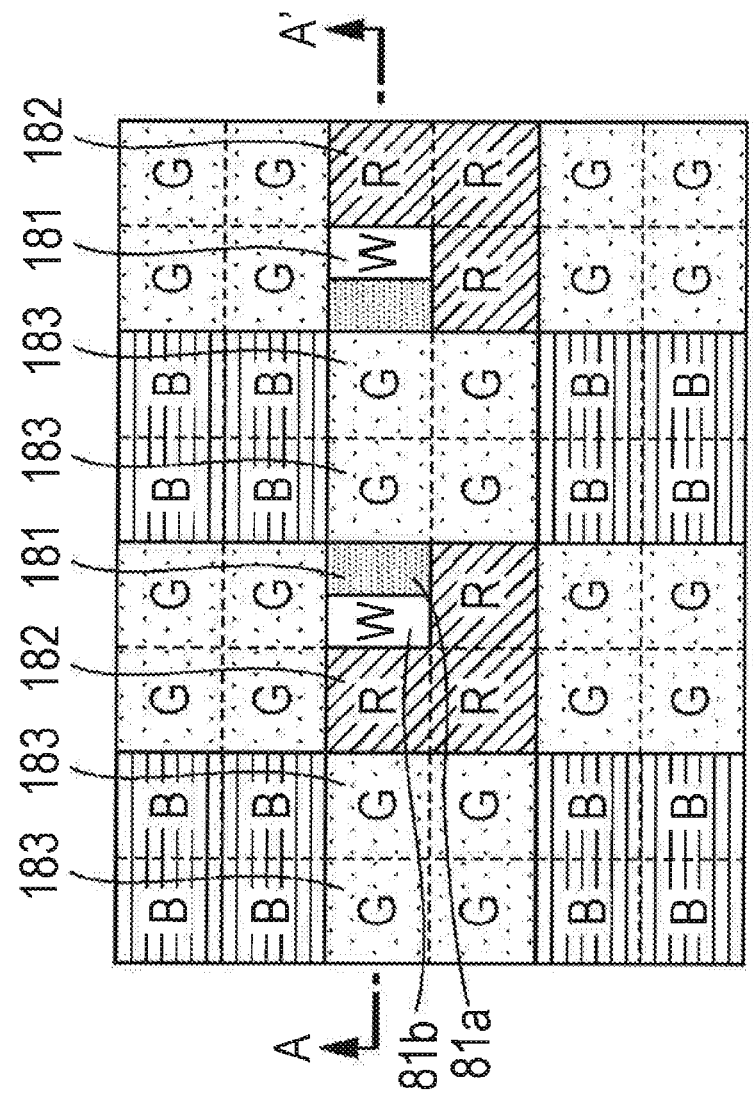
FIG. 22A is an illustrative diagram showing another example of the third structure of the pixel array unit when a 2×2 pixel array is used.
Figure 22B:
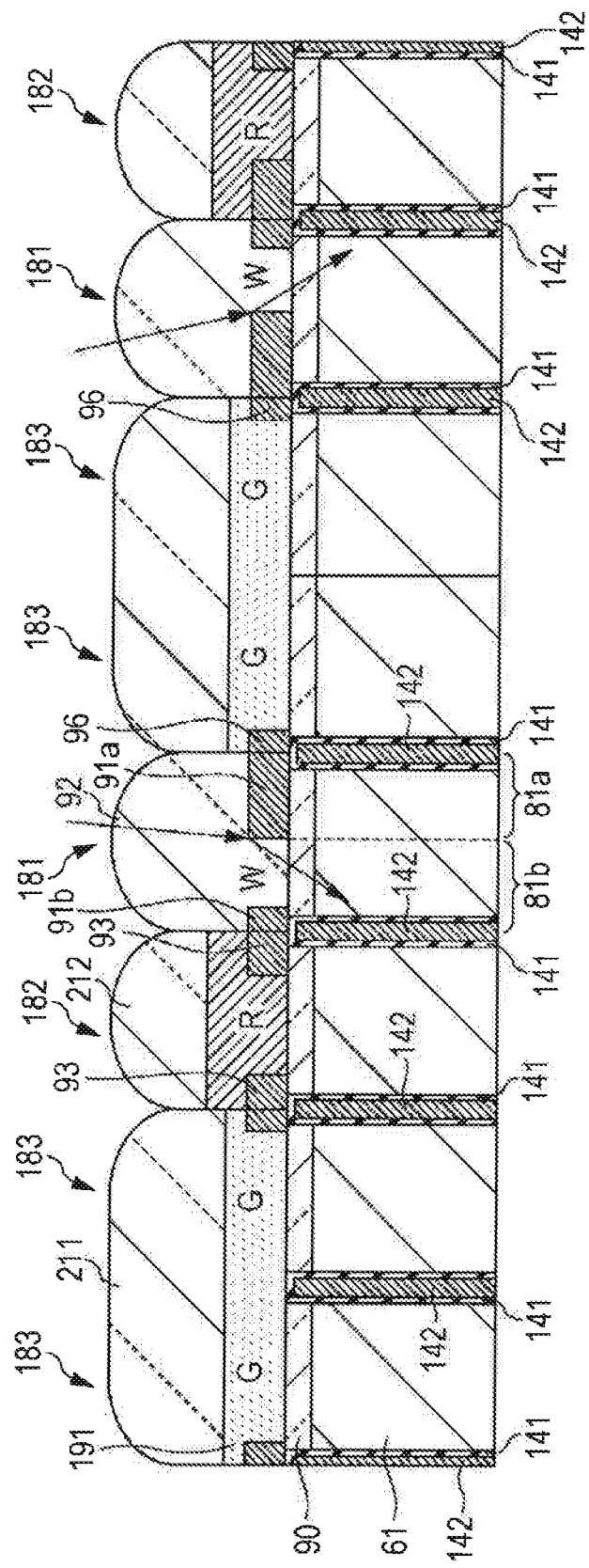
FIG. 22B is an illustrative diagram showing another example of the third structure of the pixel array unit when a 2×2 pixel array is used.

In the same manner as the case of FIGS. 17A and 17B, when the red pixel 51 is set to the phase difference detection pixel 181, for example, as shown illustratively in FIGS. 22A and 22B, the on-chip lens 211 is shared by the 2×2 pixels 51 of the same color. An on-chip lens 212 is shared by three of the red pixels 51 of the 2×2 red or white pixels 51. The phase difference detection pixel 181 includes the on-chip lens 92 individually.

Figure 23A:
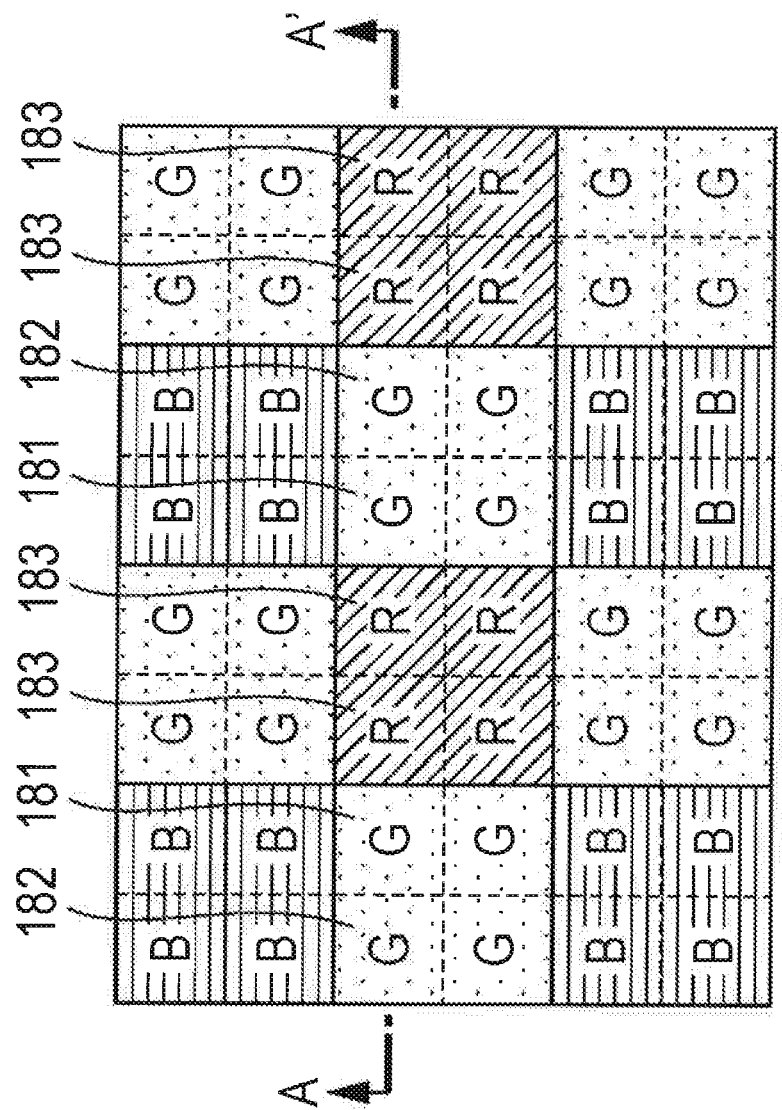
FIG. 23A is an illustrative diagram showing another example of the fourth structure of the pixel array unit when a 2×2 pixel array is used.
Figure 23B:
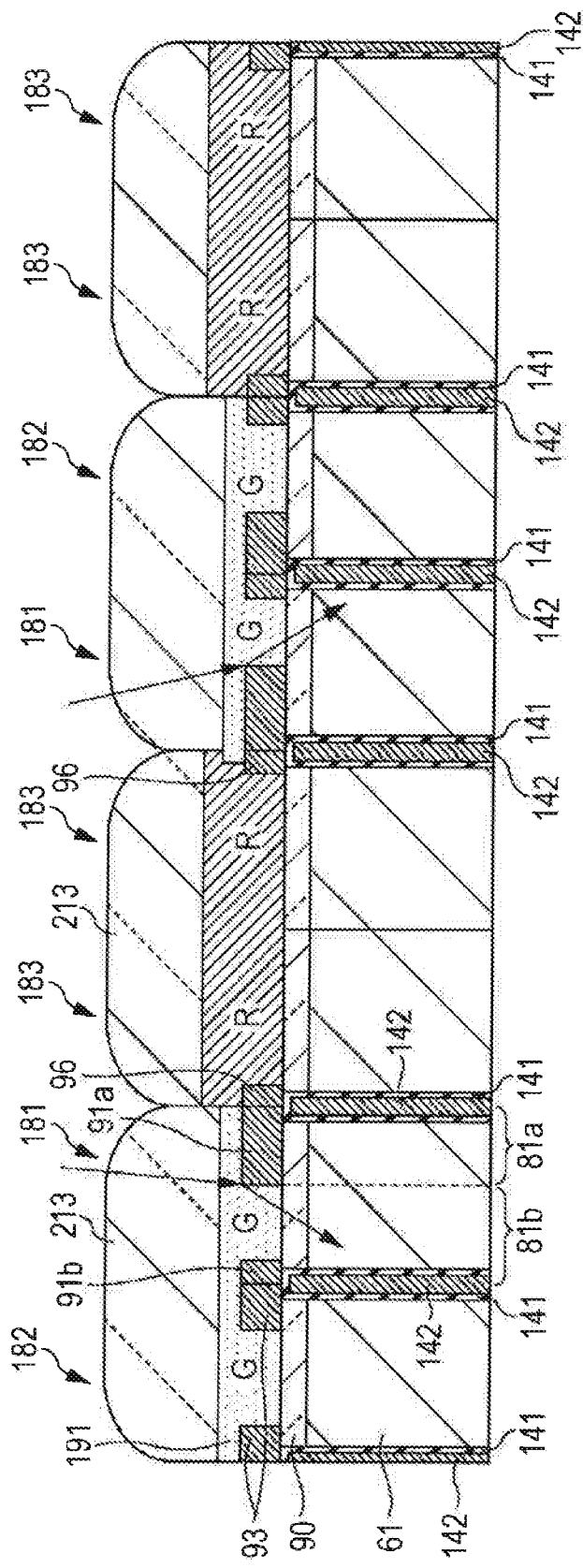
FIG. 23B is an illustrative diagram showing another example of the fourth structure of the pixel array unit when a 2×2 pixel array is used.

In this case, in the same manner as the case of FIGS. 18A and 18B, when two of the pixels 51 which are lined up in the vertical direction of the 2×2 green pixels 51 are replaced with the phase difference detection pixels 181 which are used for both phase difference detection and imaging, for example, as shown illustratively in FIGS. 23A and 23B, an on-chip lens 213 is shared by two of the pixels 51 which are adjacent in the horizontal direction of the 2×2 pixels 51 of the same color.

Figure 24A:
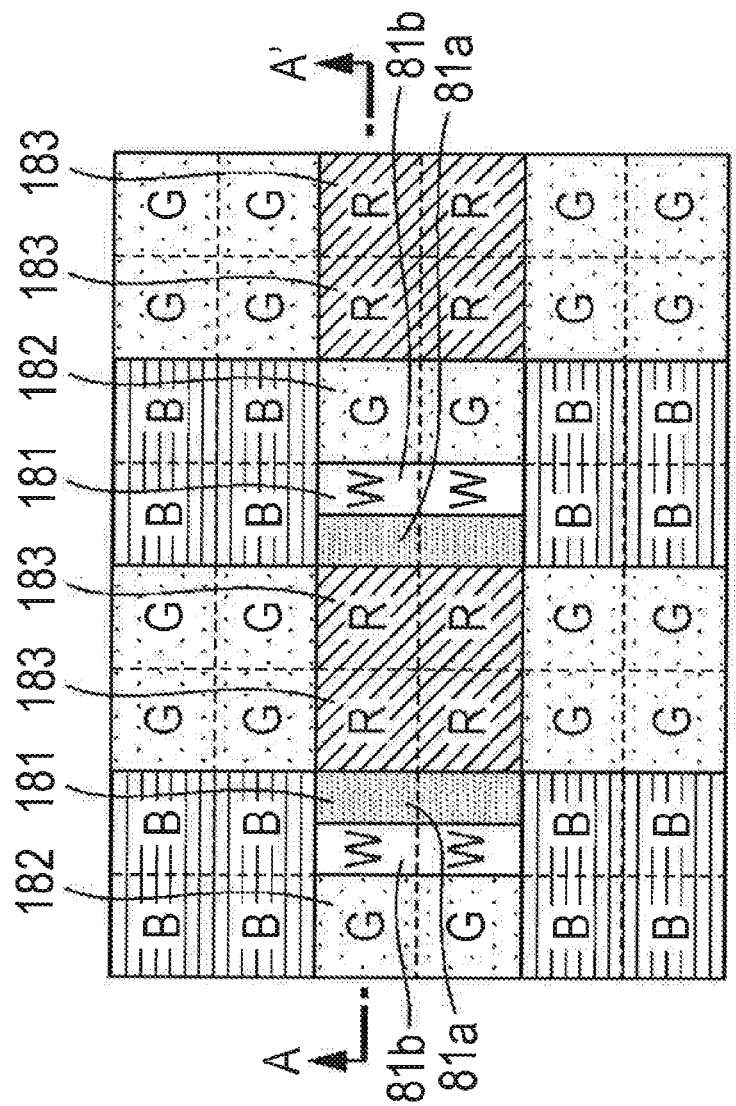
FIG. 24A is an illustrative diagram showing the fifth structure example of the pixel array unit when a 2×2 pixel array is used.
Figure 24B:
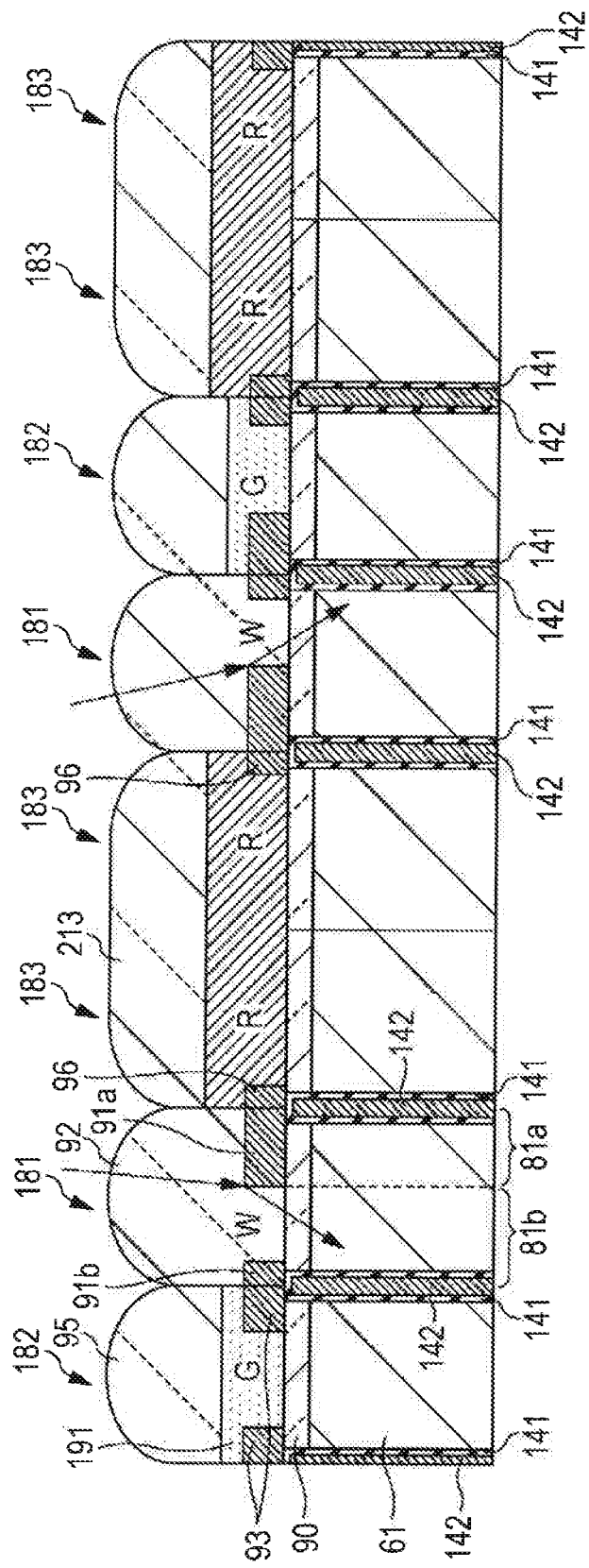
FIG. 24B is an illustrative diagram showing the fifth structure example of the pixel array unit when a 2×2 pixel array is used.

When two of the pixels 51 which are lined up in the vertical direction of the 2×2 green pixels 51 are replaced with the phase difference detection pixels 181 which are used only for phase difference detection, for example, as shown illustratively in FIGS. 24A and 24B, the on-chip lens 213 is shared by two of the second imaging pixels 183 which are adjacent in the horizontal direction of the 2×2 second imaging pixels 183 of the same color. The 2×2 green pixels 51 formed of two of the phase difference detection pixels 181 and two of the first imaging pixels 182 include the on-chip lens 92 (95) individually.

Figure 25A:
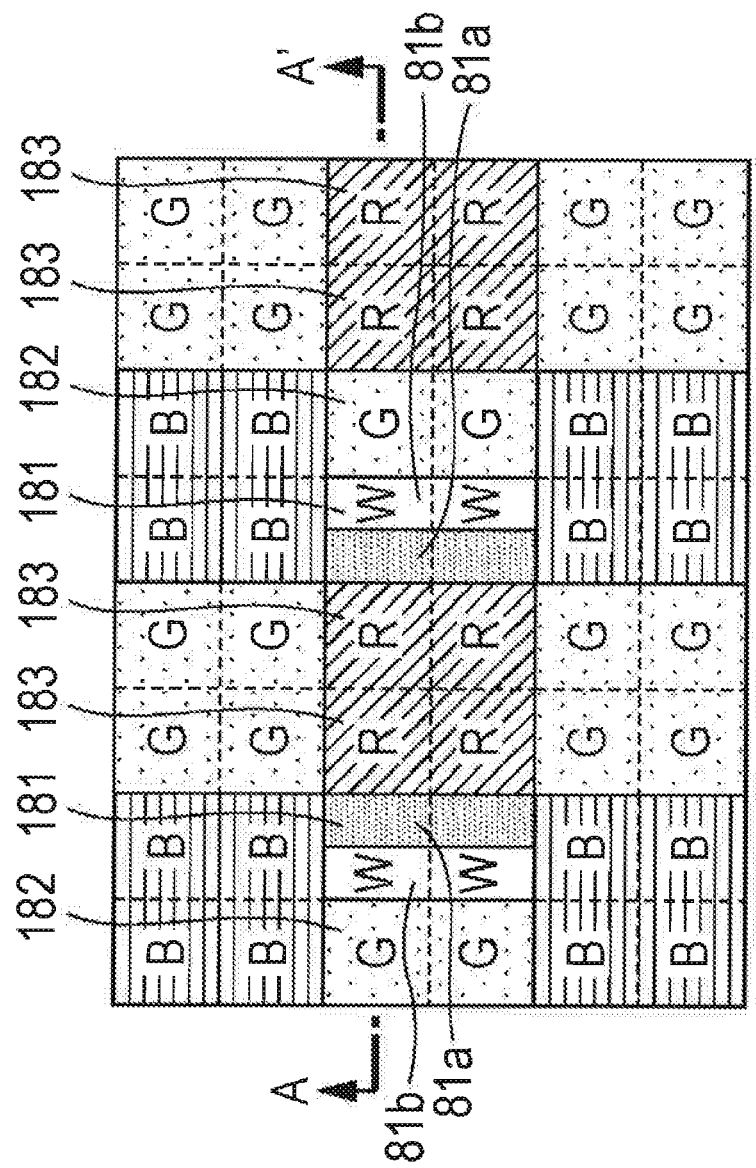
FIG. 25A is an illustrative diagram showing another example of the fifth structure of the pixel array unit when a 2×2 pixel array is used.
Figure 25B:
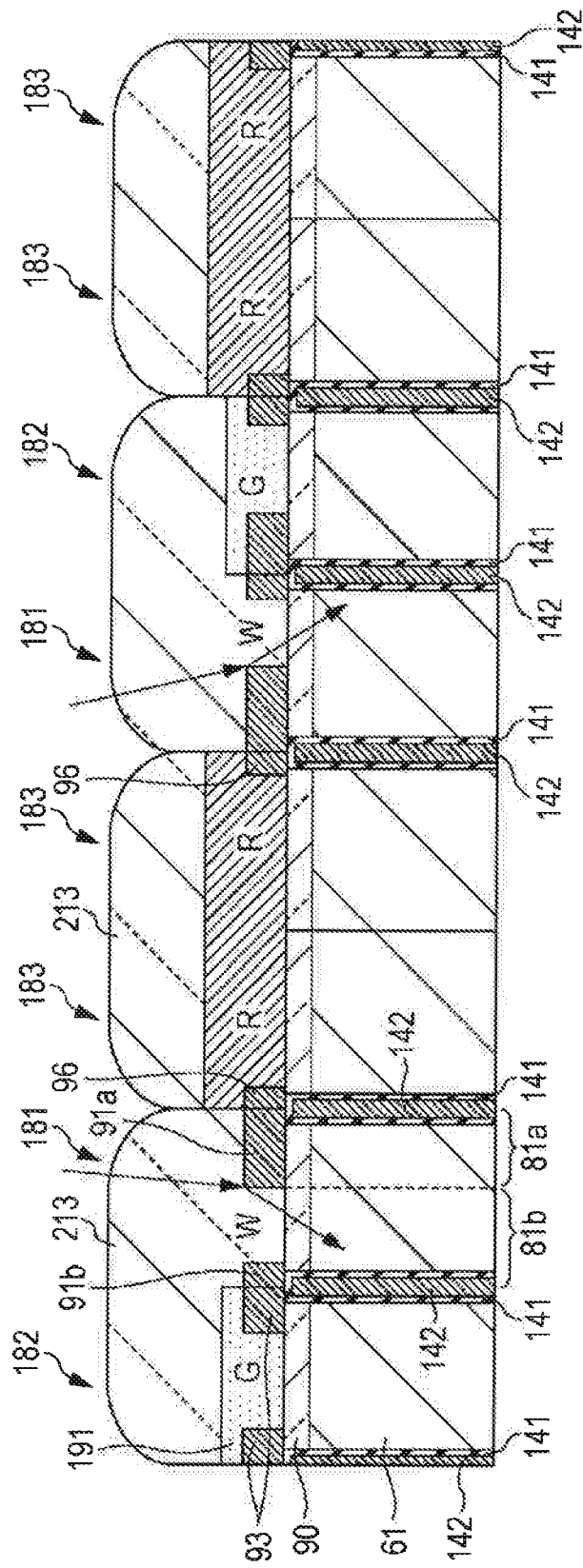
FIG. 25B is an illustrative diagram showing another example of the fifth structure of the pixel array unit when a 2×2 pixel array is used.

In this case, as shown illustratively in FIGS. 25A and 25B, for example, the on-chip lens 213 may be shared by two of the pixels 51 which are adjacent in the horizontal direction of the 2×2 pixels 51 of the same color or white. The sharing of the on-chip lenses described above are examples, and the combination of the pixels 51 which share the on-chip lenses are not limited to the examples described above.

Figure 26A:
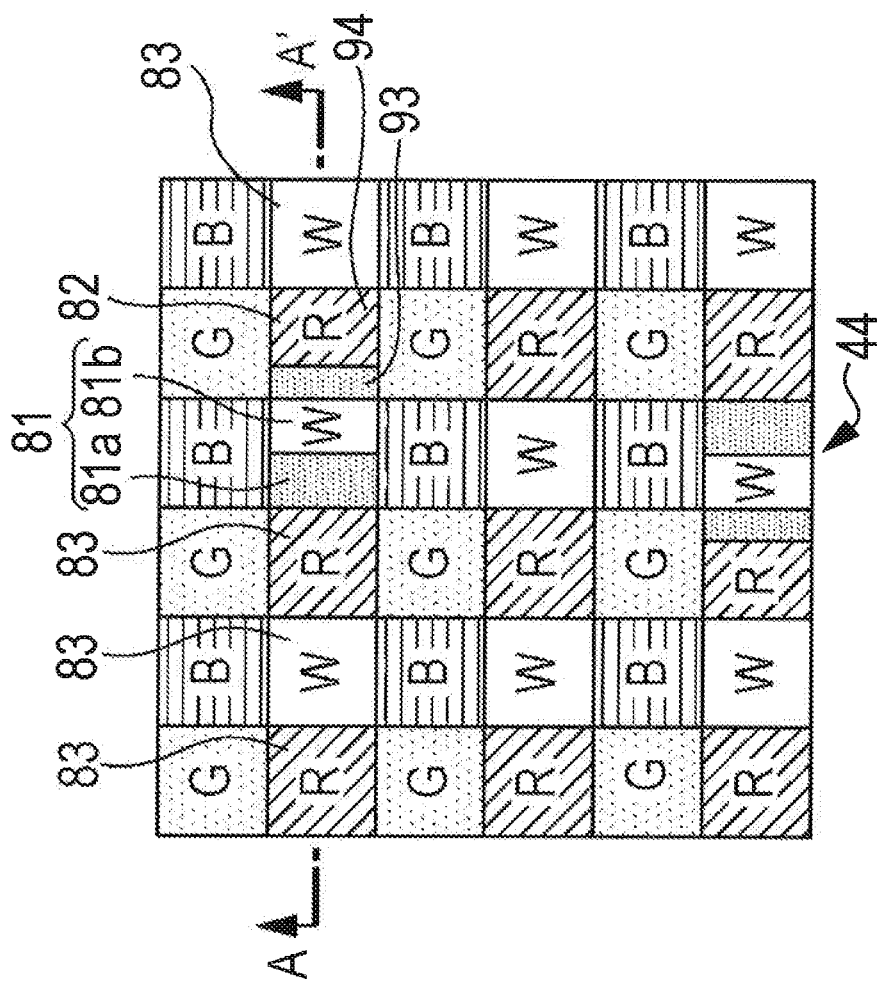
FIG. 26A is an illustrative diagram showing the eighth structure example of a pixel array unit.
Figure 26B:
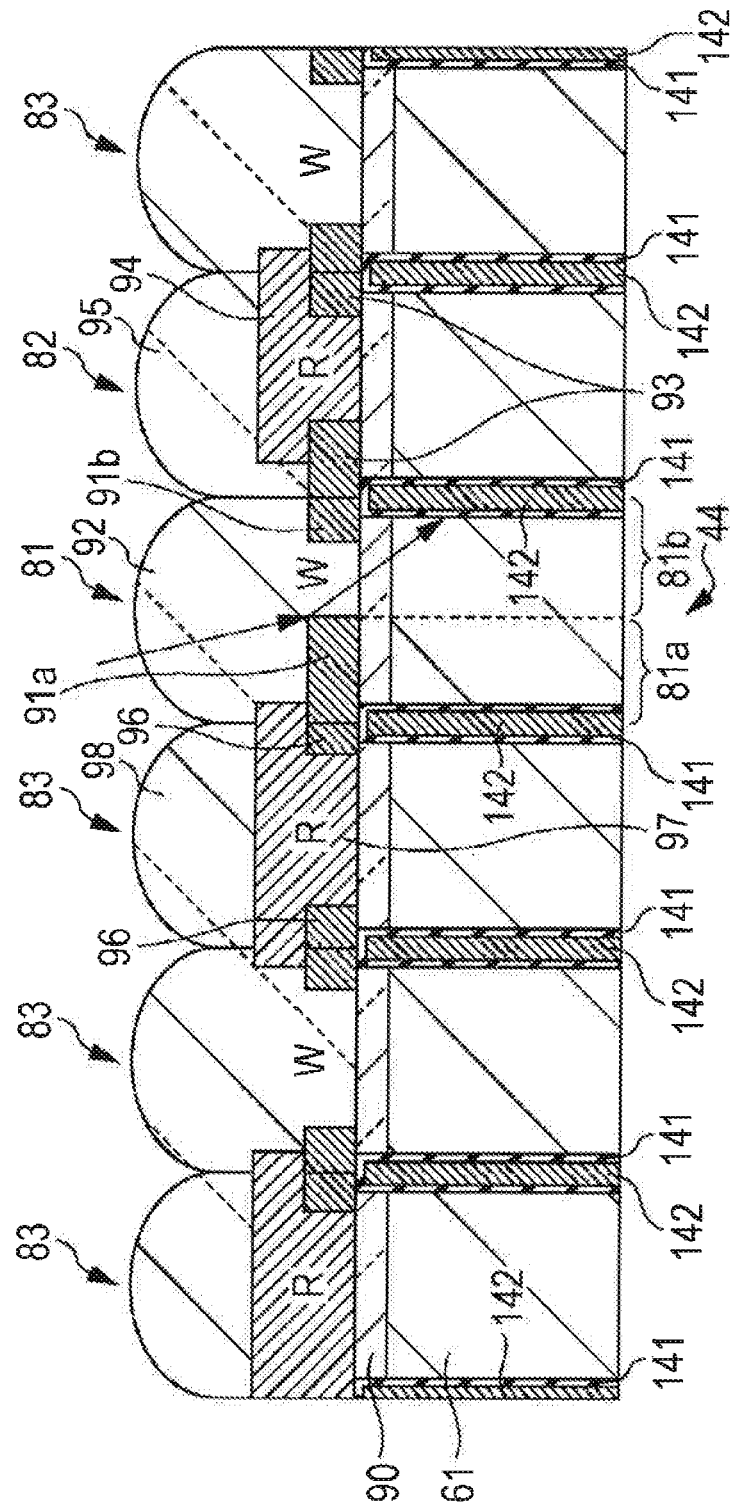
FIG. 26B is an illustrative diagram showing the eighth structure example of a pixel array unit.

As shown illustratively in FIGS. 26A and 26B, the array of the pixels 51 of the pixel array unit 44 may be an array in which the green, the red, the blue, and the white are arranged in a checkered pattern. In this case, the phase difference detection pixel 81 is used for both phase difference detection and imaging. Note that, the light shielding film 142 of FIGS. 15A to 18, 26A and 26B may not be provided.

Figure 27:
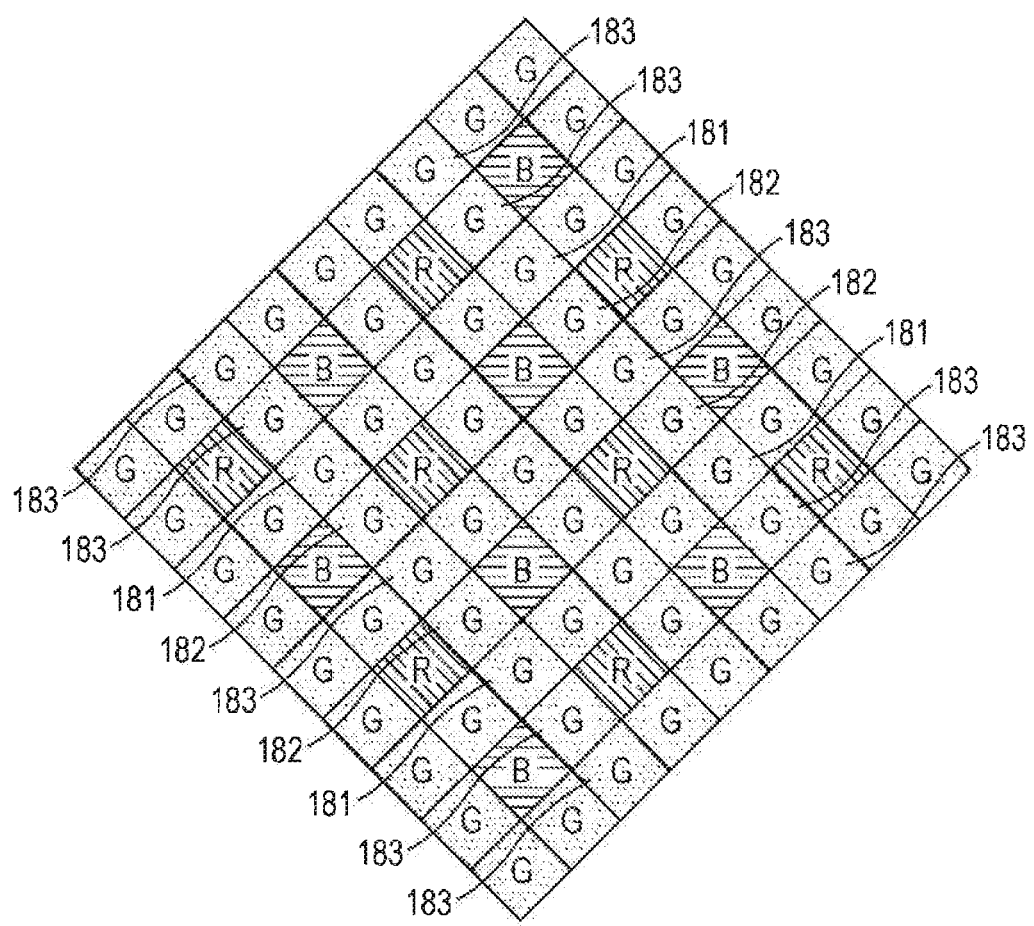
FIG. 27 is an illustrative diagram showing a ninth structure example of a pixel array unit.

The array of the pixels 51 of the pixel array unit 44, as shown illustratively in FIG. 27, may be a ClearVid array in which the array direction is rotated by 45 degrees in relation to the normal array direction. In this case, since the pixels 51 on all four sides of the phase difference detection pixel 181 are the same color, the color mixing in the phase difference detection pixel 181 is extremely little.

(Second Illustrative Configuration Example of Pixels)

FIG. 28 illustratively shows an equivalent circuit of the second configuration of the pixel 51.

The pixel 51 of FIG. 28 is a pixel which realizes an electronic global shutter function. In FIG. 28, parts corresponding to those in FIG. 2 are given the same reference numerals, and description thereof will be omitted as appropriate.

When the pixel 51 of the second configuration is compared to the pixel 51 of the first configuration described above, one more transfer transistor 231 which transfers a charge, and a memory unit (MEM) 232 which temporarily holds a charge before transferring the charge to the FD 63 are further provided between the transfer transistor 62 and the FD 63. Hereinafter, the transfer transistor 62 will be referred to as the first transfer transistor 62, and the transfer transistor 231 will be referred to as the second transfer transistor 231.

In the pixel 51 of the second configuration, a discharge transistor 233 for discharging an unnecessary charge is newly connected to the photodiode 61.

Basic description will be given of the operations of the pixel 51 of FIG. 28.

First, before starting an exposure, the discharge transistor 233 is turned on by a high level discharge signal OFG being supplied to the discharge transistor 233, the charge which is accumulated in the photodiode 61 is discharged to the constant voltage source VDD, and the photodiode 61 is reset.

After the photodiode 61 is reset, when the discharge transistor 233 is turned off by a low level discharge signal OFG, exposure starts in all the pixels.

When a predetermined exposure time has passed, the first transfer transistor 62 is turned on by a first transfer signal TX1 in all the pixels of the pixel array unit 44, and the charge which is accumulated in the photodiode 61 is transferred to the memory unit 232.

After the first transfer transistor 62 is turned off, the charges which are held by the memory unit 232 of the pixels 51 are read to the ADC 55 in order in row units. The read operation is the same as in the first configuration described above, wherein the second transfer transistor 231 of the pixel 51 of the row being read is turned on by a second transfer signal TX2, and the charge being held in the memory unit 232 is transferred to the FD 63. A signal which indicates a level corresponding to the charge which is accumulated in the FD 63 is output from the amplification transistor 65 to the ADC 55 via the selection transistor 66 by the selection transistor 66 being turned on by the selection signal SEL.

(Illustrative Arrangement Example of Components of Solid State Imaging Device)

Figure 29A:
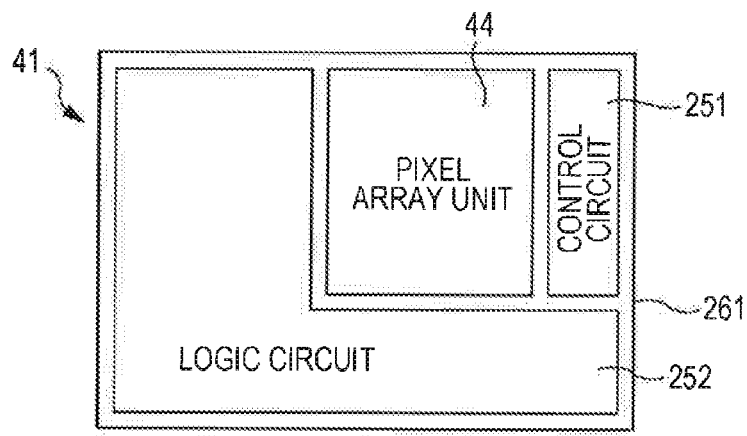
FIG. 29A is a diagram showing an illustrative arrangement example of the components of the solid state imaging device.
Figure 29B:
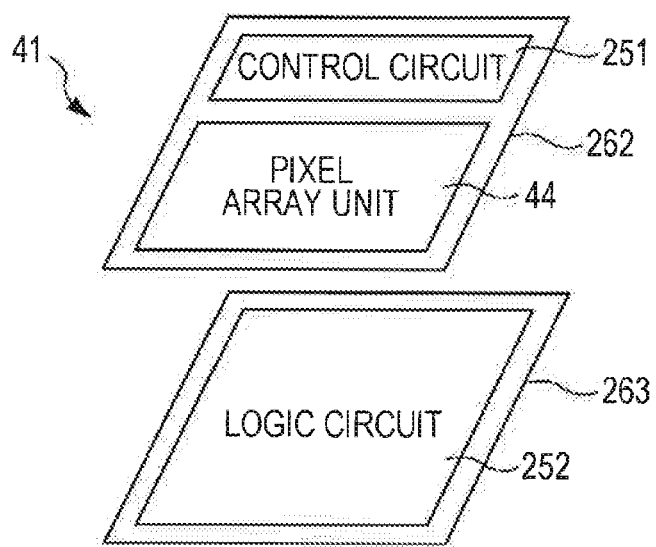
FIG. 29B is a diagram showing an illustrative arrangement example of the components of the solid state imaging device.
Figure 29C:
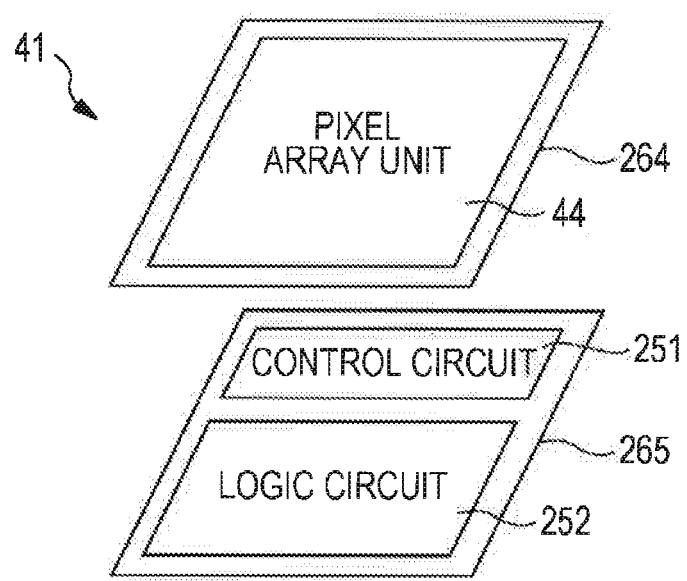
FIG. 29C is a diagram showing an illustrative arrangement example of the components of the solid state imaging device.

FIGS. 29A to 29C are illustrative diagrams showing arrangement examples of the components of the solid state imaging device 41.

The pixel array unit 44, a control circuit 251, and a logic circuit 252 of the solid state imaging device 41 are provided on a semiconductor substrate in one of the first to the third arrangements shown in FIGS. 29A to 29C, for example. The control circuit 251 is a circuit formed of the timing control unit 42, the vertical scanning circuit 43, the constant current source circuit unit 45, the reference signal generation unit 46, the column AD conversion unit 47, and the horizontal scanning circuit 48, for example. The logic circuit 252 is a circuit formed of the output circuit 50, for example.

As shown in FIG. 29A, in the first arrangement, the pixel array unit 44, the control circuit 251, and the logic circuit 252 are all arranged on a same semiconductor substrate 261.

As shown in FIG. 29B, in the second arrangement, the pixel array unit 44 and the control circuit 251 are arranged on one of a semiconductor substrate 262 and a semiconductor substrate 263, the two of which are laminated together, and the logic circuit 252 is arranged on the other. In the example of FIG. 29B, the pixel array unit 44 and the control circuit 251 are arranged on the semiconductor substrate 262, and the logic circuit 252 is arranged on the semiconductor substrate 263.

As shown in FIG. 29C, in the third arrangement, the pixel array unit 44 is arranged on one of a semiconductor substrate 264 and a semiconductor substrate 265, the two of which are laminated together, and the control circuit 251 and the logic circuit 252 are arranged on the other. In the example of FIG. 29C, the pixel array unit 44 is arranged on the semiconductor substrate 264, and the control circuit 251 and the logic circuit 252 are arranged on the semiconductor substrate 265.

Note that, in the above description, the number of layers of semiconductor substrates of the solid state imaging device 41 was one or two; however, the number may be two or more.

In the solid state imaging device 41, the sizes of the light shielding films 91a and 91b (111) of the phase difference detection pixel 81 may change in stages as the position within the pixel array unit 44 of the phase difference detection pixel 81 goes from the center toward the periphery. In other words, the sizes of the light shielding films 91a and 91b (111) may be caused to change in stages with the image height. The size of the on-chip lens 92 which functions as a white color filter may also be caused to change in stages with the image height, in the same manner.

In this manner, it is possible to further improve the color mixing properties and the color shading properties by causing the sizes of the light shielding films 91a, 91b (111), and the on-chip lens 92 to change in stages with the image height to perform pupil correction.

Note that, the sizes of the light shielding film 93 of the first imaging pixel 82, the light shielding film 96 of the second imaging pixel 83, the color filter 94, and the color filter 97 may also be caused to change in stages with the image height, in the same manner.

Configuration Example of Illustrative Second Embodiment (Configuration Example of an Illustrative Embodiment of Electronic Equipment)

Figure 30:
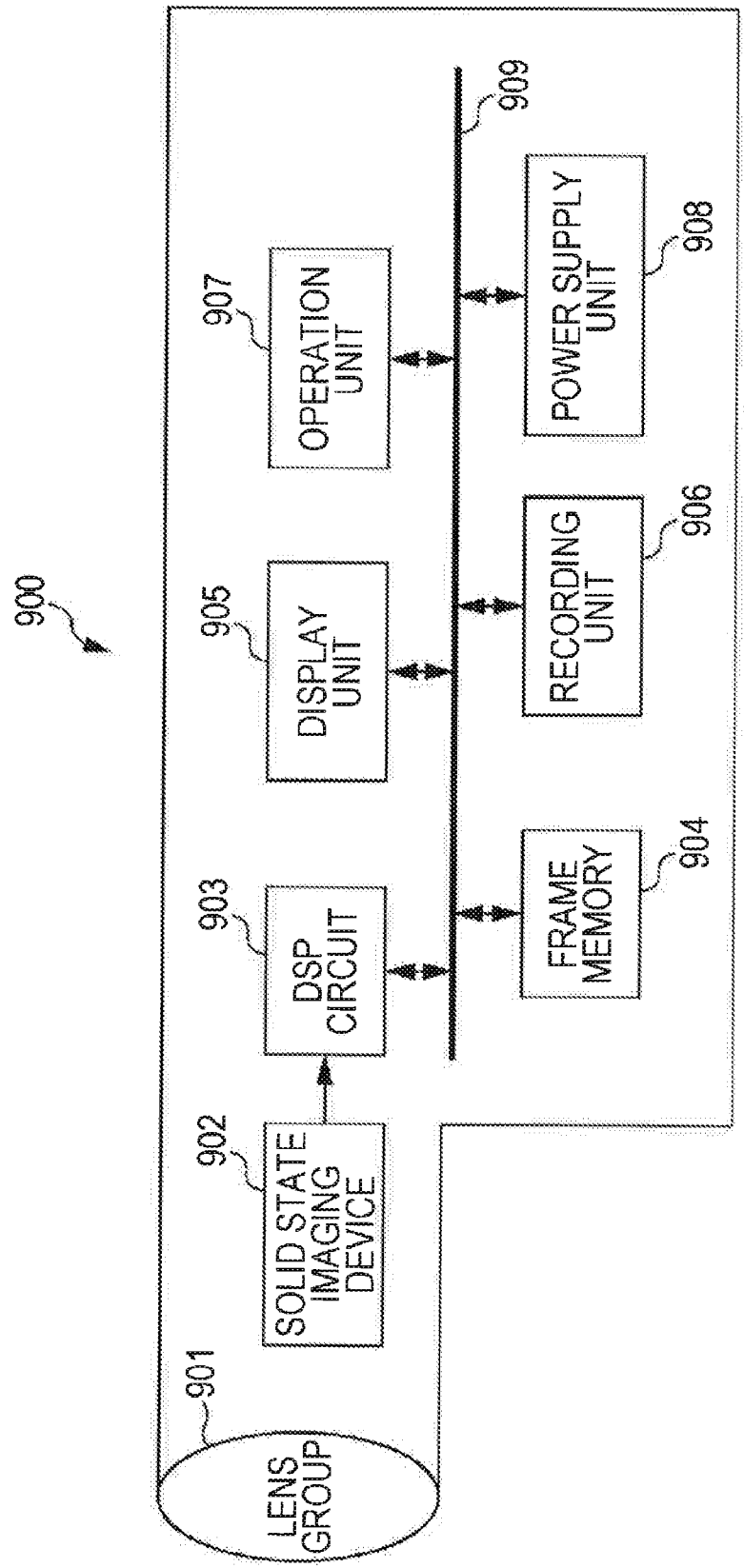
FIG. 30 is a diagram that shows a configuration example of an illustrative imaging apparatus as the electronic equipment to which the present disclosure is applied.

FIG. 30 is an illustrative block diagram that shows a configuration example of an imaging apparatus as the electronic equipment to which the present disclosure is applied.

An imaging apparatus 900 of FIG. 30 is a video camera, a digital still camera or the like. The imaging apparatus 900 is formed of a lens group 901, a solid state imaging device 902, a DSP circuit 903, a frame memory 904, a display unit 905, a recording unit 906, an operation unit 907, and a power supply unit 908. The DSP circuit 903, the frame memory 904, the display unit 905, the recording unit 906, the operation unit 907, and the power supply unit 908 are connected to one another via a bus line 909.

The lens group 901 captures incident light (image light) from an object and forms an image on an imaging surface of the solid state imaging device 902. The solid state imaging device 902 is formed of the solid state imaging device 41 described above. The solid state imaging device 902 converts the amount of incident light forming an image on the imaging surface due to the lens group 901 into an electrical signal in pixel units and supplies the electrical signal to the DSP circuit 903 as a pixel signal.

The DSP circuit 903 performs predetermined image processing on the pixel signal which is supplied from the solid state imaging device 902, supplies the post-image processing image signal to the frame memory 904 in frame units, and causes the frame memory 904 to temporarily store the image signal.

The display unit 905 is formed of a panel-type display apparatus such as a liquid crystal panel or an organic Electro Luminescence (EL) panel, for example, and displays an image based on the pixel signal of frame units which is temporarily stored in the frame memory 904.

The recording unit 906 is formed of a Digital Versatile Disc (DVD), flash memory or the like, reads the pixel signal of frame units which is temporarily stored in the frame memory 904 and records the pixel signal.

The operation unit 907 gives operation commands relating to the various functions implemented by the imaging apparatus 900 on the basis of operation by the user. The power supply unit 908 supplies power to the DSP circuit 903, the frame memory 904, the display unit 905, the recording unit 906, and the operation unit 907, as appropriate.

The electronic equipment to which the present technology is applied may be electronic equipment which uses a solid state imaging device for an image capturing unit (a photoelectric conversion unit), and in addition to the imaging apparatus 900, there are a portable terminal apparatus with an imaging function, a copier which uses a solid state imaging device for an image reading unit, and the like.

Note that the solid state imaging device 41 may be embodied by being formed as one chip, and may also be embodied in module form with an imaging function which is packaged to include an optical portion and the like.

The present technology can be applied to a back-illuminated CMOS sensor, and to a front-illuminated CMOS sensor.

The present technology is particularly effective in high definition solid state imaging devices. In other words, in a high definition solid state imaging device, the magnitude of the process variation of the color filters 94 is great in relation to the magnitude of the opening regions 81b. For example, when the size of the pixel 51 is 1.0 microns×1.0 microns, if the variation value is approximately from several dozen nm to several hundred nm, the variation value accounts for a proportion of the size of the pixel 51 from several percent to several dozen percent. Therefore, the influence of the color mixing and the reduction in sensitivity of the phase difference detection pixel 81 due to the process variation of the color filters 94 is great, and the effect of the present technology is great.

In the above description, the color filter 94, the color filter 97, and the color filter 121 is one of red, green, or blue; however, the colors thereof may be white, cyan, magenta or the like.

The effects disclosed in the present specification are merely examples, embodiments are not to be limited thereto and other effects may also be present.

The embodiments of the present disclosure are not limited to the embodiments described above, and various modifications may be made without departing from the gist of the present disclosure.

For example, instead of a photodiode, an organic photoelectric conversion film may be used as the photoelectric conversion element. Further, an organic photoelectric conversion film may be used instead of the color filter. The organic photoelectric conversion film is described in detail in Japanese Unexamined Patent Application Publication No. 2011-29337, which has already been applied for by the present applicant.

Note that, the present disclosure may adopt the following configurations.

(A1) A solid state imaging device includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

(A2) In the solid state imaging device according to (A1), a position of a side of the color filter of the first imaging pixel which opposes a side which is adjacent to the phase difference detection pixel is same as that of the color filter of the second imaging pixel which is lined up in a direction perpendicular to a direction adjacent to the phase difference detection pixel.

(A3) In the solid state imaging device according to (A2), a width of the color filter of the first imaging pixel in a direction in which the color filter is adjacent to the phase difference detection pixel is short in comparison to that of the color filter of the second imaging pixel by a value or greater where the value is obtained by adding three times standard deviation to a mean value of process variation of the color filter.

(A4) In the solid state imaging device according to any one of (A1) to (A3), a light shielding film is formed on a portion of the first imaging pixel and the second imaging pixel, and an area of the light shielding film of the first imaging pixel is greater than an area of the light shielding film of the second imaging pixel.

(A5) In the solid state imaging device according to (A4), a width of a side of the light shielding film of the first imaging pixel which is adjacent to the phase difference detection pixel in a direction in which the light shielding film is adjacent to the phase difference detection pixel is great in comparison to that of the light shielding film of the second imaging pixel.

(A6) In the solid state imaging device according to (A5), a width of a side of the light shielding film of the first imaging pixel which is adjacent to the phase difference detection pixel in a direction in which the light shielding film is adjacent to the phase difference detection pixel is long in comparison to that of the light shielding film of the second imaging pixel by a value or greater where the value is obtained by adding three times standard deviation to a mean value of process variation of the color filter.

(A7) In the solid state imaging device according to any one of (A1) to (A6), an optical black region is arranged in the phase difference detection pixel, and the first imaging pixel is adjacent to a side opposing a side in which the optical black region is arranged.

(A8) The solid state imaging device according to (A7), a light shielding film is formed on a portion of the second imaging pixel and the phase difference detection pixel, and a width of a side of the light shielding film of the phase difference detection pixel which is adjacent to the first imaging pixel in a direction in which the light shielding film is adjacent to the first imaging pixel is great in comparison to that of the light shielding film of the second imaging pixel.

(A9) The solid state imaging device according to any one of (A1) to (A8) further includes a signal processing unit which processes a pixel signal obtained in the first imaging pixel.

(A10) In the solid state imaging device according to (A9), the signal processing unit performs gain correction on the pixel signal.

(A11) In the solid state imaging device according to (A9) or (A10), the signal processing unit corrects color mixing of the pixel signal.

(A12) A manufacturing method of a solid state imaging device including forming a solid state imaging device which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

(A13) Electronic equipment includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a color filter of the first imaging pixel is smaller than an area of a color filter of the second imaging pixel.

(A14) A solid state imaging device includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

(A15) In the solid state imaging device according to (A14), an insulating film is formed on a boundary between the first imaging pixel and another pixel, and on a boundary between the second imaging pixel and another pixel.

(A16) In the solid state imaging device according to (A14) or (A15), a light shielding film is formed on a boundary between the first imaging pixel and another pixel, and on a boundary between the second imaging pixel and another pixel.

(A17) In the solid state imaging device according to (A16), a width of the light shielding film provided on the boundary between the first imaging pixel and the phase difference detection pixel is greater than a width of the other light shielding film.

(A18) A manufacturing method of a solid state imaging device including forming a solid state imaging device which includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

(A19) Electronic equipment includes a phase difference detection pixel which is a pixel for phase difference detection; a first imaging pixel which is a pixel for imaging and is adjacent to the phase difference detection pixel; and a second imaging pixel which is a pixel for imaging other than the first imaging pixel. An area of a light shielding film of the first imaging pixel is greater than an area of a light shielding film of the second imaging pixel.

(B1) A solid state imaging device, including: a phase difference detection pixel; a first imaging pixel adjacent to the phase difference detection pixel; a first color filter aligned with the first imaging pixel; a second imaging pixel; and a second color filter aligned with the second imaging pixel; where an area of the first color filter is smaller than an area of the second color filter, and where an area of a light shielding film of the first imaging pixel is greater than an area of a light shielding film of the second imaging pixel.

(B2) The solid state imaging device according to (B1), where a position of a side of the first color filter that opposes a side that is adjacent to the phase difference detection pixel is a same position as a side of the second color filter that is lined up in a vertical direction.

(B3) The solid state imaging device according to (B1), further including an insulating film and an additional light shielding film that are provided below at least one of the light shielding film of the first imaging pixel and the light shielding film of the second imaging pixel.

(B4) The solid state imaging device according to (B3), where the insulating film and the additional light shielding film are provided to penetrate only a photodiode.

(B5) The solid state imaging device according to (B1), further including a first additional light shielding film that is provided below the light shielding film of the first imaging pixel and a second additional light shielding film that is provided below the light shielding film of the second imaging pixel, the first and second additional light shielding films having different widths.

(B6) The solid state imaging device according to (B5), where a width of the first additional light shielding film is greater than a width of the second additional light shielding film.

(B7) The solid state imaging device according to (B1), where the solid state imaging device includes a pixel array unit of a 2×2 pixel arrays, and where the phase difference detection pixel and the first imaging pixel are of a same color.

(B8) The solid state imaging device according to (B1), where the solid state imaging device includes a pixel array unit of 2×2 pixel arrays, where the phase difference detection pixel and the first imaging pixel are of a same color, and where the phase difference detection pixel is also an imaging pixel.

(B9) The solid state imaging device according to (B8), further including an insulating film and an additional light shielding film that are provided below at least one of the light shielding film of the first imaging pixel and the light shielding film of the second imaging pixel.

(B10) The solid state imaging device according to (B9), where light corresponding to the first imaging pixel is received in the phase difference detection pixel.

(B11) The solid state imaging device according to (B1), where the solid state imaging device includes a pixel array unit in which an array direction is rotated by 45 degrees in relation to a normal array direction.

(B12) The solid state imaging device according to (B1), further including a discharge transistor connected to a photodiode, where the discharge transistor is controlled by an overflow gate.

(B13) The solid state imaging device according to (B1), where the solid state imaging device includes a pixel array unit, a control circuit, and a logic circuit arranged on a same semiconductor substrate.

(B14) The solid state imaging device according to (B1), where the solid state imaging device includes a pixel array unit, a control circuit, and a logic circuit; the pixel array unit and the control circuit being arranged on a first semiconductor substrate; the logic circuit being arranged on a second semiconductor substrate; and the first semiconductor substrate being laminated to the second semiconductor substrate.

(B15) The solid state imaging device according to (B1), where the solid state imaging device includes a pixel array unit, a control circuit, and a logic circuit; the pixel array unit being arranged on a first semiconductor substrate; the logic circuit and the control circuit being arranged on a second semiconductor substrate; and the first semiconductor substrate being laminated to the second semiconductor substrate.

(B16) The solid state imaging device according to (B1), where a width of the first color filter is different from a width of the second color filter in an amount equal to three times a standard deviation to a mean value of a process variation of the first and second color filters.

(B17) The solid state imaging device according to (B3), where one of the additional light shielding films is connected by the insulating to the light shielding film of the first imaging pixel.

(B18) The solid state imaging device according to (B8), where the phase difference detection pixel and the first imaging pixel share a color filter.

(B19) A method of manufacturing a solid state imaging device, including: forming a phase difference detection pixel; forming a first imaging pixel adjacent to the phase difference detection pixel; and forming a second imaging pixel; where an area of a color filter of the first imaging pixel is smaller than an area of a color filter of the second imaging pixel, and where an area of a light shielding film of the first imaging pixel is greater than an area of a light shielding film of the second imaging pixel.

(B20) An electronic apparatus, including: a solid state imaging device including: a phase difference detection pixel; a first imaging pixel adjacent to the phase difference detection pixel; a first color filter aligned with the first imaging pixel; a second imaging pixel; and a second color filter aligned with the second imaging pixel; where an area of the first color filter is smaller than an area of the second color filter, and where an area of a light shielding film of the first imaging pixel is greater than an area of a light shielding film of the second imaging pixel.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

41 Solid state imaging device
50 Output circuit
81 Phase difference detection pixel
81a Optical black region
82 First imaging pixel
83 Second imaging pixel
93 Light shielding film
94 Color filter
96 Light shielding film
97, 121 Color filter
141 Insulating film
142 Light shielding film

The invention claimed is:

1. An imaging device, comprising:
a first photoelectric conversion region;
a second photoelectric conversion region disposed adjacent to the first photoelectric conversion region;
a third photoelectric conversion region disposed adjacent to the first photoelectric conversion region;
a first on-chip lens disposed above the first photoelectric conversion region;
a second on-chip lens disposed above the second photoelectric conversion region;
a third on-chip lens disposed above the third photoelectric conversion region;
a first color filter disposed between the first on-chip lens and the first photoelectric conversion region;
a second color filter disposed between the second on-chip lens and the second photoelectric conversion region;
a third color filter disposed between the third on-chip lens and the third photoelectric conversion region;
a first light shield disposed between the first on-chip lens and the first photoelectric conversion region, the first light shield overlapping with the first photoelectric conversion region in a plan view;
a second light shield disposed between the second on-chip lens and the second photoelectric conversion region, the second light shield overlapping with the second photoelectric conversion region in the plan view; and
a third light shield disposed between the third on-chip lens and the third photoelectric conversion region, the third light shield overlapping with the third photoelectric conversion region in the plan view,
wherein an area of the second light shield is less than an area of the first light shield and greater than an area of the third light shield.

2. The imaging device of claim 1, wherein the first photoelectric conversion region is configured to receive light passing through the first color filter and wherein the second photoelectric conversion region is configured to receive light passing through the second color filter.

3. The imaging device of claim 1, wherein the first color filter is clear.

4. The imaging device of claim 1, wherein the first color filter and the second color filter are a same color.

5. The imaging device of claim 1, further comprising a phase difference detection pixel and a plurality of imaging pixels.

6. The imaging device of claim 1, wherein an area of the first color filter is smaller than an area of the second color filter.

7. A method of forming an imaging device, the method comprising:
- disposing a first photoelectric conversion region;
- disposing a second photoelectric conversion region adjacent to the first photoelectric conversion region;
- disposing a third photoelectric conversion region adjacent to the first photoelectric conversion region;
- disposing a first on-chip lens above the first photoelectric conversion region;
- disposing a second on-chip lens above the second photoelectric conversion region;
- disposing a third on-chip lens above the third photoelectric conversion region;
- disposing a first color filter between the first on-chip lens and the first photoelectric conversion region;
- disposing a second color filter between the second on-chip lens and the second photoelectric conversion region;
- disposing a third color filter between the third on-chip lens and the third photoelectric conversion region
- disposing a first light shield between the first on-chip lens and the first photoelectric conversion region, the first light shield overlapping with the first photoelectric conversion region in a plan view;
- disposing a second light shield between the second on-chip lens and the second photoelectric conversion region, the second light shield overlapping with the second photoelectric conversion region in the plan view; and
- disposing a third light shield between the third on-chip lens and the third photoelectric conversion region, the third light shield overlapping with the third photoelectric conversion region in the plan view,
- wherein an area of the second light shield is less than an area of the first light shield and greater than an area of the third light shield.

8. The method of claim 7, wherein the first photoelectric conversion region is configured to receive light passing through the first color filter and wherein the second photoelectric conversion region is configured to receive light passing through the second color filter.

9. The method of claim 7, wherein the first color filter is clear.

10. The method of claim 7, wherein the first color filter and the second color filter are a same color.

11. The method of claim 7, further comprising forming a phase difference detection pixel and a plurality of imaging pixels.

12. The method of claim 7, wherein an area of the first color filter is smaller than an area of the second color filter.

13. An electronic apparatus comprising a solid state imaging device, the solid state imaging device comprising:
- a first photoelectric conversion region;
- a second photoelectric conversion region disposed adjacent to the first photoelectric conversion region;
- a third photoelectric conversion region disposed adjacent to the first photoelectric conversion region;
- a first on-chip lens disposed above the first photoelectric conversion region;
- a second on-chip lens disposed above the second photoelectric conversion region;
- a third on-chip lens disposed above the third photoelectric conversion region;
- a first color filter disposed between the first on-chip lens and the first photoelectric conversion region;
- a second color filter disposed between the second on-chip lens and the second photoelectric conversion region;
- a third color filter disposed between the third on-chip lens and the third photoelectric conversion region;
- a first light shield disposed between the first on-chip lens and the first photoelectric conversion region, the first light shield overlapping with the first photoelectric conversion region in a plan view;
- a second light shield disposed between the second on-chip lens and the second photoelectric conversion region, the second light shield overlapping with the second photoelectric conversion region in the plan view; and
- a third light shield disposed between the third on-chip lens and the third photoelectric conversion region, the third light shield overlapping with the third photoelectric conversion region in the plan view,
- wherein an area of the second light shield is less than an area of the first light shield and greater than an area of the third light shield.

14. The electronic apparatus of claim 13, wherein the first photoelectric conversion region is configured to receive light passing through the first color filter and wherein the second photoelectric conversion region is configured to receive light passing through the second color filter.

15. The electronic apparatus of claim 13, wherein the first color filter is clear.

16. The electronic apparatus of claim 13, wherein the first color filter and the second color filter are a same color.

17. The electronic apparatus of claim 13, wherein the imaging device further comprises a phase difference detection pixel and a plurality of imaging pixels.

18. The electronic apparatus of claim 13, wherein an area of the first color filter is smaller than an area of the second color filter.

19. The imaging device of claim 2, wherein the third photoelectric region is configured to receive light passing through the third color filter.

20. The method of claim 8, wherein the third photoelectric region is configured to receive light passing through the third color filter.

* * * * *